(12) United States Patent
Sugizaki

(10) Patent No.: US 11,563,045 B2
(45) Date of Patent: Jan. 24, 2023

(54) ELECTROMAGNETIC WAVE PROCESSING DEVICE

(71) Applicant: SONY SEMICONDUCTOR SOLUTIONS CORPORATION, Kanagawa (JP)

(72) Inventor: Taro Sugizaki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 277 days.

(21) Appl. No.: 16/770,893

(22) PCT Filed: Dec. 7, 2018

(86) PCT No.: PCT/JP2018/045036
§ 371 (c)(1),
(2) Date: Jun. 8, 2020

(87) PCT Pub. No.: WO2019/124113
PCT Pub. Date: Jun. 27, 2019

(65) Prior Publication Data
US 2021/0167107 A1 Jun. 3, 2021

(30) Foreign Application Priority Data

Dec. 21, 2017 (JP) .............................. JP2017-245180

(51) Int. Cl.
*H01L 27/146* (2006.01)
(52) U.S. Cl.
CPC .... *H01L 27/14621* (2013.01); *H01L 27/1461* (2013.01); *H01L 27/14623* (2013.01); *H01L 27/14629* (2013.01); *H01L 27/14643* (2013.01)
(58) Field of Classification Search
CPC .................................................... H01L 27/146
See application file for complete search history.

(56) References Cited

U.S. PATENT DOCUMENTS

2006/0273361 A1 12/2006 Tanaka et al.
2008/0251874 A1 10/2008 Ishibe
(Continued)

FOREIGN PATENT DOCUMENTS

| CN | 101271914 A | 9/2008 |
| CN | 103733340 A | 4/2014 |
| CN | 104205333 A | 12/2014 |

(Continued)

OTHER PUBLICATIONS

International Search Report and Written Opinion of PCT Application No. PCT/JP2018/045036, dated Mar. 5, 2019, 14 pages of ISRWO.

*Primary Examiner* — Marvin Payen
(74) *Attorney, Agent, or Firm* — Chip Law Group

(57) ABSTRACT

The present technology relates to an electromagnetic wave processing device that enables reduction of color mixture. Provided are a photoelectric conversion element formed in a silicon substrate, a narrow band filter stacked on a light incident surface side of the photoelectric conversion element and configured to transmit an electromagnetic wave having a desired wavelength, and interlayer films respectively formed above and below the narrow band filter, and the photoelectric conversion element is formed at a depth from an interface of the silicon substrate, the depth where a transmission wavelength of the narrow band filter is most absorbed. The depth of the photoelectric conversion element from the silicon substrate becomes deeper as the transmission wavelength of the narrow band filter is longer. The present technology can be applied to an imaging element or a sensor using a plasmon filter or a Fabry-Perot interferometer.

18 Claims, 52 Drawing Sheets

(56) References Cited

U.S. PATENT DOCUMENTS

| | | |
|---|---|---|
| 2013/0154041 A1 | 6/2013 | Kokubun et al. |
| 2014/0084404 A1 | 3/2014 | Fukunaga |
| 2014/0146207 A1 | 5/2014 | Yokogawa |
| 2015/0048474 A1 | 2/2015 | Ishiwata |
| 2018/0350856 A1 | 12/2018 | Masagaki et al. |

FOREIGN PATENT DOCUMENTS

| | | |
|---|---|---|
| CN | 107408568 A | 11/2017 |
| EP | 2738810 A1 | 6/2014 |
| EP | 3410487 A1 | 12/2018 |
| JP | 58-042370 A | 3/1983 |
| JP | 60-245165 A | 12/1985 |
| JP | 2004-022565 A | 1/2004 |
| JP | 2004-245674 A | 9/2004 |
| JP | 2006-339333 A | 12/2006 |
| JP | 2008-235689 A | 10/2008 |
| JP | 2010-165718 A | 7/2010 |
| JP | 2012-137485 A | 7/2012 |
| JP | 2013-030626 A | 2/2013 |
| JP | 2013-131553 A | 7/2013 |
| JP | 2013-232599 A | 11/2013 |
| JP | 2014-064196 A | 4/2014 |
| JP | 2014-190966 A | 10/2014 |
| KR | 10-2008-0086414 A | 9/2008 |
| KR | 10-2014-0053948 A | 5/2014 |
| KR | 10-2015-0002593 A | 1/2015 |
| KR | 10-2018-0108414 A | 10/2018 |
| RU | 2014101709 A | 7/2015 |
| TW | 201308585 A | 2/2013 |
| TW | 201737479 A | 10/2017 |
| WO | 2013/015117 A1 | 1/2013 |
| WO | 2013/150832 A1 | 10/2013 |
| WO | 2017/130723 A1 | 8/2017 |

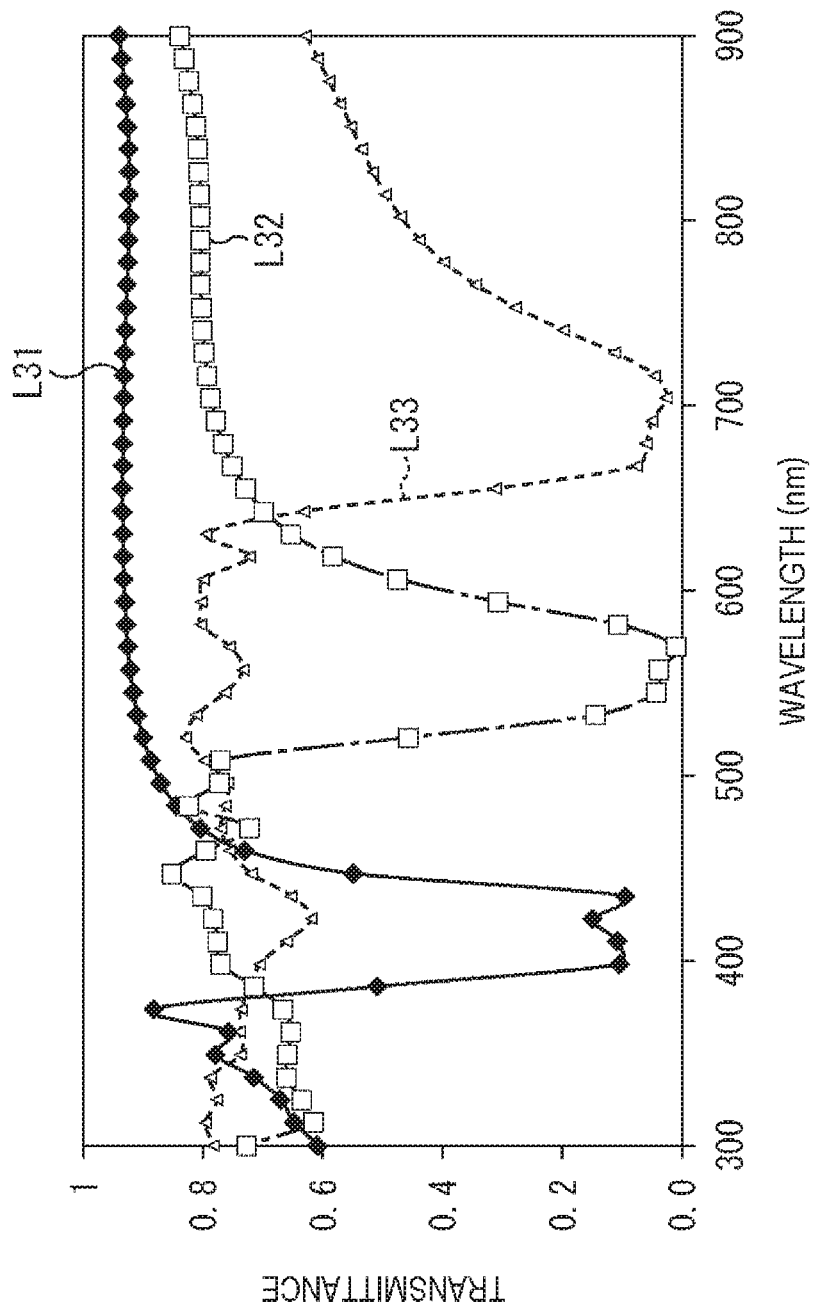

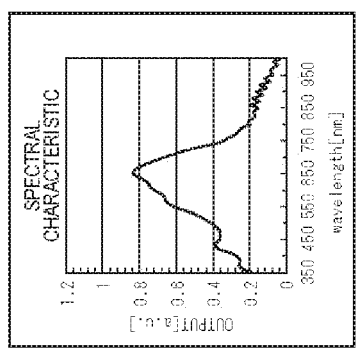
FIG. 20A
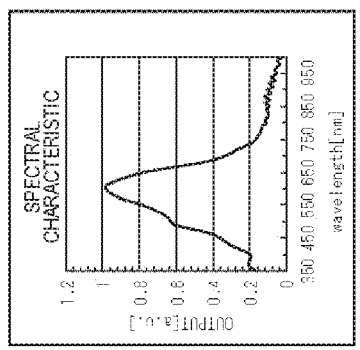
FIG. 20B
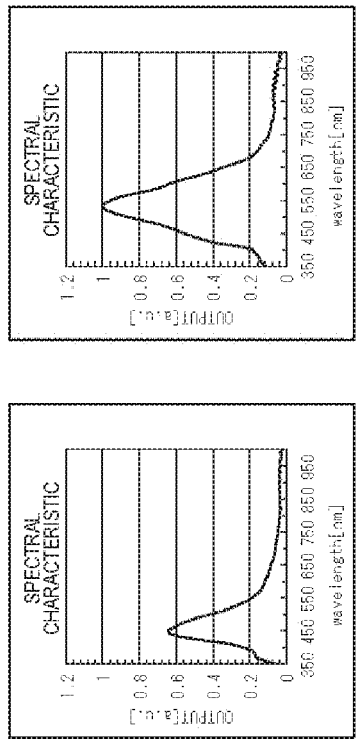
FIG. 20C
FIG. 20D
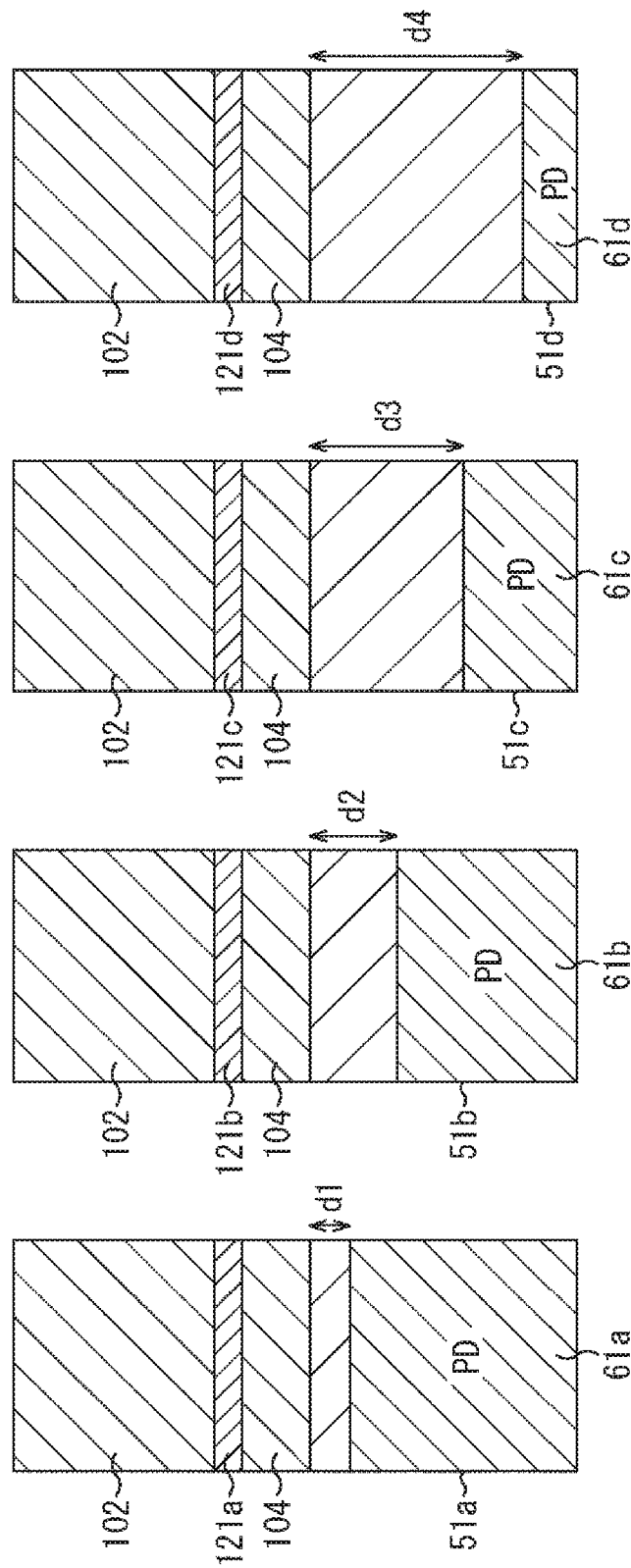

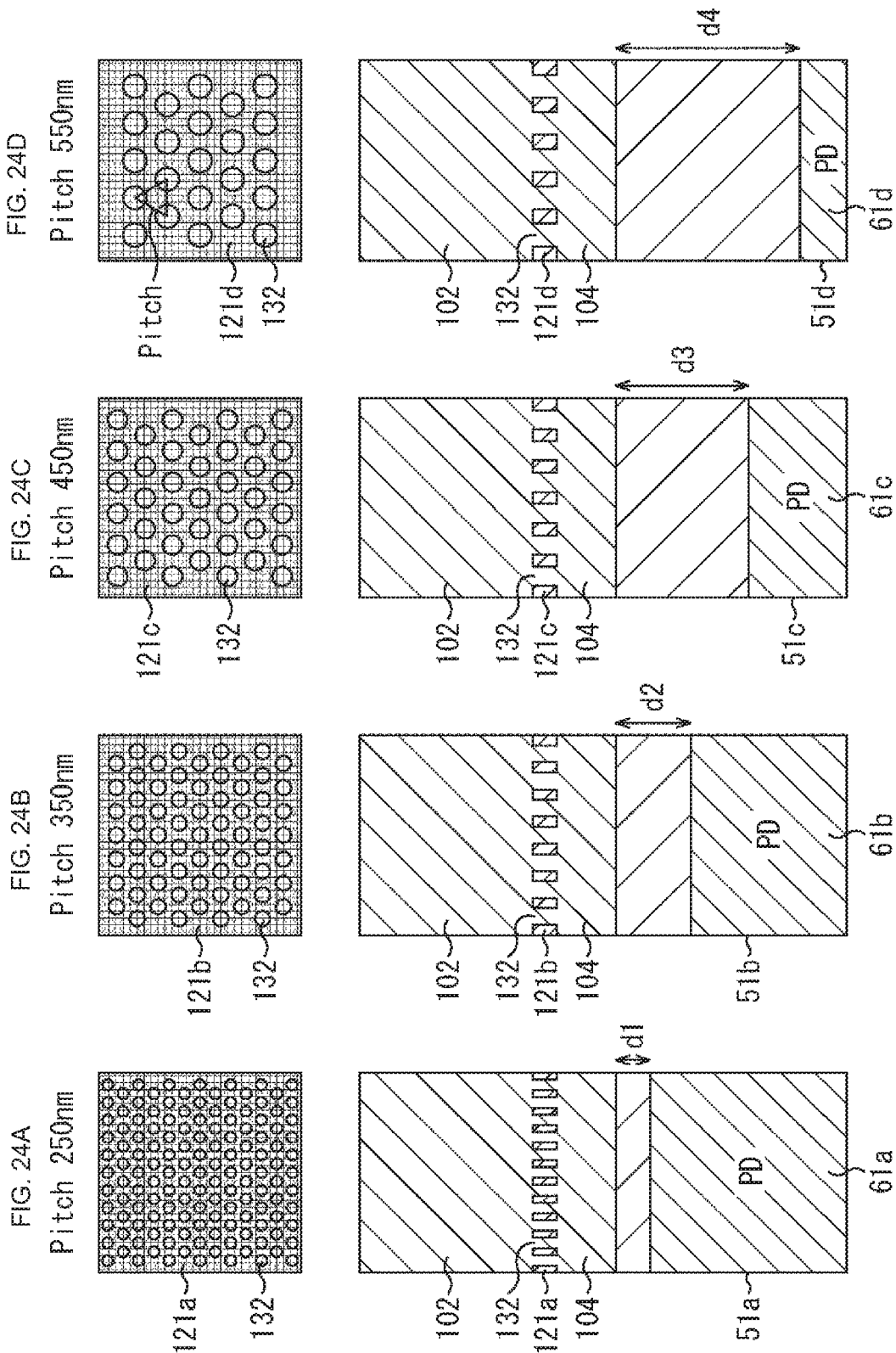

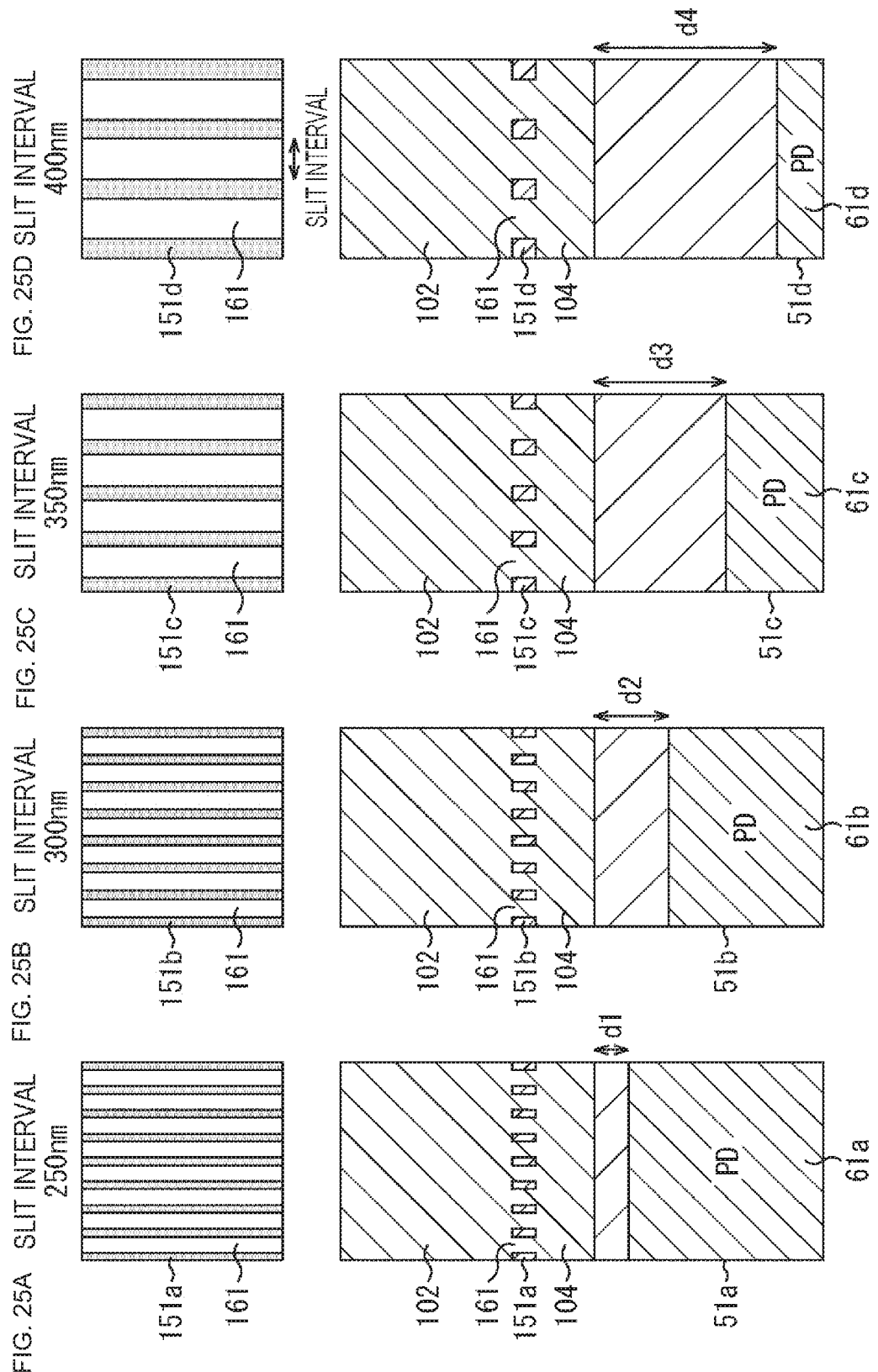

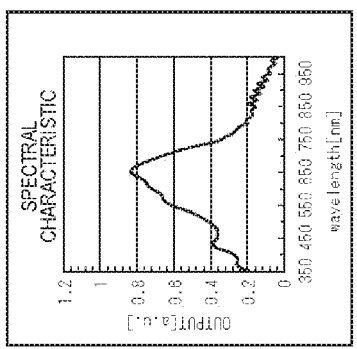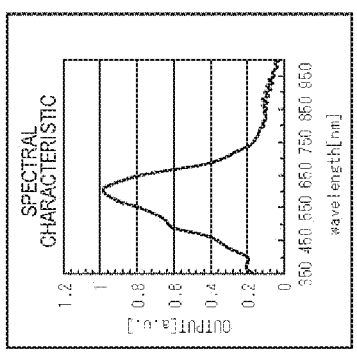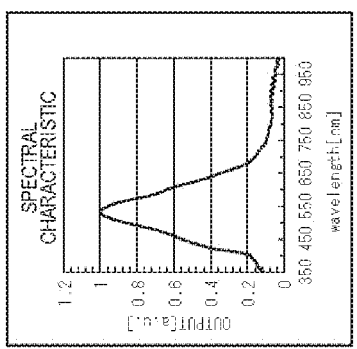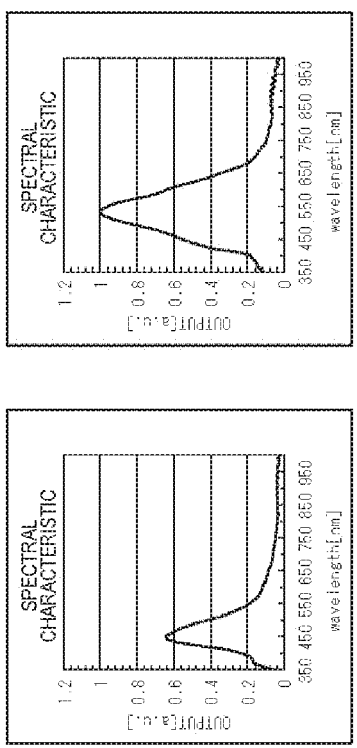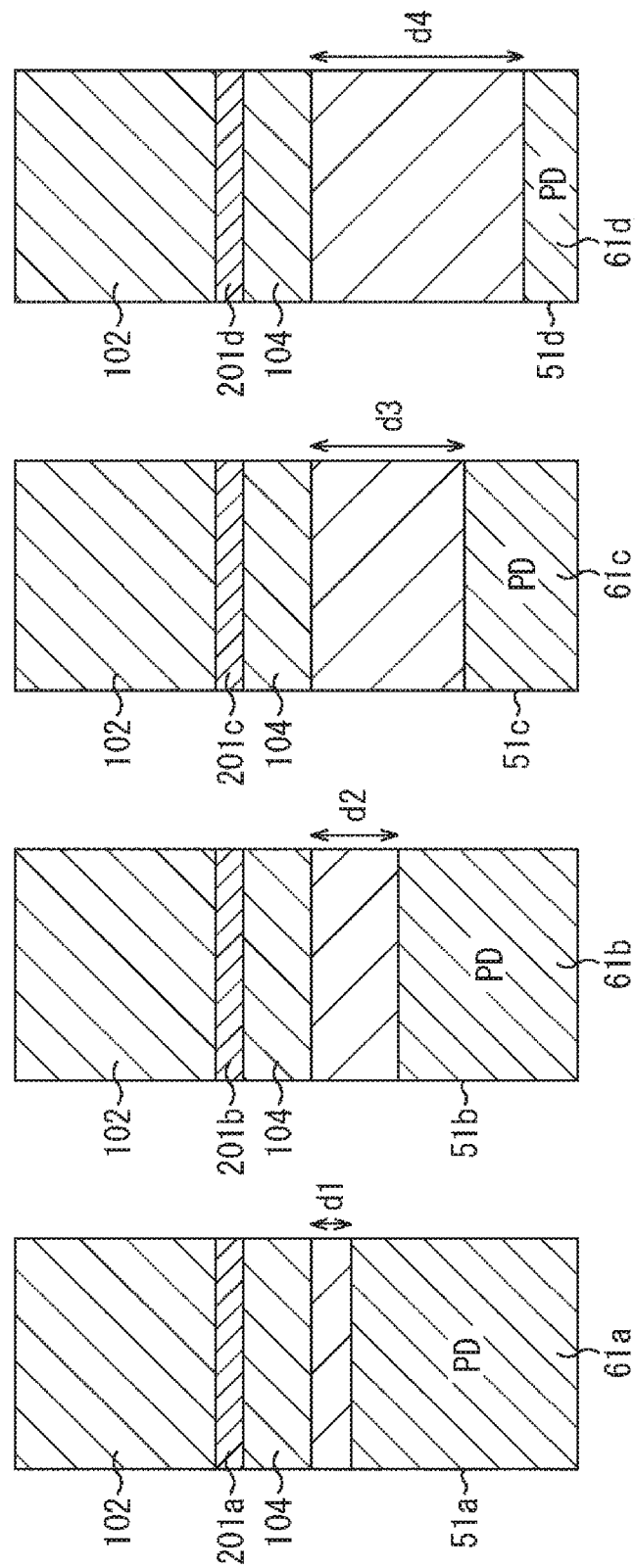

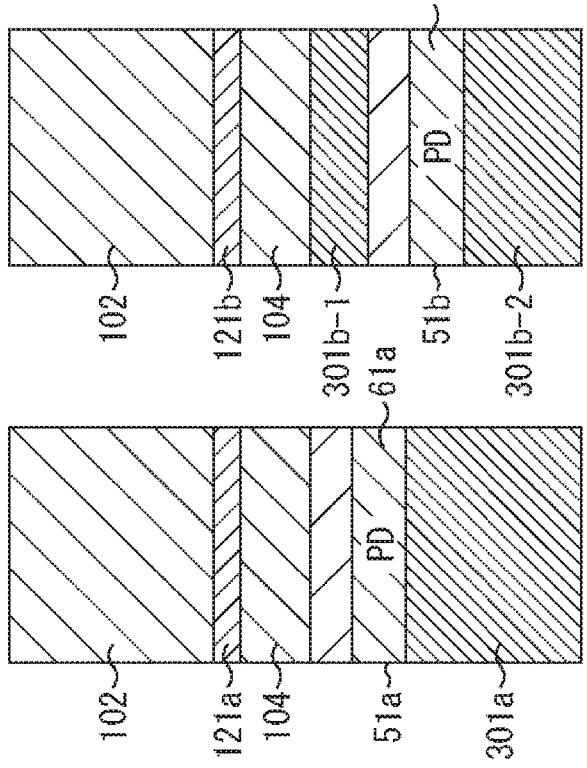

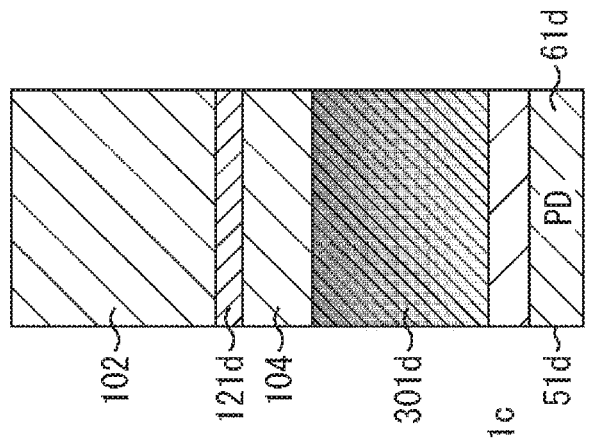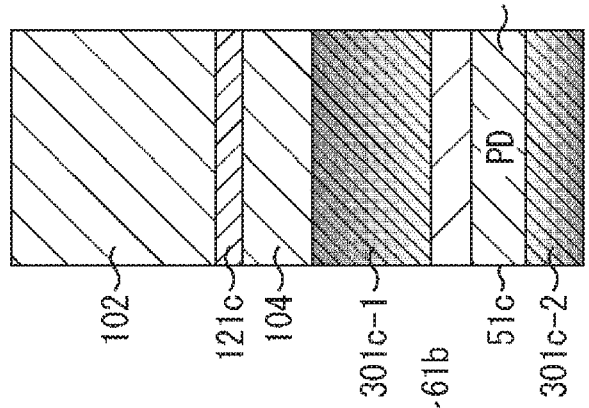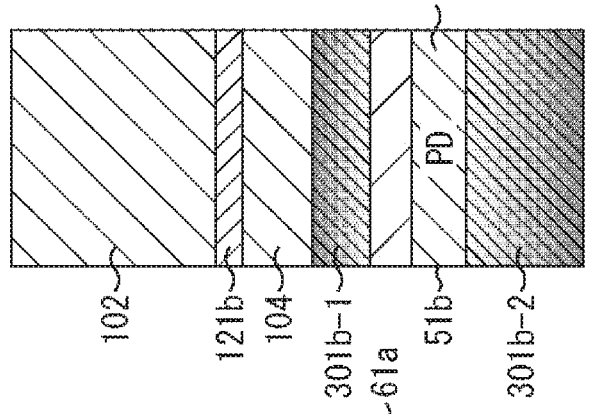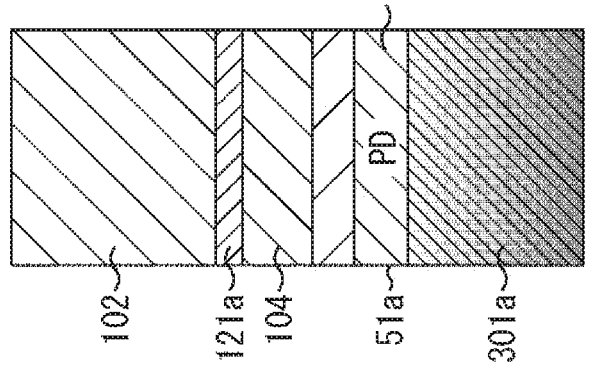

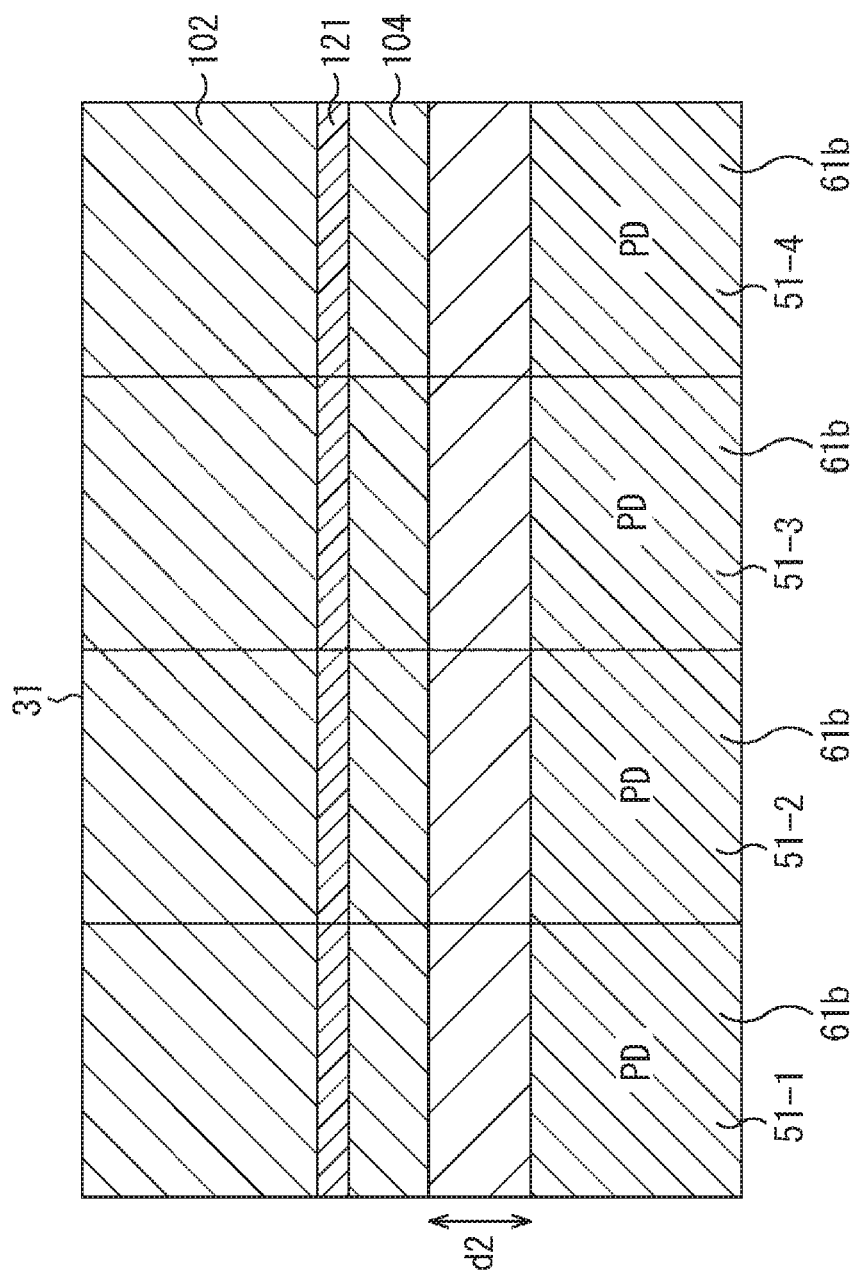

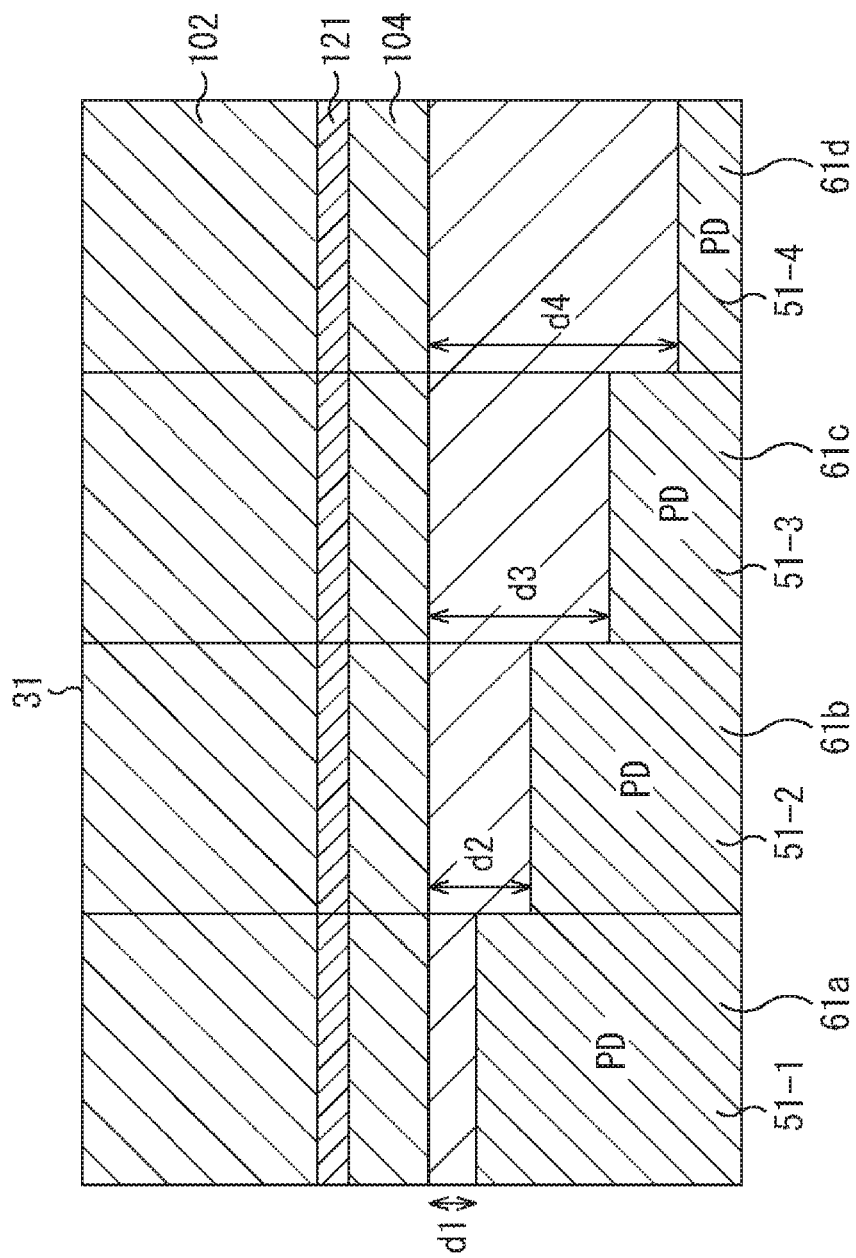

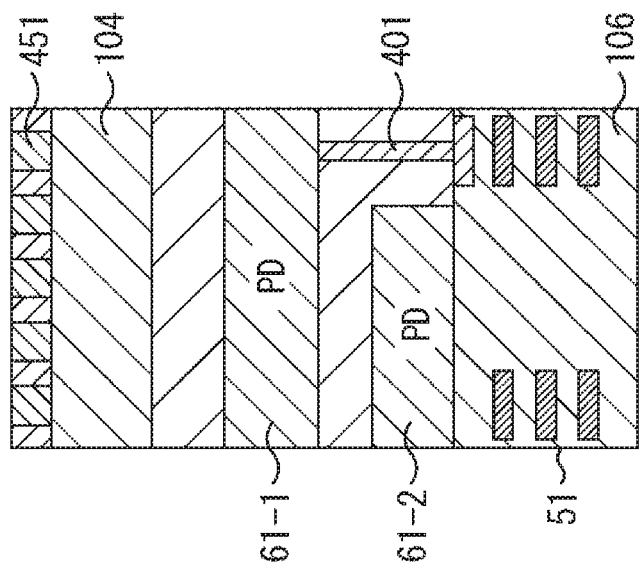
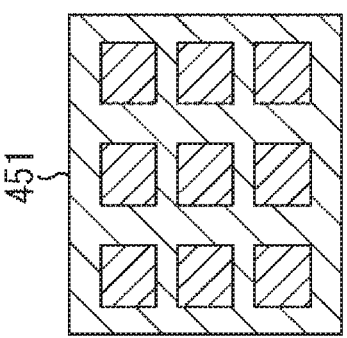
FIG. 40B
FIG. 40A

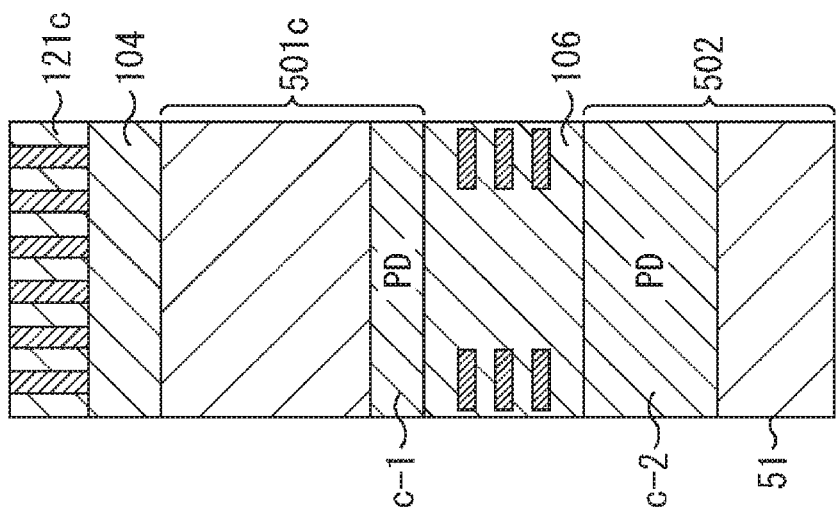

ELECTROMAGNETIC WAVE PROCESSING DEVICE

CROSS REFERENCE TO RELATED APPLICATIONS

This application is a U.S. National Phase of International Patent Application No. PCT/JP2018/045036 filed on Dec. 7, 2018, which claims priority benefit of Japanese Patent Application No. JP 2017-245180 filed in the Japan Patent Office on Dec. 21, 2017. Each of the above-referenced applications is hereby incorporated herein by reference in its entirety.

TECHNICAL FIELD

The present technology relates to an electromagnetic wave processing device, and relates to, for example, an electromagnetic wave processing device suitable for use in detecting light in a narrow wavelength band.

BACKGROUND ART

Conventionally, an imaging element for detecting light (hereinafter also referred to as narrow band light) in a predetermined narrow wavelength band (narrow band) using a plasmon filter has been proposed (for example, see Patent Document 1).

CITATION LIST

Patent Document

Patent Document 1: Japanese Patent Application Laid-Open No. 2010-165718

SUMMARY OF THE INVENTION

Problems to be Solved by the Invention

When the narrow band light is detected using a plasmon filter, there is a possibility that a color mixture component other than a waveform of light to be detected is also detected, and characteristics are deteriorated.

The present technology has been made in view of such a situation, and enables reduction in a color mixture component.

Solutions to Problems

An electromagnetic wave processing device according to one aspect of the present technology includes a photoelectric conversion element formed in a silicon substrate, a narrow band filter stacked on a light incident surface side of the photoelectric conversion element and configured to transmit an electromagnetic wave having a desired wavelength, and interlayer films respectively formed above and below the narrow band filter, in which the photoelectric conversion element is formed at a depth from an interface of the silicon substrate, the depth where a transmission wavelength of the narrow band filter is most absorbed.

In the electromagnetic wave processing device according to one aspect of the present technology, a photoelectric conversion element formed in a silicon substrate, a narrow band filter stacked on a light incident surface side of the photoelectric conversion element and configured to transmit an electromagnetic wave having a desired wavelength, and interlayer films respectively formed above and below the narrow band filter are provided, and the photoelectric conversion element is formed at a depth from an interface of the silicon substrate, the depth where a transmission wavelength of the narrow band filter is most absorbed.

Note that the electromagnetic wave processing device may be an independent device or may be internal blocks configuring one device.

Effects of the Invention

According to one aspect of the present technology, the color mixture component can be reduced.

Note that the effects described here are not necessarily limited, and any of effects described in the present disclosure may be exhibited.

BRIEF DESCRIPTION OF DRAWINGS

FIG. 13 is a graph illustrating an example of spectral characteristics of the plasmon filter having a dot array structure.

FIGS. 20A, 20B, 20C, and 20D are graphs and views for describing pixels having a photodiode formed at a depth suitable for a transmission wavelength of a plasmon filter.

FIGS. 24A, 24B, 24C, and 24D are views for describing a configuration of a pixel using a hole array-type plasmon filter.

FIGS. 25A, 25B, 25C, and 25D are views for describing a configuration of a pixel using a plasmon filter using GMR.

FIGS. 26A, 26B, 26C, and 26D are graphs and views for describing a configuration of a pixel using a Fabry-Perot interferometer.

FIGS. 28A, 28B, 28C, and 28D are views for describing a pixel including a drain.

FIGS. 29A, 29B, 29C, and 29D are views for describing a pixel including a drain having a concentration gradient.

FIG. 30 is a view for describing arrangement of photodiodes in a pixel array unit.

FIG. 31 is a view for describing arrangement of photodiodes in a pixel array unit.

FIGS. 40A and 40B are views for describing configurations of pixels in a case of using a square array-type plasmon filter.

FIGS. 42A, 42B, and 42C are views for describing pixels having a stacked structure.

MODE FOR CARRYING OUT THE INVENTION

Hereinafter, modes for implementing the present technology (hereinafter referred to as embodiments) will be described.

<Configuration Example of Imaging Device>

Figure 1:
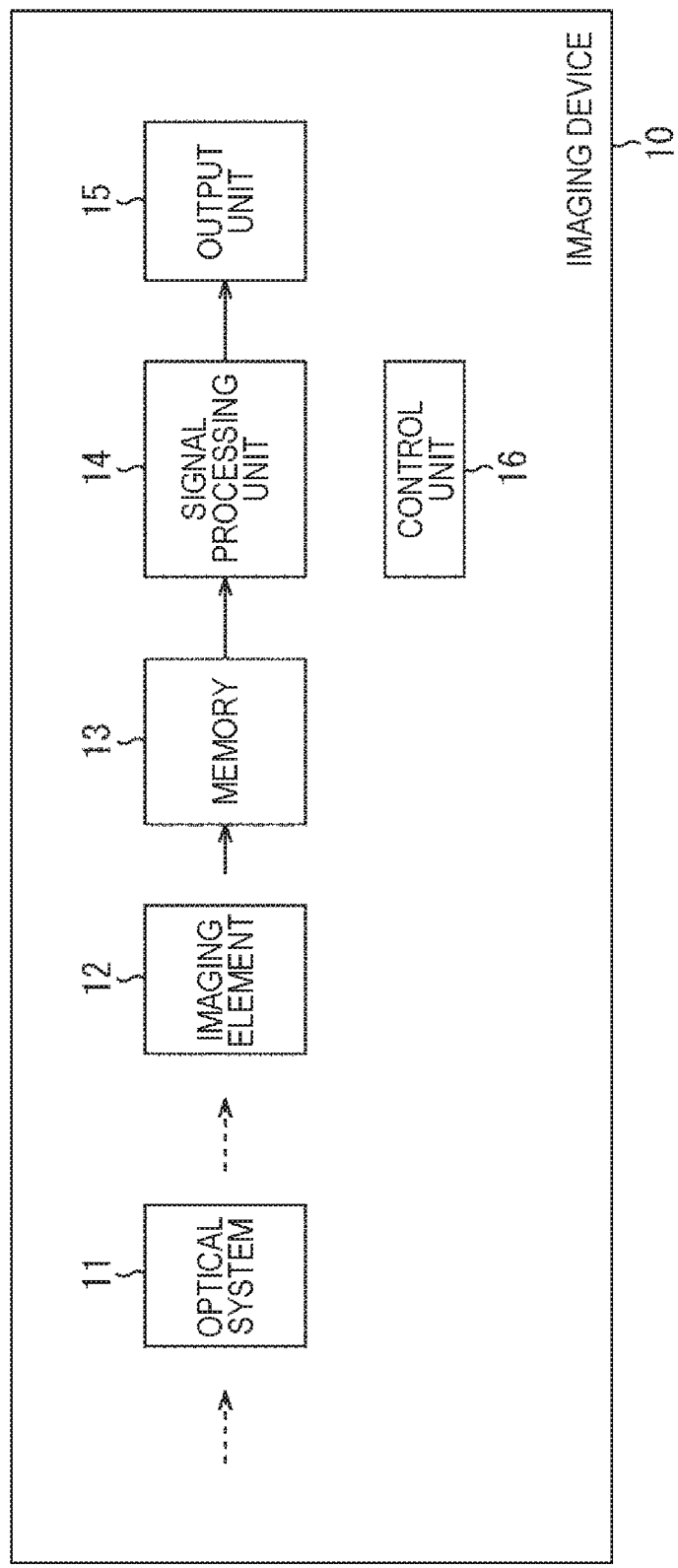
FIG. 1 is a block diagram illustrating an embodiment of an imaging device to which the present technology is applied.

FIG. 1 is a block diagram illustrating an embodiment of an imaging device that is a type of electronic devices to which the present technology is applied.

An imaging device 10 in FIG. 1 is, for example, a digital camera capable of capturing both of a still image and a moving image. Furthermore, the imaging device 10 includes, for example, a multispectral camera capable of detecting light (multispectrum) in four or more wavelength bands (four or more bands) larger than three primary colors or three wavelength bands (three bands) of conventional red (R), green (G), and blue (B), or yellow (Y), magenta (M), and cyan (C) based on a color-matching function.

The imaging device 10 includes an optical system 11, an imaging element 12, a memory 13, a signal processing unit 14, an output unit 15, and a control unit 16.

The optical system 11 includes, for example, a zoom lens, a focus lens, a diaphragm, and the like (not illustrated), and allows external light to enter the imaging element 12. Furthermore, the optical system 11 is provided with various filters such as a polarizing filter as needed.

The imaging element 12 includes a complementary metal oxide semiconductor (CMOS) image sensor, for example. The imaging element 12 receives incident light from the optical system 11, performs photoelectric conversion, and outputs image data corresponding to the incident light.

The memory 13 temporarily stores image data output by the imaging element 12.

The signal processing unit 14 performs signal processing (for example, processing such as noise removal and white balance adjustment) using the image data stored in the memory 13 and supplies the processed image data to the output unit 15.

The output unit 15 outputs the image data from the signal processing unit 14. For example, the output unit 15 includes a display (not illustrated) configured by a liquid crystal or the like, and displays a spectrum (image) corresponding to the image data from the signal processing unit 14 as a so-called through image. For example, the output unit 15 includes a driver (not illustrated) for driving a recording medium such as a semiconductor memory, a magnetic disk, or an optical disk, and records the image data from the signal processing unit 14 on the recording medium. For example, the output unit 15 functions as a communication interface that performs communication with an external device (not illustrated), and transmits the image data from the signal processing unit 14 to the external device by wireless or wired means.

The control unit 16 controls each unit of the imaging device 10 according to a user operation or the like.

<Configuration Example of Circuit of Imaging Element>

Figure 2:
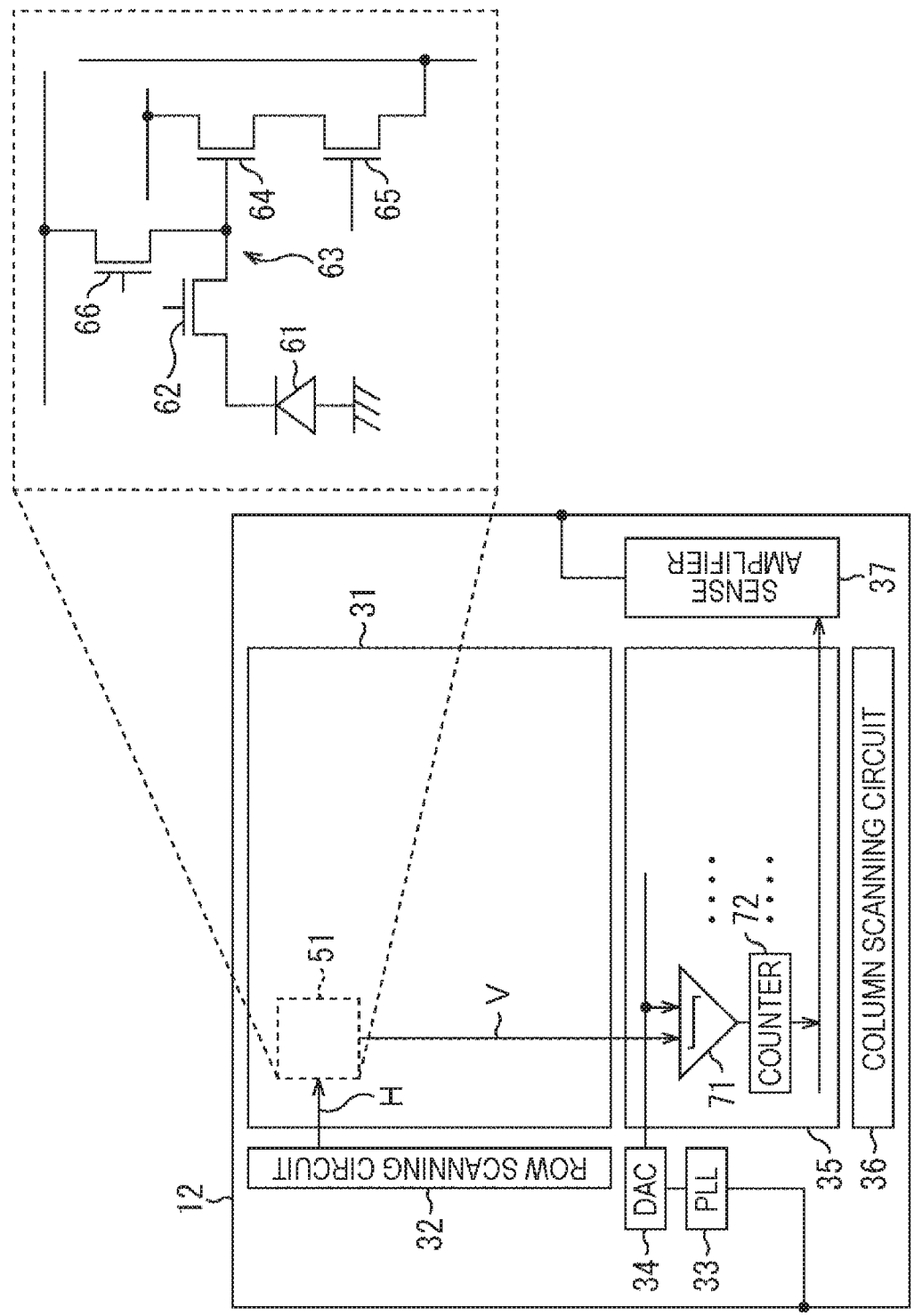
FIG. 2 is a block diagram illustrating a configuration example of a circuit of an imaging element.

FIG. 2 is a block diagram illustrating a configuration example of a circuit of the imaging element 12 in FIG. 1.

The imaging element 12 includes a pixel array unit 31, a row scanning circuit 32, a phase locked loop (PLL) 33, a digital analog converter (DAC) 34, a column analog digital converter (ADC) circuit 35, a column scanning circuit 36, and a sense amplifier 37.

In the pixel array unit 31, a plurality of pixels 51 is two-dimensionally arrayed.

Each of the pixels 51 is arranged at a point where a horizontal signal line H connected to the row scanning circuit 32 and a vertical signal line V connected to the column ADC circuit 35 intersect, and includes a photodiode 61 for performing photoelectric conversion and several types of transistors for reading stored signals. That is, the pixel 51 includes a photodiode 61, a transfer transistor 62, a floating diffusion 63, an amplification transistor 64, a selection transistor 65, and a reset transistor 66, as illustrated in an enlarged manner on the right side in FIG. 2.

A charge stored in the photodiode 61 is transferred to the floating diffusion 63 via the transfer transistor 62. The floating diffusion 63 is connected to a gate of the amplification transistor 64. When the pixel 51 is selected for reading a signal, the selection transistor 65 is turned on from the row scanning circuit 32 via the horizontal signal line H, and the amplification transistor 64 is source-follower driven, so that the signal of the selected pixel 51 is read out to the vertical signal line V as a pixel signal corresponding to a stored charge amount of the charge stored in the photodiode 61. Furthermore, the pixel signal is reset by turning on the reset transistor 66.

The row scanning circuit 32 sequentially outputs, for each row, drive signals for driving (for example, transferring, selecting, resetting, or the like) the pixels 51 of the pixel array unit 31.

The PLL 33 generates and outputs a clock signal having a predetermined frequency required for driving each unit of the imaging element 12 on the basis of a clock signal supplied from the outside.

The DAC 34 generates and outputs a ramp signal having a shape (substantially sawtooth shape) in which a voltage is returned to a predetermined voltage value after dropping at a fixed gradient from the predetermined voltage value.

The column ADC circuit 35 includes comparators 71 and counters 72 by the number corresponding to columns of the pixels 51 of the pixel array unit 31, and extracts a signal level by a correlated double sampling (CDS) operation from the pixel signal output from the pixel 51 and outputs pixel data. That is, the comparator 71 compares the ramp signal supplied from the DAC 34 with the pixel signal (luminance value) output from the pixel 51, and supplies a resultant comparison result signal to the counter 72. Then, the counter 72 counts the counter clock signal having a predetermined frequency according to the comparison result signal output from the comparator 71, so that the pixel signal is A/D converted.

The column scanning circuit 36 sequentially supplies a signal for outputting the pixel data to the counter 72 of the column ADC circuit 35 at predetermined timing.

The sense amplifier 37 amplifies the pixel data supplied from the column ADC circuit 35 and outputs the amplified pixel data to the outside of the imaging element 12.

<Configuration of Imaging Element>

Figure 3:
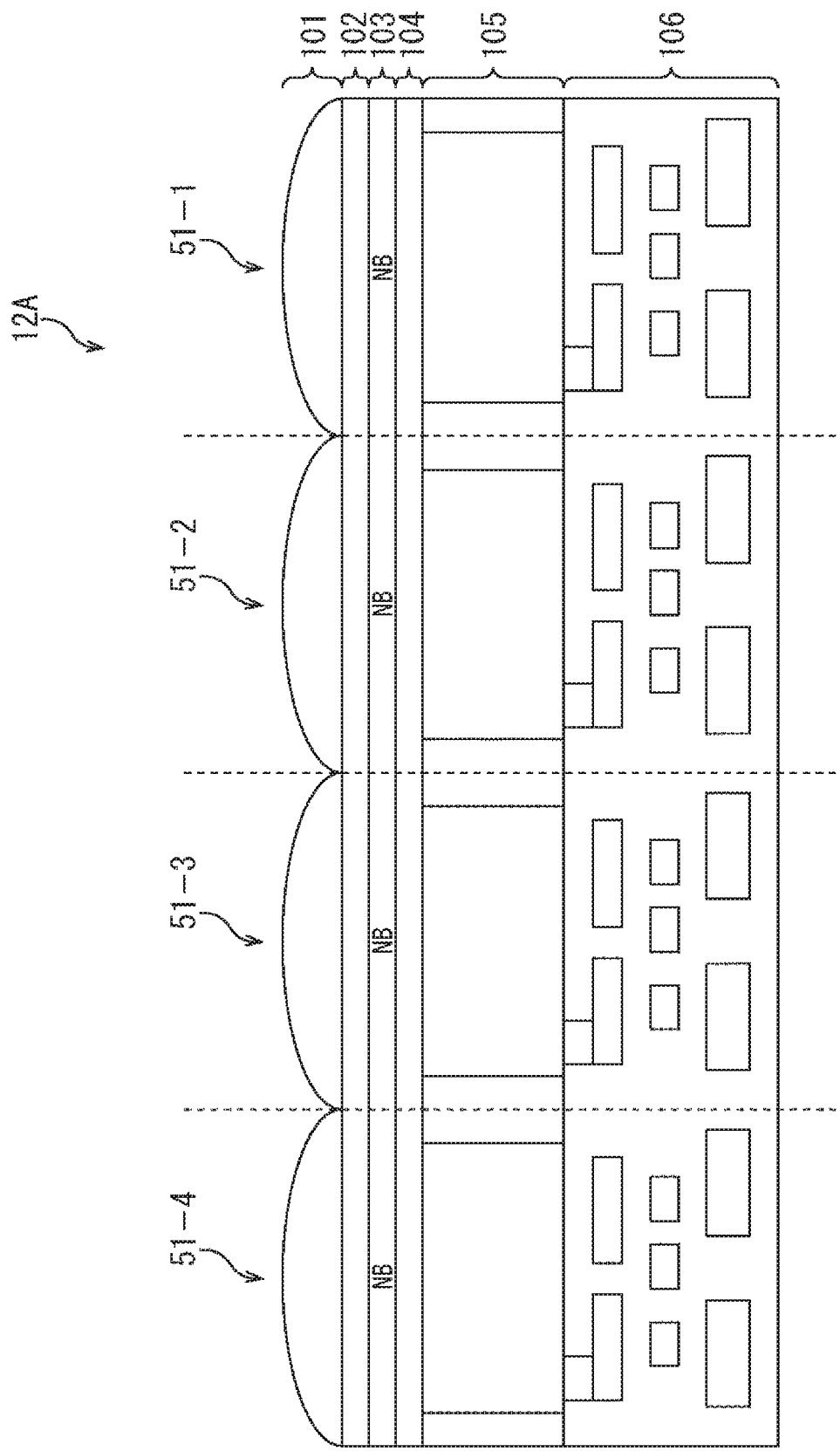
FIG. 3 is a cross-sectional view schematically illustrating a configuration example of a first embodiment of the imaging element.

FIG. 3 schematically illustrates a configuration example of a cross section of the imaging element 12 in FIG. 1. FIG. 3 illustrates a cross section of four pixels 51-1 to 51-4 of the imaging element 12. Note that, hereinafter, the pixels 51-1 to 51-4 are simply referred to as pixels 51 in a case where there is no necessity to individually distinguish the pixels 51-1 to 51-4.

In each pixel 51, an on-chip microlens 101, an interlayer film 102, a narrow band filter layer 103, an interlayer film 104, a photoelectric conversion element layer 105, and a wiring layer 106 are stacked in order from the top. That is, the imaging element 12 includes a back-illuminated CMOS image sensor in which the photoelectric conversion element layer 105 is arranged on a light incident side with respect to the wiring layer 106.

The on-chip microlens 101 is an optical element for condensing light on the photoelectric conversion element layer 105 of each pixel 51.

The interlayer films 102 and 104 include a dielectric such as SiO2. As will be described below, dielectric constants of the interlayer films 102 and 104 are desirably as low as possible.

In the narrow band filter layer 103, a narrow band filter NB that is an optical filter that transmits narrow band light in a predetermined narrow wavelength band (narrow band) is provided in each pixel 51. For example, a plasmon filter using surface plasmons, which is a type of metal thin film filters using a metal-made thin film such as aluminum, is used as the narrow band filter NB. Furthermore, a transmission band of the narrow band filter NB is set for each pixel 51. Types (number of bands) of the transmission band of the narrow band filter NB is arbitrary, and are set to four or more, for example.

Here, the narrow band refers to, for example, a wavelength band narrower than transmission bands of color filters of the three primary colors or the conventional red (R), green (G), and blue (B), or yellow (Y), magenta (M), and cyan (C), the conventional red (R), green (G), or blue (B) based on a color-matching function. Furthermore, hereinafter, a pixel that receives narrow band light transmitted through the narrow band filter NB is referred to as a multispectral pixel or an MS pixel.

The photoelectric conversion element layer 105 includes the photodiode 61 and the like in FIG. 2, for example, and receives the light (narrow band light) transmitted through the narrow band filter layer 103 (narrow band filter NB) and converts the received light into charges. Furthermore, the photoelectric conversion element layer 105 is configured such that the pixels 51 are electrically separated by an element separation layer.

The wiring layer 106 is provided with wiring for reading the charge stored in the photoelectric conversion element layer 105, and the like.

<Plasmon Filter>

Next, a plasmon filter that can be used as the narrow band filter NB will be described with reference to FIGS. 4, 5, 6, 7, 8, 9, 10A, 10B, 11, 12A, 12B, 13, 14, and 15.

Figure 4:
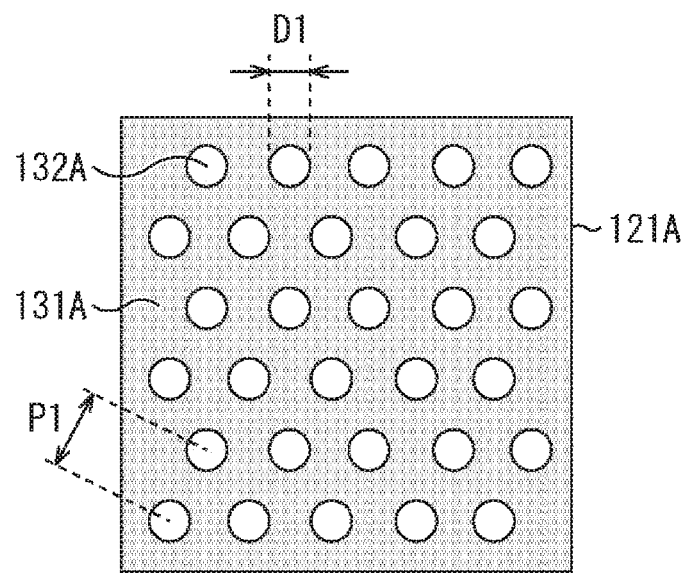
FIG. 4 is a view illustrating a configuration example of a plasmon filter having a hole array structure.

FIG. 4 illustrates a configuration example of a plasmon filter 121A having a hole array structure.

The plasmon filter 121A is configured by a plasmon resonator in which holes 132A are arranged in a honeycomb manner in a metal-made thin film (hereinafter, referred to as a conductive thin film) 131A.

Each hole 132A penetrates the conductive thin film 131A and functions as a waveguide tube. Generally, a waveguide tube has a cutoff frequency and a cutoff wavelength determined according to a shape such as a side length and a diameter, and has a property that light having a frequency equal to or lower than the cutoff frequency (a wavelength equal to or larger than the cutoff wavelength) does not propagate. The cutoff wavelength of the hole 132A mainly depends on an opening diameter D1, and the cutoff wavelength becomes shorter as the opening diameter D1 is smaller. Note that the opening diameter D1 is set to a value smaller than the wavelength of light to be transmitted.

Meanwhile, when light enters the conductive thin film 131A having the holes 132A periodically formed with a short period equal to or smaller than the wavelength of the light, a phenomenon in which the light having the wavelength longer than the cutoff wavelength of the hole 132A is transmitted occurs. This phenomenon is called an abnormal plasmon transmission phenomenon. This phenomenon occurs when surface plasmons are excited at a boundary between the conductive thin film 131A and the interlayer film 102 thereon.

Here, conditions for generating the abnormal plasmon transmission phenomenon (surface plasmon resonance) will be described with reference to FIG. 5.

Figure 5:
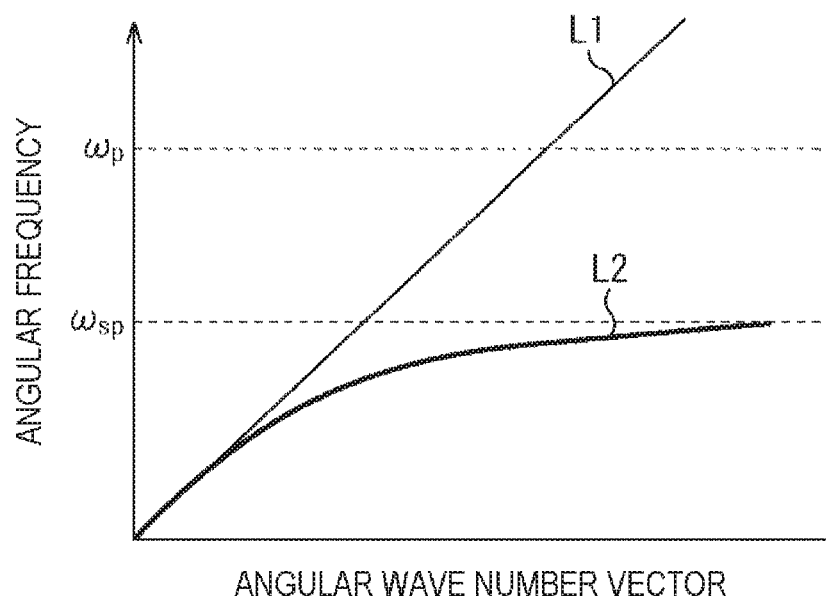
FIG. 5 is a graph illustrating a dispersion relationship of surface plasmons.

FIG. 5 is a graph illustrating a dispersion relationship of surface plasmons. The horizontal axis of the graph represents an angular wave number vector k, and a vertical axis represents an angular frequency ω. $ω_p$ represents a plasma frequency of the conductive thin film 131A. $ω_{sp}$ represents a surface plasma frequency at the boundary surface between the interlayer film 102 and the conductive thin film 131A, and is expressed by the following expression (1).

[Math. 1]
$$\omega_{sp} = \frac{\omega_p}{\sqrt{1+\varepsilon_d}} \quad (1)$$

$\varepsilon_d$ represents a dielectric constant of the dielectric configuring the interlayer film 102.

The surface plasma frequency $ω_{sp}$ becomes higher as the plasma frequency $ω_p$ becomes higher according to the expression (1). Furthermore, the surface plasma frequency $ω_{sp}$ becomes higher as the dielectric constant $\varepsilon_d$ becomes smaller.

A line L1 represents a light dispersion relationship (light line) and is expressed by the following expression (2).

[Math. 2]
$$\omega = \frac{c}{\sqrt{\varepsilon_d}} k \quad (2)$$

c represents a light speed.

A line L2 represents a dispersion relationship of the surface plasmons, and is expressed by the following expression (3).

[Math. 3]
$$\omega = ck\sqrt{\frac{\varepsilon_m + \varepsilon_d}{\varepsilon_m \varepsilon_d}} \quad (3)$$

$\varepsilon_n$ represents a dielectric constant of the conductive thin film 131A.

The dispersion relationship of the surface plasmons represented by the line L2 asymptotically approaches the light line represented by the line L1 in a range where the angular wave number vector k is small, and asymptotically approaches the surface plasma frequency $ω_{sp}$ as the angular wave number vector k becomes large.

Then, when the following expression (4) holds, the abnormal plasmon transmission phenomenon occurs.

[Math. 4]
$$Re\left[\frac{\omega_{sp}}{c}\sqrt{\frac{\varepsilon_m \varepsilon_d}{\varepsilon_m + \varepsilon_d}}\right] = \left|\frac{2\pi}{\lambda}\sin\theta + iG_x + jG_y\right| \quad (4)$$

λ represents a wavelength of incident light. θ represents an incidence angle of the incident light. $G_x$ and $G_y$ are expressed by the following expression (5).

$$|G_x|=|G_y|=2\pi/a_0 \quad (5)$$

$a_0$ represents a lattice constant of the hole array structure including the holes 132A of the conductive thin film 131A.

The left side of the expression (4) indicates the angular wave number vector of the surface plasmon, and the right side indicates the angular wave number vector of a hole array period of the conductive thin film 131A. Therefore, when the angular wave number vector of the surface plasmon becomes equal to the angular wave number vector of the hole array period of the conductive thin film 131A, the abnormal plasmon transmission phenomenon occurs. Then, the value of λ at this time is a plasmon resonance wavelength (a transmission wavelength of the plasmon filter 121A).

Note that the angular wave number vector of the surface plasmon on the left side of the expression (4) is determined according to the dielectric constant $\varepsilon_m$ of the conductive thin film 131A and the dielectric constant $\varepsilon_d$ of the interlayer film 102. Meanwhile, the angular wave number vector of the hole array period on the right side is determined according to the incidence angle θ of light and a pitch (hole pitch) P1 between adjacent holes 132A of the conductive thin film 131A. Therefore, the resonance wavelength and a resonance frequency of the plasmon are determined according to the dielectric constant cm of the conductive thin film 131A, the dielectric constant $\varepsilon_d$ of the interlayer film 102, the incidence angle θ of light, and the hole pitch P1. Note that, in a case where the incidence angle of light is 0°, the resonance wavelength and the resonance frequency of the plasmon are determined according to the dielectric constant $\varepsilon_m$ of the conductive thin film 131A, the dielectric constant $\varepsilon_d$ of the interlayer film 102, and the hole pitch P1.

Therefore, a transmission band (plasmon resonance wavelength) of the plasmon filter 121A changes depending on the material and film thickness of the conductive thin film 131A, the material and film thickness of the interlayer film 102, and a hole array pattern period (for example, the opening diameter D1 and the hole pitch P1 of the hole 132A), and the like. In particular, in a case where the materials and film thicknesses of the conductive thin film 131A and the interlayer film 102 are determined, the transmission band of the plasmon filter 121A changes depending on the hole array pattern period, particularly, the hole pitch P1. That is, the transmission band of the plasmon filter 121A shifts to a shorter wavelength side as the hole pitch P1 becomes narrower, and the transmission band of the plasmon filter 121A shifts to a longer wavelength side as the hole pitch P1 becomes wider.

Figure 6:
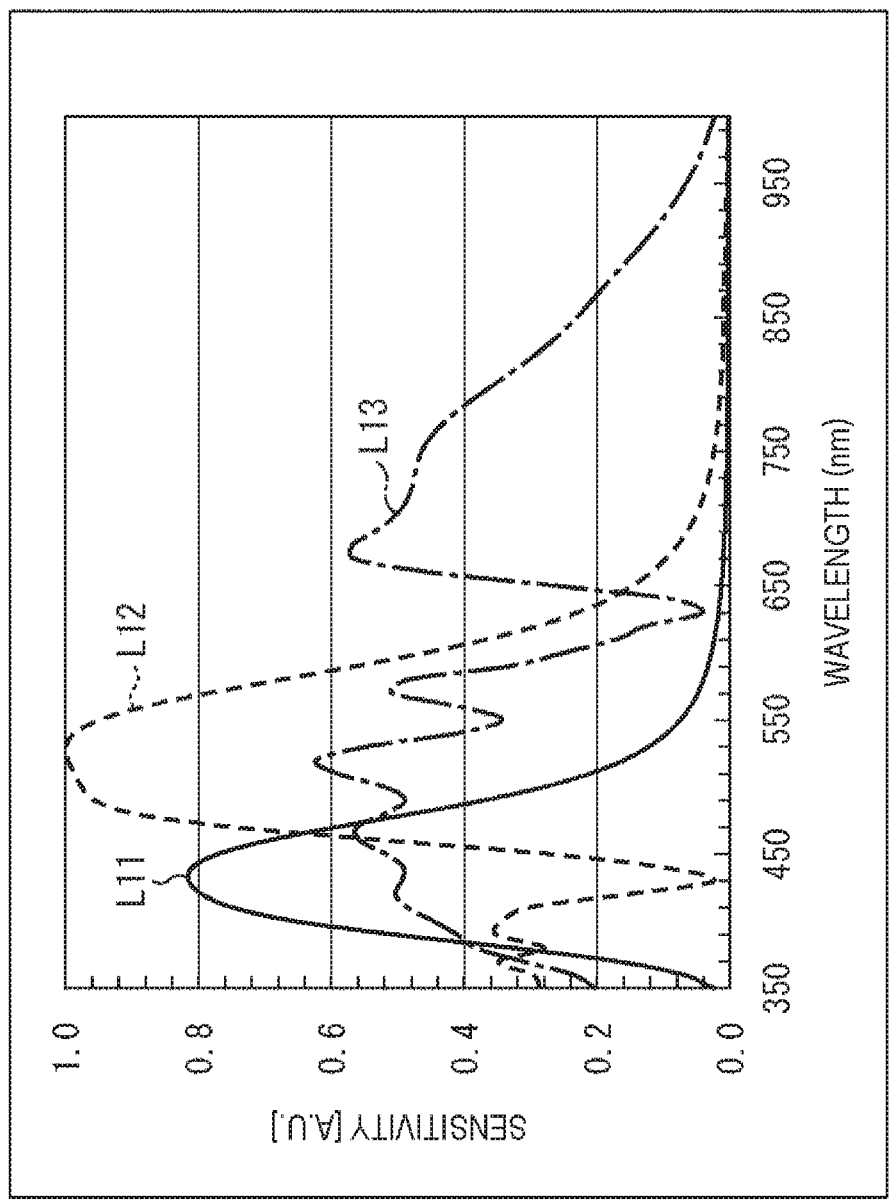
FIG. 6 is a graph illustrating a first example of spectral characteristics of the plasmon filter having a hole array structure.

FIG. 6 is a graph illustrating an example of spectral characteristics of the plasmon filter 121A in a case where the hole pitch P1 is changed. The horizontal axis of the graph represents the wavelength (the unit is nm), and the vertical axis represents sensitivity (the unit is arbitrary unit). A line L11 represents a spectral characteristic in a case where the hole pitch P1 is set to 250 nm, a line L12 represents a spectral characteristic in a case where the hole pitch P1 is set to 325 nm, and a line L13 represents a spectral characteristic in a case where the hole pitch P1 is set to 500 nm.

In the case where the hole pitch P1 is set to 250 nm, the plasmon filter 121A mainly transmits light in a blue wavelength band. In the case where the hole pitch P1 is set to 325 nm, the plasmon filter 121A mainly transmits light in a green wavelength band. In the case where the hole pitch P1 is set to 500 nm, the plasmon filter 121A mainly transmits light in a red wavelength band. Note that, in the case where the hole pitch P1 is set to 500 nm, the plasmon filter 121A also transmits light in a lower wavelength band than red according to a waveguide mode to be described below.

Figure 7:
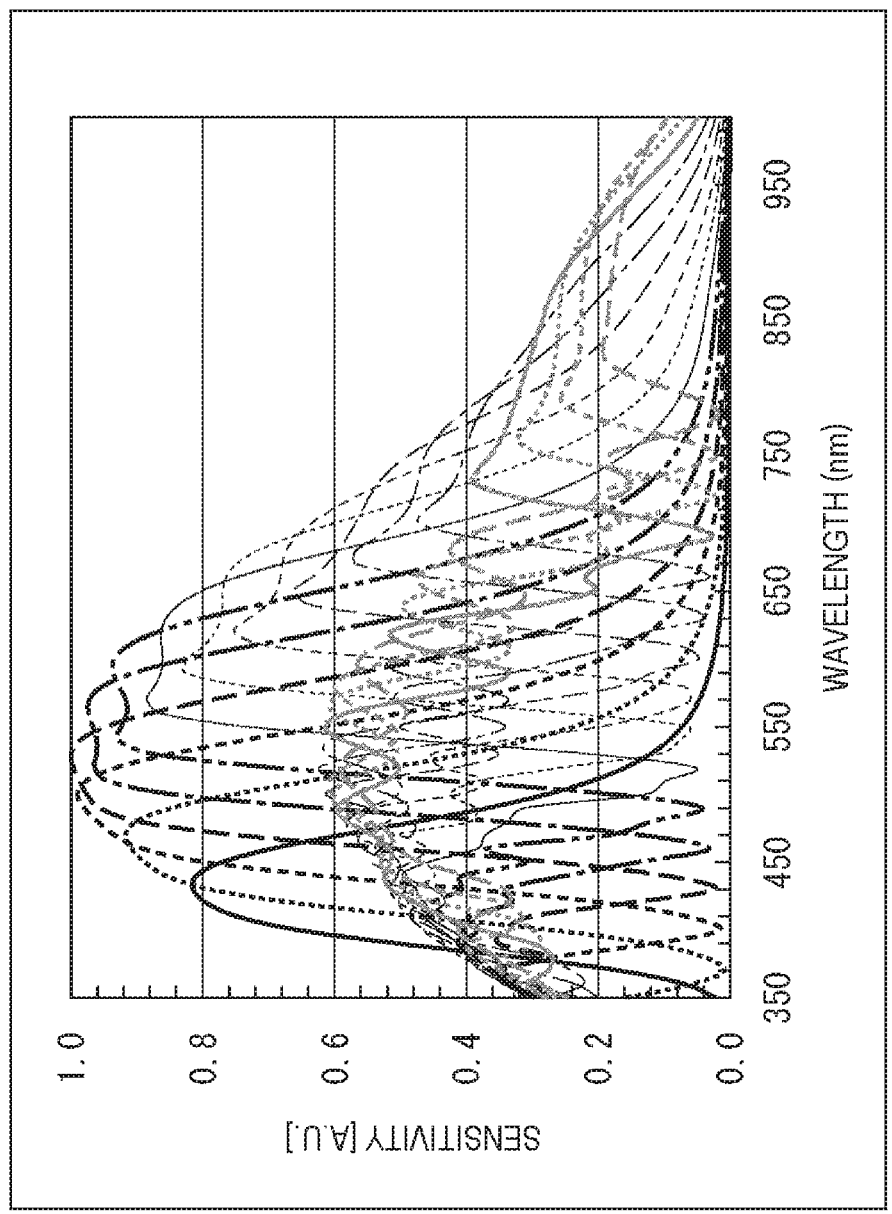
FIG. 7 is a graph illustrating a second example of spectral characteristics of the plasmon filter having a hole array structure.

FIG. 7 is a graph illustrating another example of spectral characteristics of the plasmon filter 121A in a case where the hole pitch P1 is changed. The horizontal axis of the graph represents the wavelength (the unit is nm), and the vertical axis represents sensitivity (the unit is arbitrary unit). This example illustrates an example of spectral characteristics of sixteen types of plasmon filters 121A in a case where the hole pitch P1 is changed at intervals of 25 nm from 250 nm to 625 nm.

Note that transmittance of the plasmon filter 121A is mainly determined according to the opening diameter D1 of the hole 132A. The transmittance becomes higher while the color mixture is more likely to occur as the opening diameter D1 becomes larger. Generally, it is desirable to set the opening diameter D1 such that an opening ratio becomes 50% to 60% of the hole pitch P1.

Furthermore, each hole 132A of the plasmon filter 121A functions as a waveguide tube, as described above. Therefore, in the spectral characteristics, there are some cases where not only a wavelength component transmitted by surface plasmon resonance (a wavelength component in a plasmon mode) but also a wavelength component transmitted through the hole 132A (waveguide tube) (a wavelength component in a waveguide mode) becomes large, depending on a pattern of the hole array of the plasmon filter 121A.

Figure 8:
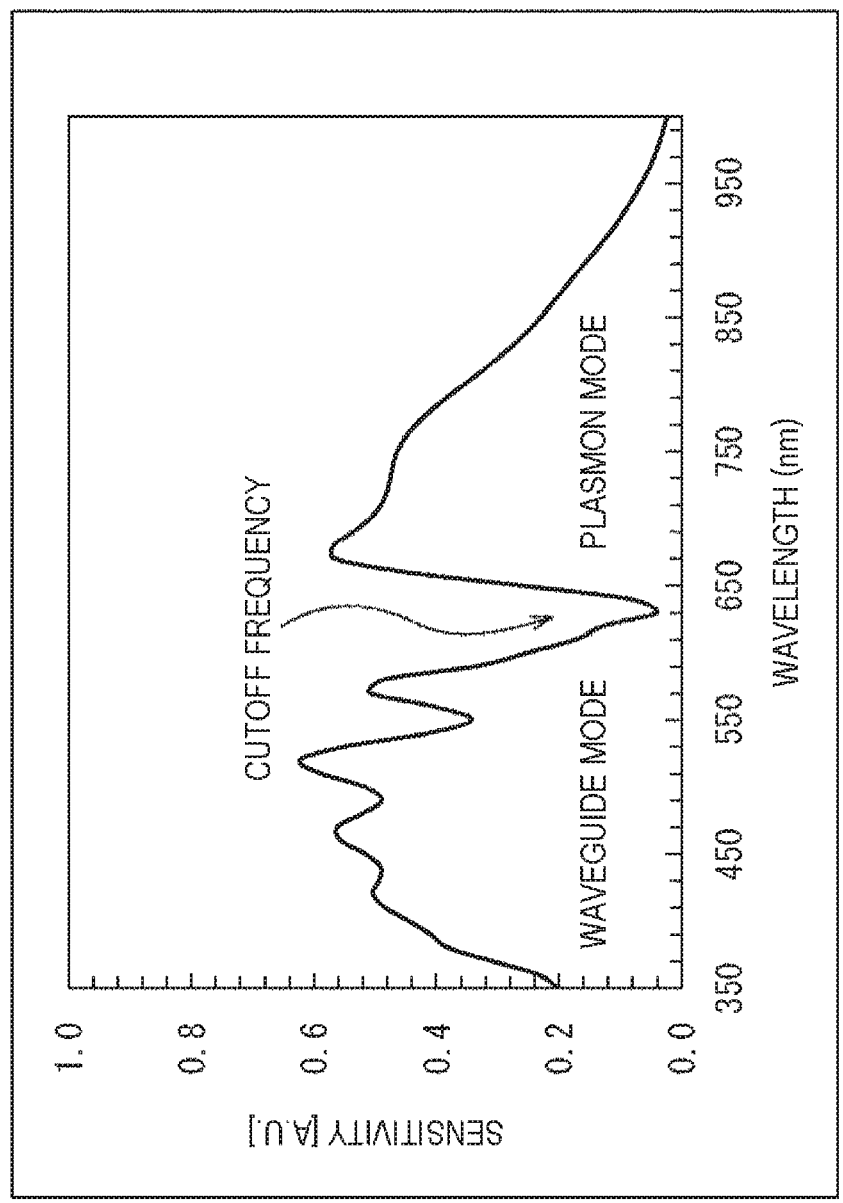
FIG. 8 is a graph illustrating a plasmon mode and a waveguide mode.

FIG. 8 illustrates spectral characteristics of the plasmon filter 121A in a case where the hole pitch P1 is set to 500 nm, similarly to the spectral characteristics represented by the line L13 in FIG. 6. In this example, a longer wavelength side than the cutoff wavelength around 630 nm is a wavelength component in the plasmon mode, and a shorter wavelength side than the cutoff wavelength is a waveguide component in the waveguide mode.

As described above, the cutoff wavelength mainly depends on the opening diameter D1 of the hole 132A, and the cutoff wavelength becomes shorter as the opening diameter D1 is smaller. Then, wavelength resolution characteristics of the plasmon filter 121A are improved as a difference between the cutoff wavelength and a peak wavelength in the plasmon mode is made larger.

Furthermore, as described above, the surface plasma frequency $\omega_{sp}$ of the conductive thin film 131A becomes higher as the plasma frequency $\omega_p$ of the conductive thin film 131A becomes higher. Furthermore, the surface plasma frequency $\omega_{sp}$ becomes higher as the dielectric constant $\varepsilon_d$ of the interlayer film 102 becomes smaller. Then, the plasmon resonance frequency can be set to be higher as the surface plasma frequency $\omega_{sp}$ becomes higher, and the transmission band (plasmon resonance wavelength) of the plasmon filter 121A can be set to a shorter wavelength band.

Therefore, use of a metal having a smaller plasma frequency $\omega_p$ for the conductive thin film 131A enables setting of a shorter wavelength band as the transmission band of the plasmon filter 121A. For example, aluminum, silver, gold, or the like is suitable. Note that copper or the like can be used in a case where the transmission band is set to a long wavelength band such as infrared light.

Furthermore, use of a dielectric having a smaller dielectric constant $\varepsilon_d$ for the interlayer film 102 enables setting of a shorter wavelength band as the transmission band of the plasmon filter 121A. For example, SiO2, SiN, Low-K, SiC, TiO2, ZnS, MgF2, or the like is suitable.

Figure 9:
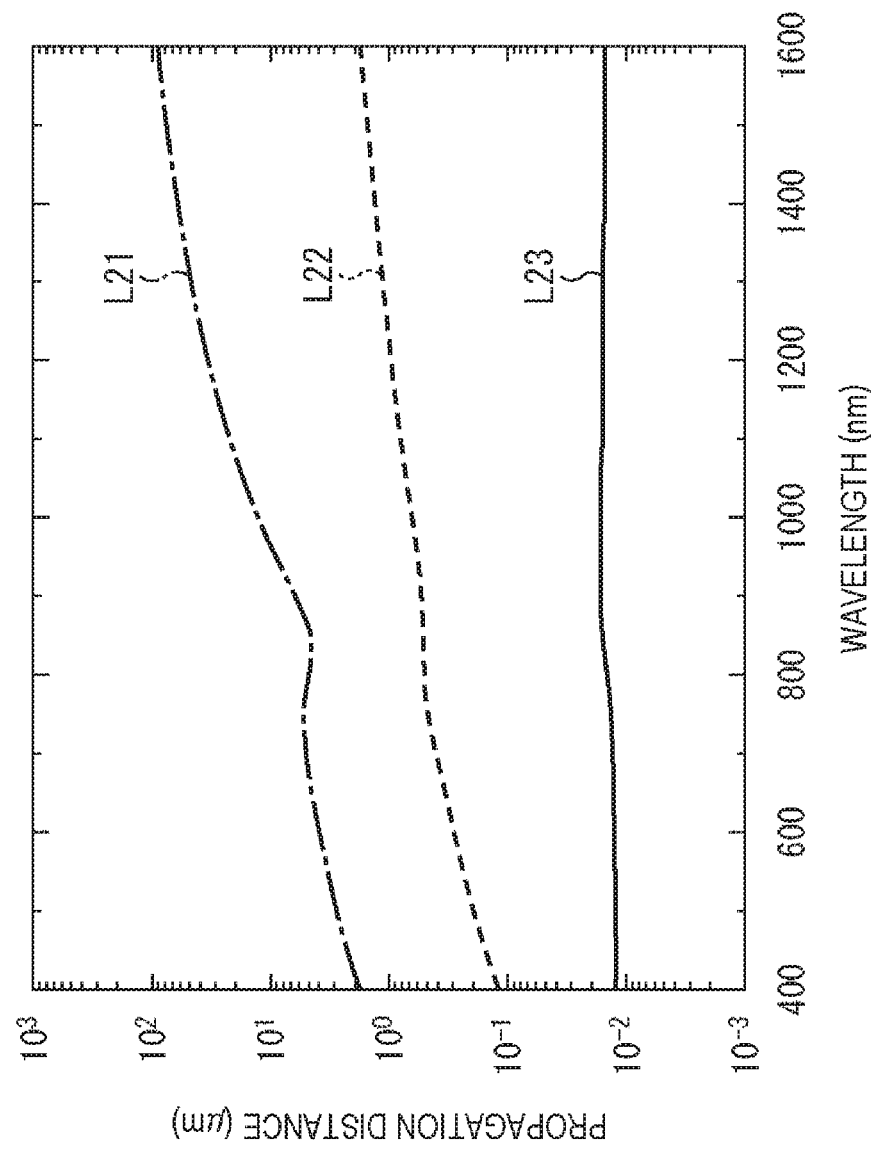
FIG. 9 is a graph illustrating an example of propagation characteristics of surface plasmons.

Furthermore, FIG. 9 is a graph illustrating propagation characteristics of the surface plasmons at an interface between the conductive thin film 131A and the interlayer film 102 in a case where aluminum is used for the conductive thin film 131A and SiO2 is used for the interlayer film 102. The horizontal axis of the graph represents the wavelength (the unit is nm), and the vertical axis represents a propagation distance (the unit is μm). Furthermore, a line L21 represents a propagation characteristic in an interface direction, a line L22 represents a propagation characteristic in a depth direction of the interlayer film 102 (a direction perpendicular to the interface), and a line L23 represents a propagation characteristic in the depth direction of the conductive thin film 131A (the direction perpendicular to the interface).

A propagation distance $\Lambda_{SPP}$ (A) of the surface plasmon in the depth direction is expressed by the following expression (6).

[Math. 5]

$$\Lambda_{SPP}(\lambda) \equiv \frac{4\pi k_{SPP}}{\lambda} = \frac{4\pi}{\lambda}\text{Im}\left[\sqrt{\frac{\varepsilon_m \varepsilon_d}{\varepsilon_m + \varepsilon_d}}\right] \quad (6)$$

$k_{SPP}$ represents an absorption coefficient of a substance through which the surface plasmon propagates. $\varepsilon_m$ ($\lambda$) represents the dielectric constant of the conductive thin film 131A with respect to light having a wavelength $\lambda$. $\varepsilon_d$ ($\lambda$) represents the dielectric constant of the interlayer film 102 with respect to the light having the wavelength $\lambda$.

Therefore, as illustrated in FIG. 9, the surface plasmon with respect to the light having the wavelength of 400 nm propagates from the surface of the interlayer film 102 containing SiO2 to about 100 nm in the depth direction. Therefore, by setting the thickness of the interlayer film 102 to 100 nm or more, an influence of a substance stacked on a surface of the interlayer film 102, the surface being opposite to the conductive thin film 131A, on the surface plasmons at the interface between the interlayer film 102 and the conductive thin film 131A can be prevented.

Furthermore, the surface plasmon with respect to the light having the wavelength of 400 nm propagates from the surface of the conductive thin film 131A containing aluminum to about 10 nm in the depth direction. Therefore, by setting the thickness of the conductive thin film 131A to 10 nm or more, an influence of the interlayer film 104 on the surface plasmons at the interface between the interlayer film 102 and the conductive thin film 131A can be prevented.

<Other Examples of Plasmon Filter>

Next, other examples of the plasmon filter will be described with reference to FIGS. 10A, 10B, 11, 12A, 12B, 13, 14, and 15.

Figure 10A:
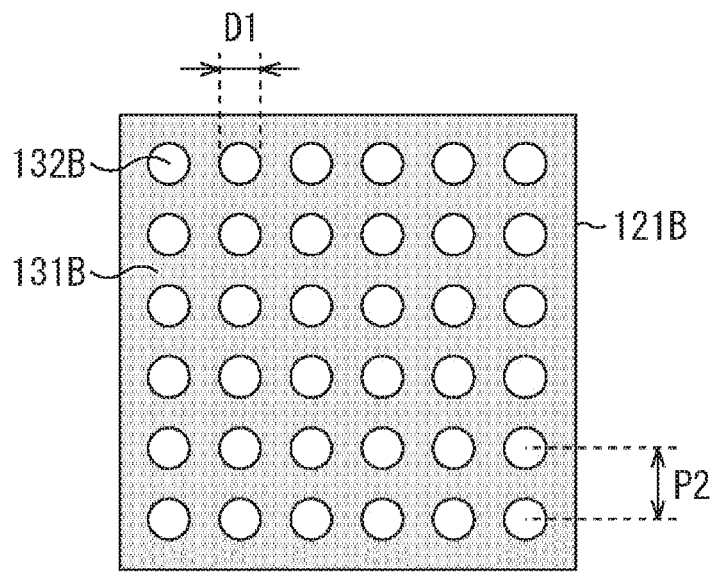
FIGS. 10A and 10B are view illustrating other configuration examples of the plasmon filter having a hole array structure.

A plasmon filter 121B in FIG. 10A is configured by a plasmon resonator in which holes 132B are arranged in an orthogonal matrix in a conductive thin film 131B. In the plasmon filter 121B, the transmission band changes depending on a pitch P2 between adjacent holes 132B, for example.

Furthermore, in the plasmon resonator, not all the holes need to penetrate the conductive thin film. Even if some holes are configured as non-through holes that do not penetrate the conductive thin film, the plasmon resonator functions as a filter.

Figure 10B:
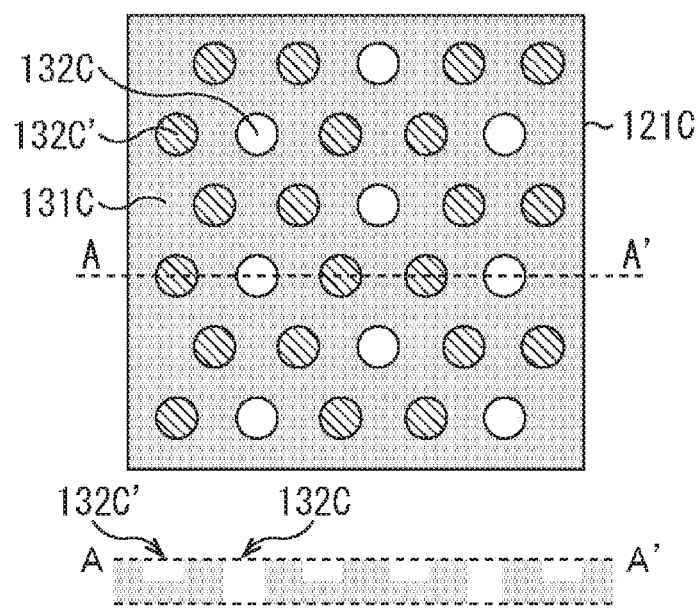

For example, FIG. 10B illustrates a plan view and a cross-sectional view (taken along line A-A' in the plan view) of a plasmon filter 121C configured by a plasmon resonator in which holes 132C configured as through holes and holes 132C' configured as non-through holes are arranged in a honeycomb manner in a conductive thin film 131C. That is, the holes 132C configured as through holes and the holes 132C' configured as non-through holes are periodically arranged in the plasmon filter 121C.

Moreover, although a single-layer plasmon resonator is basically used as the plasmon filter, the plasmon filter may be configured by a two-layer plasmon resonator, for example.

Figure 11:
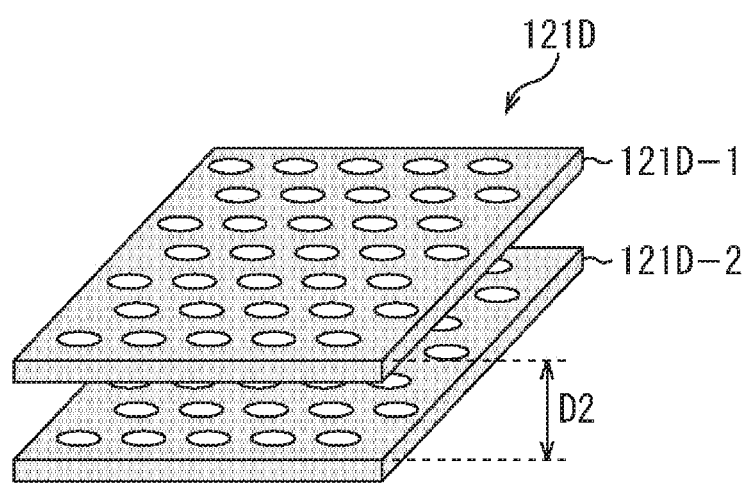
FIG. 11 is a view illustrating a configuration example of a plasmon filter having a two-layer array structure.

For example, a plasmon filter 121D illustrated in FIG. 11 includes a two-layer plasmon filter 121D-1 and plasmon filter 121D-2. The plasmon filter 121D-1 and the plasmon filter 121D-2 have a structure in which holes are arranged in a honeycomb manner, similarly to the plasmon resonator configuring the plasmon filter 121A in FIG. 4.

Furthermore, a distance D2 between the plasmon filter 121D-1 and the plasmon filter 121D-2 is favorably set to about ¼ of a peak wavelength of the transmission band. Furthermore, the distance D2 is more favorably equal to or less than ½ of the peak wavelength of the transmission band in consideration of the degree of freedom in design.

Note that the holes may be arranged in patterns similar to each other in a two-layer plasmon resonator structure, for example, other than the structure like the plasmon filter 121D in which the holes are arranged in the same pattern in the plasmon filter 121D-1 and the plasmon filter 121D-2. Furthermore, holes and dots may be arranged in a pattern in which a hole array structure and a dot array structure (to be described below) are inverted in the two-layer plasmon resonator structure. Moreover, a three or more multilayer structure can be adopted although the plasmon filter 121D has the two-layer structure.

Furthermore, in the above description, the configuration example of the plasmon filter using the plasmon resonator having the hole array structure has been described. However, a plasmon resonator having a dot array structure may be adopted as the plasmon filter.

A plasmon filter having a dot array structure will be described with reference to FIGS. 12A and 12B.

Figure 12A:
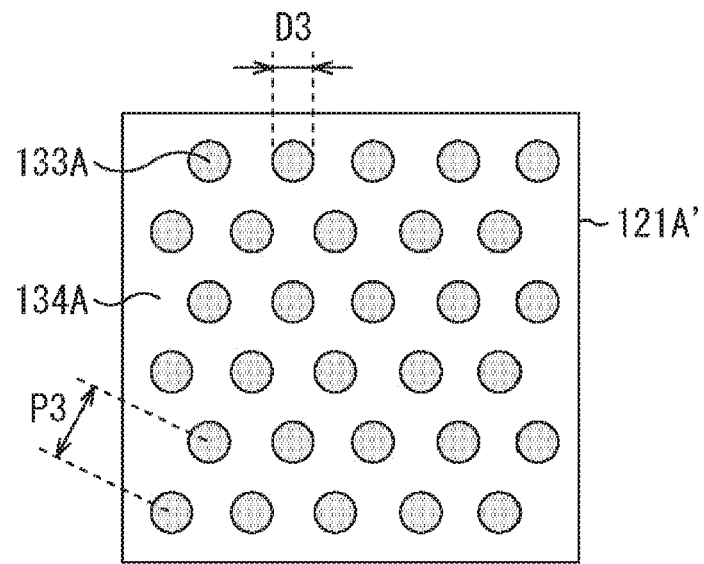
FIGS. 12A and 12B are view illustrating configuration examples of a plasmon filter having a dot array structure.

A plasmon filter 121A' in FIG. 12A has a negative-positive inverted structure with respect to the plasmon resonator of the plasmon filter 121A in FIG. 4, that is, configured by a plasmon resonator in which dots 133A are arranged in a honeycomb manner in a dielectric layer 134A. The dielectric layer 134A is added between the dots 133A.

The plasmon filter 121A' is used as a complementary color filter to absorb light in a predetermined wavelength band. The wavelength band (hereinafter referred to as absorption band) of light absorbed by the plasmon filter 121A' changes depending on a pitch between adjacent dots 133A (hereinafter referred to as a dot pitch) P3, or the like. Furthermore, a diameter D3 of the dot 133A is adjusted according to the dot pitch P3.

Figure 12B:
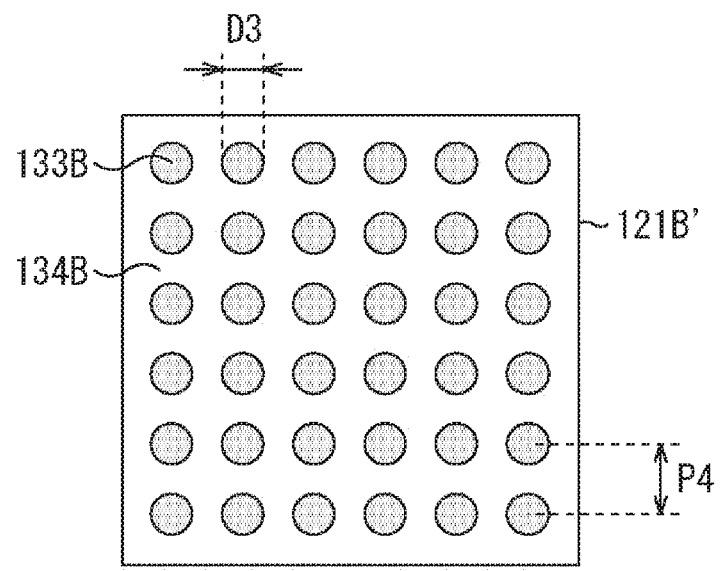

A plasmon filter 121B' in FIG. 12B has a negative-positive inverted structure with respect to the plasmon resonator of the plasmon filter 121B in FIG. 10A, that is, a plasmon resonator structure in which dots 133B are arranged in a straight matrix in a dielectric layer 134B. The dielectric layer 134B is added between the dots 133B.

The absorption band of the plasmon filter 121B' changes depending on a dot pitch P4 between adjacent dots 133B, or the like. Furthermore, a diameter D3 of the dot 133B is adjusted according to the dot pitch P4.

FIG. 13 is a graph illustrating an example of spectral characteristics in a case where the dot pitch P3 of the plasmon filter 121A' in FIG. 12A is changed. The horizontal axis of the graph represents the wavelength (the unit is nm), and the vertical axis represents the transmittance. A line L31 represents a spectral characteristic in a case where the dot pitch P3 is set to 300 nm, a line L32 represents a spectral characteristic in a case where the dot pitch P3 is set to 400 nm, and a line L33 represents a spectral characteristic in a case where the dot pitch P3 is set to 500 nm.

As illustrated in FIG. 13, the absorption band of the plasmon filter 121A' shifts to a shorter wavelength side as the dot pitch P3 becomes narrower, and the absorption band of the plasmon filter 121A' shifts to a longer wavelength side as the dot pitch P3 becomes wider.

Note that, in any of the plasmon filters having the hole array structure and the dot array structure, the transmission band or the absorption band can be adjusted by simply adjusting the pitch in a planar direction of the holes or dots. Therefore, for example, the transmission band or the absorption band can be individually set for each pixel by simply adjusting the pitch of holes or dots in a lithography process, and multi-coloring of the filter can be implemented with fewer steps.

Furthermore, the thickness of the plasmon filter is about 100 to 500 nm, which is nearly similar to an organic material-based color filter, and process affinity is good.

Figure 14:
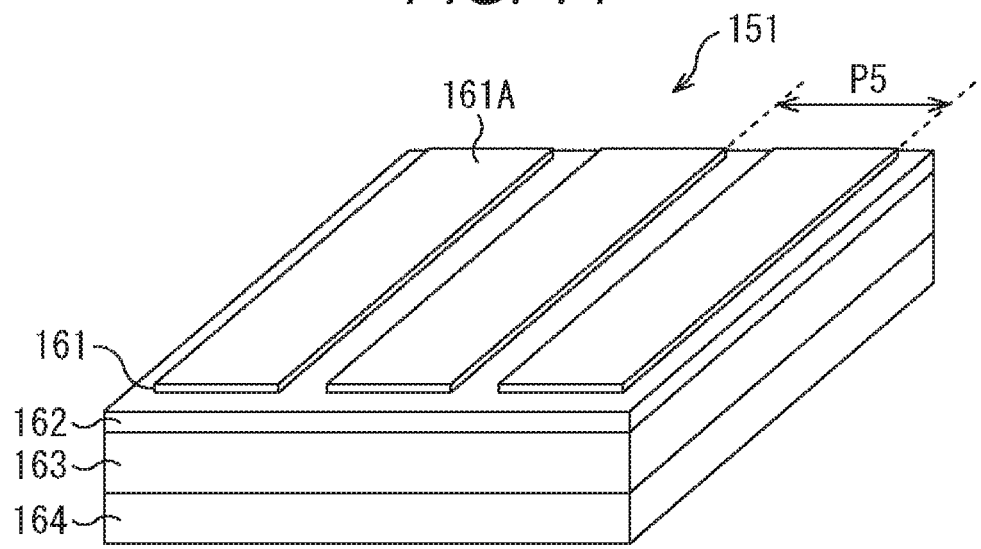
FIG. 14 is a view illustrating a configuration example of a plasmon filter using GMR.

Furthermore, a plasmon filter 151 using guided mode resonant (GMR) illustrated in FIG. 14 can be used as the narrow band filter NB.

In the plasmon filter 151, a conductive layer 161, a SiO2 film 162, a SiN film 163, and a SiO2 substrate 164 are stacked in order from the top. The conductive layer 161 is included in, for example, the narrow band filter layer 103 in FIG. 3, and the SiO2 film 162, the SiN film 163, and the SiO2 substrate 164 are included in, for example, the interlayer film 104 in FIG. 3.

On the conductive layer 161, rectangular conductive thin films 161A containing, for example, aluminum are arranged at a predetermined pitch P5 in such a manner that long sides of the conductive thin films 161A are adjacent to each other. Then, the transmission band of the plasmon filter 151 changes depending on the pitch P5 or the like.

Figure 15:
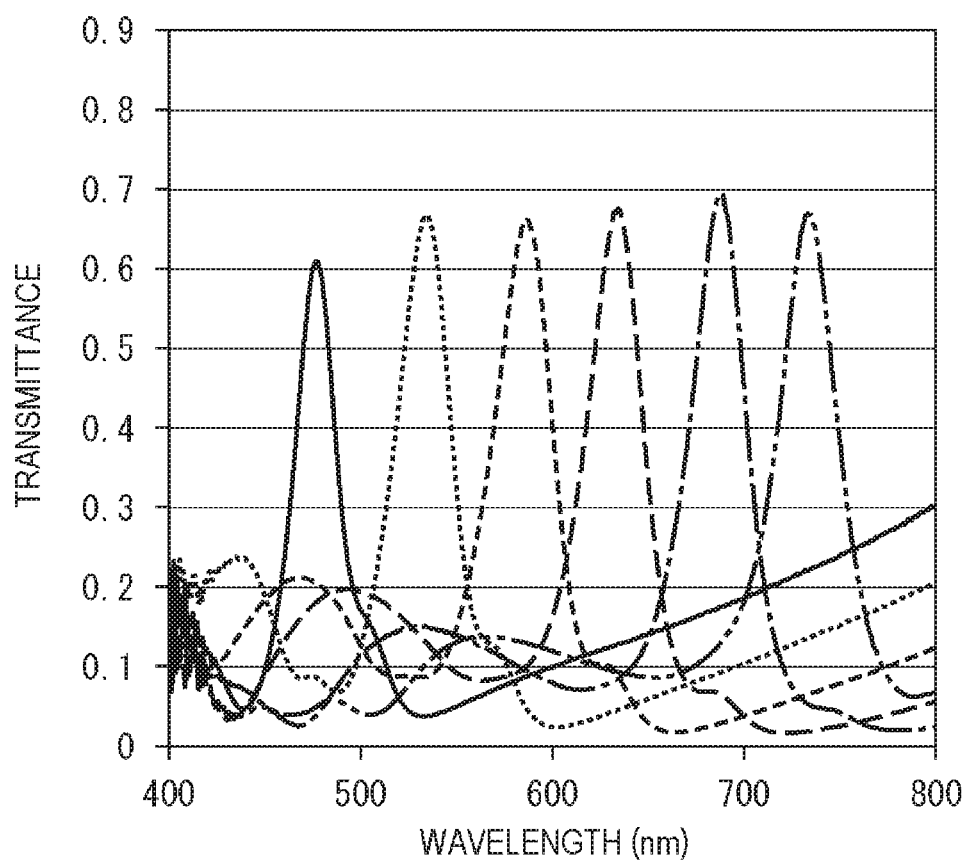
FIG. 15 is a graph illustrating an example of spectral characteristics of the plasmon filter using GMR.

FIG. 15 is a graph illustrating an example of spectral characteristics of the plasmon filter 151 in a case where the hole pitch P5 is changed. The horizontal axis of the graph represents the wavelength (the unit is nm), and the vertical axis represents the transmittance. This example illustrates an example of spectral characteristics in a case where the pitch P5 is changed into six types at intervals of 40 nm from 280 nm to 480 nm, and a slit width between the adjacent conductive thin films 161A is set to ¼ of the pitch P5. Furthermore, a waveform having the shortest peak wavelength of the transmission band represents the spectral characteristic of the case where the pitch P5 is set to 280 nm, and the peak wavelength becomes longer as the pitch P5 becomes wider. That is, the transmission band of the plasmon filter 151 shifts to a shorter wavelength side as the pitch P5 becomes narrower, and the transmission band of the plasmon filter 151 shifts to a longer wavelength side as the pitch P5 becomes wider.

The plasmon filter 151 using GMR also has good affinity for an organic material-based color filter, similarly to the above-described plasmon filters having the hole array structure and the dot array structure.

As the plasmon filter, for example, a filter having a shape called a bull's eye (hereinafter, referred to as a bullseye structure) can be applied, other than the hole array structure, the dot array structure, and the structure using GMR. The bullseye structure is a name given because the structure resembles a dart target or a bow and arrow target.

Figure 16A:
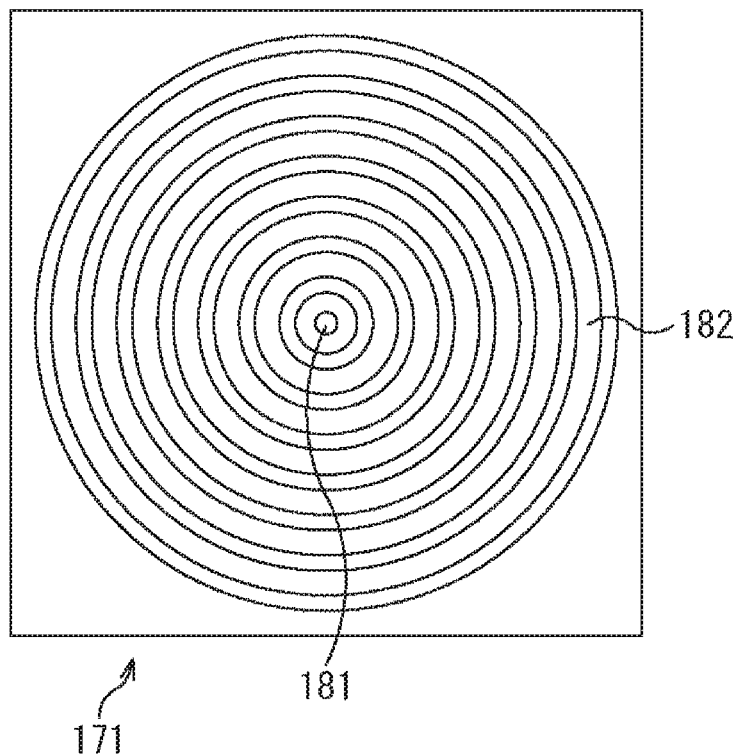
FIGS. 16A and 16B are view illustrating configuration examples of a plasmon filter having a bullseye structure.

As illustrated in FIG. 16A, a plasmon filter 171 having the bullseye structure has a through hole 181 in the center, and includes a plurality of protrusions 182 concentrically formed around the through hole 181. That is, the plasmon filter 171 having the bullseye structure has a shape to which a metal diffraction grating structure that causes plasmon resonance is applied.

The plasmon filter 171 having the bullseye structure has similar characteristics to the plasmon filter 151 using GMR. That is, in a case where the distance between the protrusions 182 is a pitch P6, the transmission band of the plasmon filter 171 shifts to a shorter wavelength side as the pitch P6 becomes narrower, and the transmission band of the plasmon filter 171 shifts to a longer wavelength side as the pitch P6 becomes wider.

As a filter that transmits light of a specific wavelength, there is a Fabry-Perot interferometer. A Fabry-Perot interferometer can be used as the narrow band filter to which the present technology is applied, instead of a plasmon filter.

Figure 17:
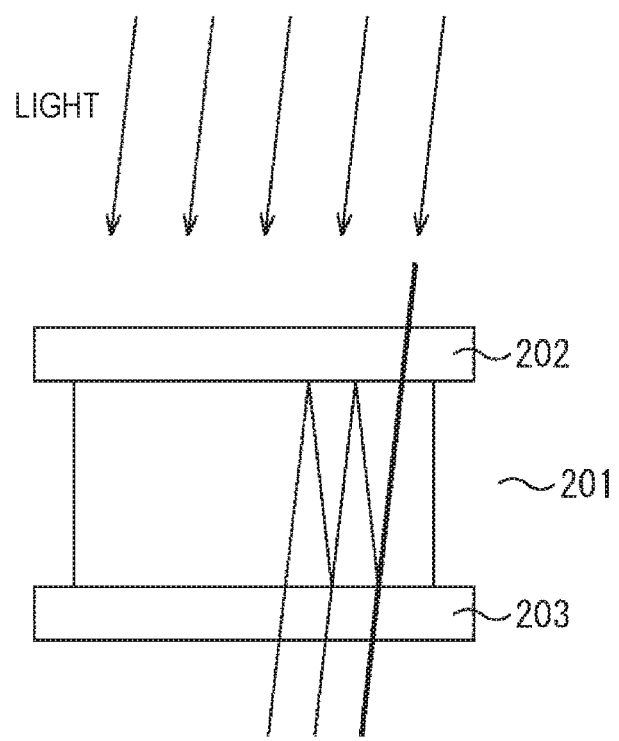
FIG. 17 is a view for describing a Fabry-Perot interferometer.

A Fabry-Perot interferometer 201 is an optical device including two semi-transparent mirrors 202 and 203, and having the two semi-transparent mirrors 202 and 203 arranged to face each other in parallel, as illustrated in FIG. 17. The semi-transparent mirrors 202 and 203 are finished with a reflective surface having high reflectance and slight transmittance.

Light incident on one side of the Fabry-Perot interferometers 201 (upper side in FIG. 17) reflects and reciprocates between the two reflective surfaces many times and interferes with each other. The light transmitted through the semi-transparent mirror 203 becomes interference light having a considerable length due to the light that has reciprocated many times with a certain optical path difference. Therefore, if the Fabry-Perot interferometer 201 is used as a spectroscope, a very high resolution can be obtained.

That is, a wavelength to be analyzed by the Fabry-Perot interferometer 201, of the incident light, can be selected by the Fabry-Perot interferometer 201, and the selected light can be received by the photodiode 61, similarly to the above-described plasmon filter 121 (151).

The examples of the narrow band filter NB applicable to an imaging device to which the present technology is applied include the above-described plasmon filters having, for example, the hole array structure, the dot array structure, the GMR, and the bullseye structure, and the Fabry-Perot interferometer.

The following description will be continuously given using the case where the narrow band filter NB is the plasmon filter 121 having the hole array structure unless otherwise specified. However, the plasmon filter having, for example, the dot array structure, the GMR, or the bullseye structure, or the Fabry-Perot interferometer can be applied, and the description will be continued on the assumption that the plasmon filter 121 can be appropriately replaced with the plasmon filter having, for example, the dot array structure, the GMR, or the bullseye structure, or the Fabry-Perot interferometer.

<Influence Due to Color Mixture>

When the narrow band light is detected using the plasmon filter 121, there is a possibility that a color mixture component other than a waveform of light to be detected is also detected, and characteristics are deteriorated. This possibility will be described with reference to FIG. 18. The following description will be given by reference to a more simplified configuration example of the pixel 51 than the configuration example illustrated in FIG. 3.

Figure 18:
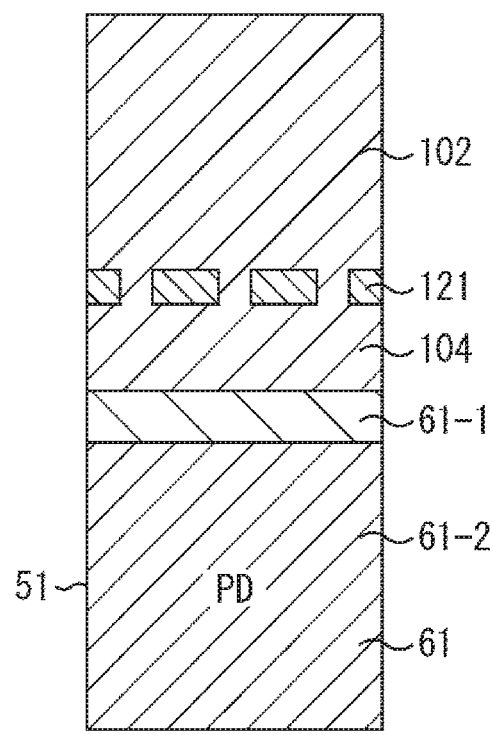
FIG. 18 is a view illustrating a configuration of a pixel including a plasmon filter.

In the pixel illustrated in FIG. 18, the interlayer film 102, the plasmon filter 121, the interlayer film 104, and the photodiode 61 are stacked in order from the top. The plasmon filter 121 configures the narrow band filter layer 103 in FIG. 3, and the photodiode 61 represents one photoelectric conversion element included in the photoelectric conversion element layer 105.

The photodiode 61 includes a P-type semiconductor region 61-1 and an N-type semiconductor region 61-2. Note that the P-type semiconductor region 61-1 may be formed to surround the N-type semiconductor region 61-2 although not illustrated in FIG. 18. The P-type semiconductor region 61-1 also serves as a hole charge storage region for suppressing dark current.

The following description will be continuously given using a case where the N-type semiconductor region 61-2 is a region of a main part of the photodiode 61, and a read charge is an electron, as an example. However, the present technology can be applied to a photodiode in which the region of a main part of the photodiode 61 is the P-type semiconductor region, and the read charge is a hole.

Figure 19:
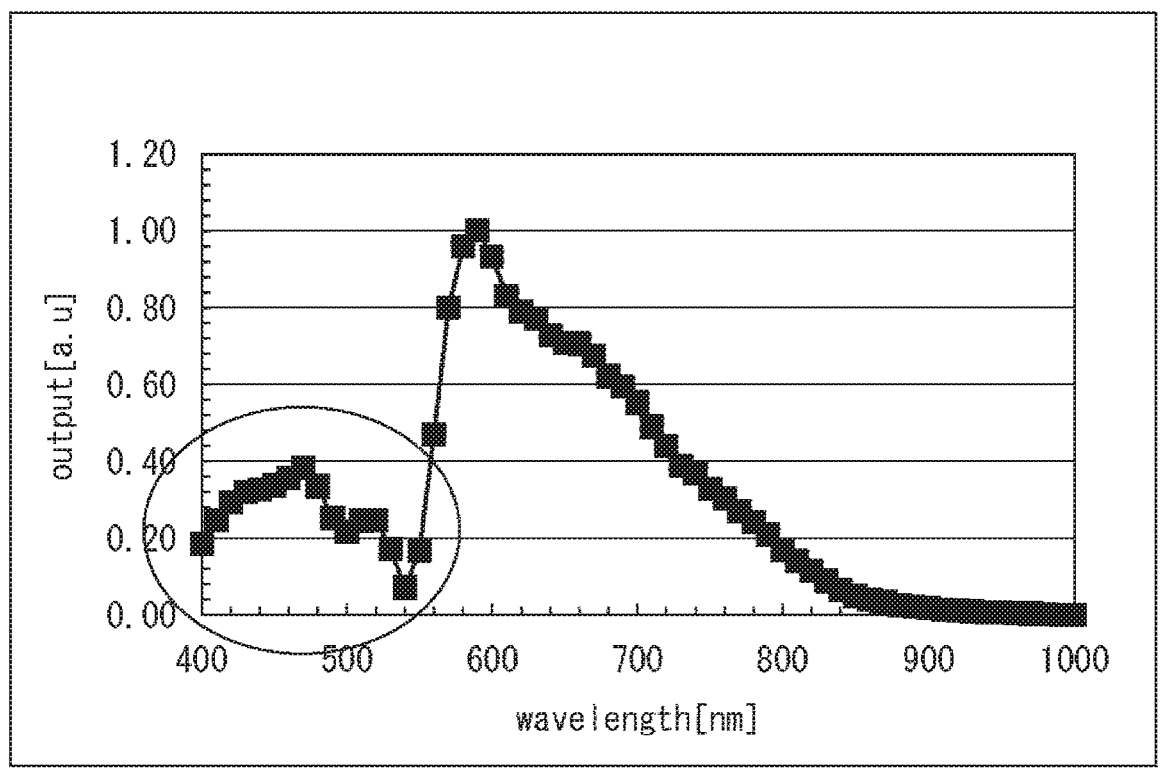
FIG. 19 is a graph for describing occurrence of color mixture.

A spectral characteristic example of when the pixel 51 illustrated in FIG. 18 has received light is illustrated in FIG. 19. In the spectral characteristic graph illustrated in FIG. 19, the horizontal axis represents the wavelength of the incident light, and the vertical axis represents an output value.

In a case where the plasmon filter 121 is designed as a filter that transmits light having a wavelength of about 600 nm, a graph having a peak at 600 nm is obtained as a graph of spectral characteristics, as illustrated as the graph in FIG. 19. It is favorable if the graph is diverged centered on the peak value. However, as illustrated in FIG. 19, occurrence of a color mixture component is read on the wavelength side shorter than 600 nm.

In the graph illustrated in FIG. 19, a portion surrounded by the circle indicates a portion where the color mixture component has occurred. As described above, according to the pixel 51 using the plasmon filter 121, there is a possibility of occurrence of the color mixture component. This color mixture component tends to more easily occur when the wavelength set as the wavelength of light to be transmitted through the plasmon filter 121 is on a long wavelength side. Since such a color mixture component becomes a cause of deterioration of the spectral characteristics, it is favorable to suppress the occurrence.

Furthermore, in a case of using the plasmon filter 121 in combination with the photodiode 61 formed on a silicon (Si) substrate, as illustrated in FIG. 18, it is necessary to consider spectral characteristics of silicon. That is, the influence of the color mixture component becomes large in a case where sensitivity of silicon with respect to the color mixture component is high. Therefore, in the case of using the plasmon filter 121 in combination with the photodiode 61 formed on a silicon (Si) substrate, it is necessary to further suppress the occurrence of the color mixture component.

The pixel 51 capable of suppressing the color mixture component will be described.

<Configuration of Pixel>

FIGS. 20A, 20B, 20C, and 20D are graphs and views illustrating configurations of an embodiment of the pixels 51 to which the present technology is applied. A pixel 51*a* illustrated in FIGS. 20A, 20B, 20C, and 20D has the photodiode 61 formed at a depth appropriate for the wavelength of light transmitted through the plasmon filter 121.

Graphs of spectral characteristics of the plasmon filters 121 are illustrated in the upper part in FIGS. 20A, 20B, 20C, and 20D, and the configurations of the pixels 51 of when the graphs of the spectral characteristics are obtained, that is, the configurations of the pixels 51 to which the present technology is applied, are illustrated in the lower part in FIGS. 20A, 20B, 20C, and 20D.

The configurations of the pixels 51 illustrated in the lower part in FIGS. 20A, 20B, 20C, and 20D are the same as the configuration of the pixel 51 illustrated in FIG. 18, but depths of the photodiodes 61 (the N-type semiconductor regions 61-2 configuring the photodiodes 61) are different.

Hereinafter, description of "the depth of the photodiode 61" will be used. The "depth of the photodiode 61" refers to the depth of the N-type semiconductor region 61-2 configuring the photodiode 61. Furthermore, the "depth of the photodiode 61" refers to a distance from an interface of the silicon substrate on which the photodiode 61 is formed (a boundary with respect to the interlayer film 104) to a position where a depletion layer spreads, and a region where the depletion layer spreads is the N-type semiconductor region 61-2.

The depth of the photodiode 61 can be the distance from the interface of the silicon substrate to the position where the depletion layer spreads, and can be the distance to the depletion layer, in this case, to the interface (upper end) of the N-type semiconductor region 61-2 or may be the distance to a center portion of the N-type semiconductor region 61-2. Here, the description will be continued using the distance to the interface of the N-type semiconductor region 61-2.

Note that, here, description will be continuously given by taking an example in which the N-type semiconductor region is a region of a main part of photoelectric conversion. However, it is possible to configure the pixel 51 such that the P-type semiconductor region is a region of a main part of photoelectric conversion. In the case of the pixel 51 where the P-type semiconductor region is the region of a main part of photoelectric conversion, the present technology can be applied by appropriately replacing the N-type semiconductor region with the P-type semiconductor region in the above and the following description.

Furthermore, the description will be continuously given by taking an example in which the depth of the photodiode 61 is a physical depth. However, as a method of changing the depth of the photodiode 61, it is also possible to perform channel cut or change the depth of a p+ region on the surface (impurity concentration profile) or change the depth of a well (impurity concentration profile). The depth of the photodiode 61 may be changed by such a method.

In FIGS. 20A, 20B, 20C, and 20D, description will be continued using the case of the hole array-type plasmon filter 121 as an example. However, as will be described below, the dot array-type plasmon filter 121, the plasmon filter 151 using GMR, the plasmon filter 171 having the bullseye structure, or the Fabry-Perot interferometer 201 can be used instead of the hole array-type plasmon filter 121. Even in this case, the present technology can be applied similarly to the case of using the hole array-type plasmon filter 121.

FIG. 20A illustrates a configuration of the pixel 51*a* in a case of using a plasmon filter 121*a* in which the wavelength of light transmitted through the plasmon filter 121*a* is set to 450 nm. In the pixel 51*a*, a photodiode 61*a* is formed at a position of a depth d1.

FIG. 20B illustrates a configuration of a pixel 51*b* in a case of using a plasmon filter 121*b* in which the wavelength of light transmitted through the plasmon filter 121*b* is set to 530 nm. In the pixel 51*b*, a photodiode 61*b* is formed at a position of a depth d2.

FIG. 20C illustrates a configuration of a pixel 51*c* in a case of using a plasmon filter 121*c* in which the wavelength of light transmitted through the plasmon filter 121*c* is set to 600 nm. In the pixel 51*c*, a photodiode 61*c* is formed at a position of a depth d3.

FIG. 20D illustrates a configuration of a pixel 51*d* in a case of using a plasmon filter 121*d* in which the wavelength of light transmitted through the plasmon filter 121*d* is set to 650 nm. In the pixel 51*d*, a photodiode 61*d* is formed at a position of a depth d4.

Referring to the pixels 51*a* to 51*d* illustrated in FIGS. 20A, 20B, 20C, and 20D, the depths at which the photodiodes 61 are formed are different. The depths of the pixels 51*a* to 51*d* are the depth d1, the depth d2, the depth d3, and the depth d4, respectively. The depths d1 to d4 satisfy the relationship of the depth d1<the depth d2<the depth d3<the depth d4.

The plasmon filters 121*a* to 121*d* are filters designed to most efficiently transmit the light having the wavelengths of 450 nm, 530 nm, 600 nm, and 650 nm, respectively. That is, the wavelength of the transmitted light shifts to a longer wavelength side in the order of the plasmon filter 121*a*, the plasmon filter 121*b*, the plasmon filter 121*c*, and the plasmon filter 121*d*.

When the wavelength of the light transmitted through the plasmon filter 121 shifts to the longer wavelength side, the depth of the photodiode 61 becomes deeper. The photodiode 61 is formed at the depth appropriate for the wavelength of light transmitted through the plasmon filter 121.

The photodiode 61 is formed on a silicon substrate. It is generally known that light having a longer wavelength and having entered a silicon substrate reaches a deeper position in the silicon substrate. Since, by using such a fact, the photodiode 61 is formed at the position that the light having the wavelength transmitted through the plasmon filter 121 reaches in the silicon substrate, the position where the photodiode 61 is formed is different according to the wavelength of the light transmitted through the plasmon filter 121.

Here, the depth of the photodiode 61 will be further described. Generally, in a case where light enters through a surface of a substance, light intensity I at a depth x from the surface becomes $I = I_0 e^{-\alpha x}$. $I_0$ represents the light intensity on the substance surface, and $\alpha$ represents the absorption coefficient.

The light is absorbed on the substance surface as the absorption coefficient $\alpha$ is larger, and the light penetrates the substance into a deeper position as the absorption coefficient $\alpha$ is smaller.

Figure 21:
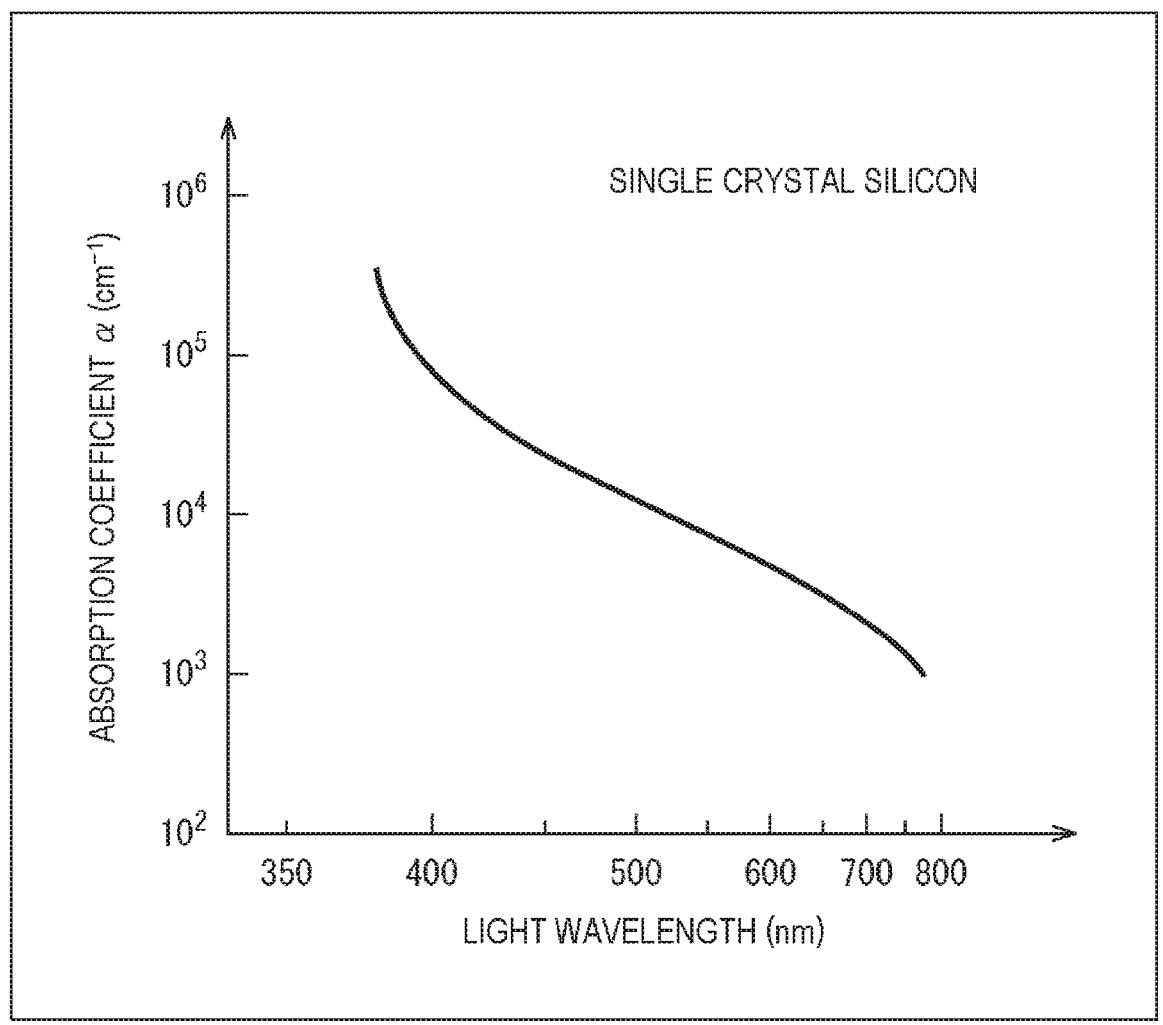
FIG. 21 is a graph for describing a way of setting a depth of a photodiode.

FIG. 21 illustrates a relationship between the absorption coefficient $\alpha$ of single crystal silicon and the wavelength of light. The horizontal axis of the graph illustrated in FIG. 21 represents the wavelength of light, and the vertical axis represents the absorption coefficient $\alpha$. It can be read from the graph in FIG. 21 that the absorption coefficient $\alpha$ changes according to the wavelength of light entering the single crystal silicon and is not constant. That is, it is understood that the absorption coefficient $\alpha$ greatly depends on the substance and the wavelength of the incident light.

Figure 22:
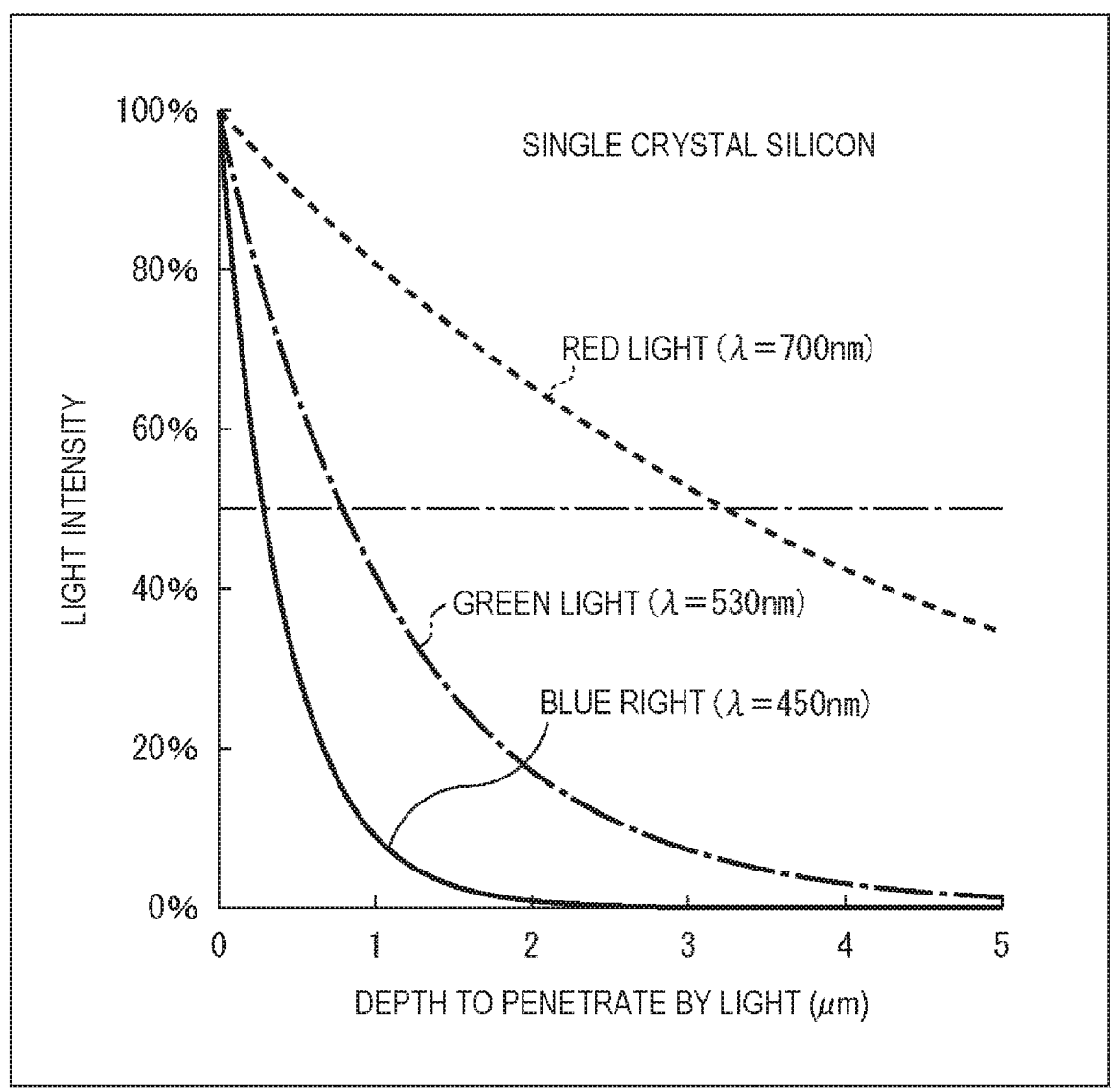
FIG. 22 is a graph for describing a way of setting a depth of a photodiode.

FIG. 22 illustrates a relationship between the light intensity and the penetration depth in the single crystal silicon. The horizontal axis of the graph illustrated in FIG. 22 represents the depth that light penetrates and the vertical axis represents the light intensity. Furthermore, FIG. 22 illustrates a graph of when blue light having the wavelength $\lambda = 450$ nm is incident, a graph of when green light having the wavelength λ=530 nm is incident, and a graph of when red light having the wavelength λ=700 nm is incident.

It can be read from the graph illustrated in FIG. 22 that the depth at which the light intensity becomes 50% (the portion illustrated by the one-dot chain line in FIG. 22), for example, that is, the depth at which $I/I_0=0.5$ is obtained, is 0.3 um in the case of blue light, 0.8 um in the case of green light, and 3.2 um in the case of red light. It can be read from the results that the blue light enters the silicon and is halved in intensity at a relatively shallow portion but the red light enters the silicon and is halved in intensity at a relatively deep portion.

For example, the sensitivity can be improved by forming the photodiode 61 on the silicon surface in the case of using the plasmon filter 121 that transmits the blue light. Meanwhile, when the photodiode 61 is formed at a deep position of the silicon, for example, at a position deeper than 0.3 um, the intensity becomes weak before the blue light reaches the photodiode 61, and the blue light reaching the photodiode 61 is reduced and the sensitivity decreases.

According to the above point, when the photodiode 61 is formed at a position suitable for the wavelength of light transmitted through the plasmon filter 121, the light can be efficiently received. However, when the photodiode 61 is formed at a position not suitable for the wavelength of light transmitted through the plasmon filter 121, the light cannot be efficiently received.

Furthermore, when the photodiode 61 is formed at the position suitable for the wavelength of light transmitted through the plasmon filter 121, the color mixture component can be reduced.

The depth of the photodiode 61 is set in consideration of the above points. An example of a way of setting the depth of the photodiode 61 will be described.

The depth of the photodiode 61 (=an upper end position of the N-type semiconductor region 61-1) suitable for the wavelength of light transmitted through the plasmon filter 121 is set to (an upper end depth of the photodiode)=(the penetration depth of light to be cut). The light to be cut can be, for example, light that may be detected as a color mixture component.

In a case where the wavelength to be cut by the plasmon filter 121 is wavelength λcutoff, λcutoff=(a peak transmission wavelength of the plasmon filter)−(a target half width of the plasmon filter/2)

can be expressed.

From the above, (the upper end depth of the photodiode)=(the penetration depth at a wavelength λcutoff)

is obtained.

In a case of designing a filter having the peak transmission wavelength of the plasmon filter 121 of 580 nm and the half width of 100 nm, for example, the wavelength to be cut by the plasmon filter 121 is λcutoff=580−(100/2)=530 nm.

Then, the penetration depth at 530 nm can be read as 0.8 um as the depth at which the light intensity becomes 50% from the graph of the green light (λ=530 nm) in FIG. 22. Therefore, in the case of using the plasmon filter 121 having the peak transmission wavelength of 580 nm and the half width of 100 nm, the depth of the photodiode 61 is simply set to 0.8 um.

Furthermore, as another example, in a case of designing a filter having the peak transmission wavelength of the plasmon filter 121 of 475 nm and the half width of 50 nm, for example, the wavelength to be cut by the plasmon filter 121 is λcutoff=475−(50/2)=450 nm.

Then, the penetration depth at 450 nm can be read as 0.3 um as the depth at which the light intensity becomes 50% from the graph of the blue light (λ=450 nm) in FIG. 22. Therefore, in these of using the plasmon filter 121 having the peak transmission wavelength of 475 nm and the half width of 50 nm, the depth of the photodiode 61 is simply set to 0.3 um.

Figure 23:
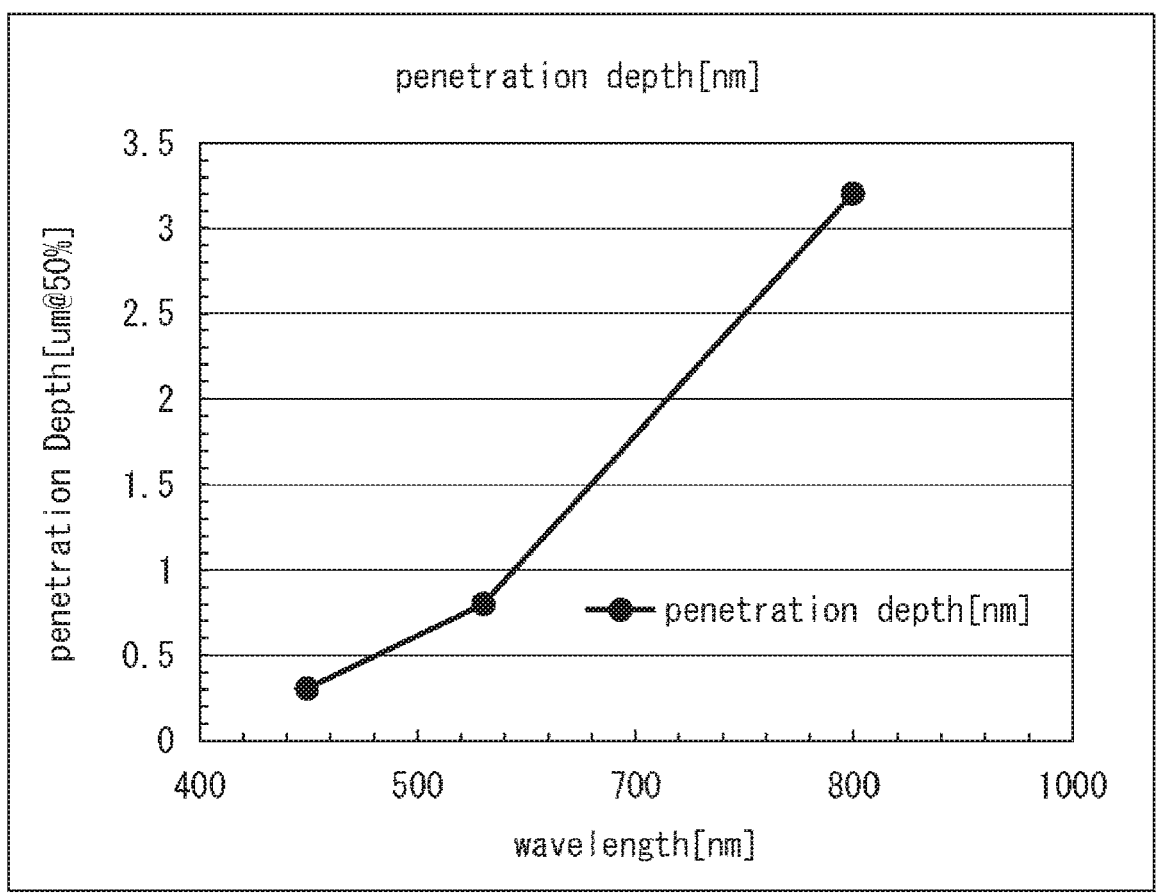
FIG. 23 is a graph for describing a way of setting a depth of a photodiode.

An example of a result of such calculation is illustrated in FIG. 23. The horizontal axis of the graph illustrated in FIG. 23 represents the wavelength, and the vertical axis represents the depth (the upper end position) of the photodiode 61 at which the light intensity becomes 50%. Such a graph is created, and the upper end depth of the photodiode 61 can be set on the basis of the graph.

Referring again to the pixels 51a to 51d illustrated in FIGS. 20A, 20B, 20C, and 20D, the depth d1 of the pixel 51a, the depth d2 of the pixel 51b, the depth d3 of the pixel 51c, and the depth d4 of the pixel 51d are respectively set to the depths in accordance with the respective transmission wavelengths of the plasmon filters 121a to 121d, for example, using the graph illustrated in FIG. 23.

When the peak transmission wavelength of the plasmon filter 121 shifts to the longer wavelength side, as illustrated in FIG. 23, the depth of the photodiode 61 becomes deeper, and the configurations of the pixels 51a to 51d illustrated in FIGS. 20A 20B, 20C, and 20D are obtained.

<Case of Applying Hole Array-Type Plasmon Filter>

In the case of applying the hole array-type plasmon filter 121 as the plasmon filter 121, the pitch of the holes 132 and the depth of the photodiode 61 have the relationship as illustrated in FIGS. 24A, 24B, 24C, and 24D.

The upper views in FIGS. 24A, 24B, 24C, and 24D are views of when the plasmon filter 121 is viewed from an upper surface (light incident side), and the lower views illustrate configurations of pixels 51, as in the lower views in FIGS. 20A, 20B, 20C, and 20D. FIG. 24A illustrates a configuration of the pixel 51a in a case of using a plasmon filter 121a in which the pitch of the plasmon filter 121a is set to 250 nm. In the pixel 51a, a photodiode 61a is formed at a position of a depth d1.

FIG. 24B illustrates a configuration of the pixel 51b in a case of using a plasmon filter 121b in which the pitch of the plasmon filter 121b is set to 350 nm. In the pixel 51b, a photodiode 61b is formed at a position of a depth d2.

FIG. 24C illustrates a configuration of the pixel 51c in a case of using a plasmon filter 121c in which the pitch of the plasmon filter 121c is set to 450 nm. In the pixel 51c, a photodiode 61c is formed at a position of a depth d3.

FIG. 24D illustrates a configuration of the pixel 51d in a case of using a plasmon filter 121d in which the pitch of the plasmon filter 121d is set to 550 nm. In the pixel 51d, a photodiode 61d is formed at a position of a depth d4.

Since the hole array-type plasmon filter 121 has been described with reference to FIGS. 4 to 9, detailed description is omitted. The transmission wavelength becomes longer as the pitch of the holes 132 is larger.

For example, in the case of the plasmon filter 121a having the pitch of 250 nm illustrated in FIG. 24A, the plasmon filter 121a functions as a filter that mainly transmits light of the blue wavelength band. Furthermore, in the case of the plasmon filter 121d having the pitch of 550 nm illustrated in FIG. 24D, the plasmon filter 121d functions as a filter that mainly transmits light of the red wavelength band.

In the case of using the hole array-type plasmon filter 121, there is a relationship that the depth of the photodiode 61 becomes deeper as the pitch between the holes 132 of the plasmon filter 121 becomes larger.

As a characteristic of the plasmon filter 121, the transmission wavelength changes when the interval (pitch) of the holes 132 is changed. Therefore, the photodiode 61 is formed at a depth at which the transmission wavelength is most absorbed by silicon. Furthermore, as a characteristic of the plasmon filter 121, the transmission wavelength shifts to the longer wavelength side as the interval (pitch) of the holes 132 is made longer. Therefore, the photodiode 61 in the silicon substrate is formed to increase the depth in accordance with such a characteristic.

As the plasmon filter 121, the dot array-type plasmon filter 121 can be applied. The dot array-type plasmon filter 121 is a filter that absorbs light having a predetermined wavelength band and is used as a complementary color filter, as described with reference to FIGS. 12A, 12B, and 13. The wavelength band of light absorbed by the dot array-type plasmon filter 121 changes depending on the pitch between adjacent dots 133 or the like.

In the dot array-type plasmon filter 121, the absorption band of the plasmon filter 121 shifts to a shorter wavelength side as the dot pitch between the dots 133 becomes narrower, and the absorption band of the plasmon filter 121 shifts to a longer wavelength side as the pitch between the dots 133 becomes wider.

Since the dot array-type plasmon filter 121 is a filter that absorbs light having a predetermined wavelength band, the photodiode 61 may be formed in a region having a depth other than the depth in accordance with the predetermined wavelength band, instead of being formed at the depth in accordance with the predetermined wavelength band. The pixel 51 in this case will be described below.

<Case of GMR Plasmon Filter>

In the case of applying the plasmon filter 151 using GMR as the plasmon filter, the interval of the conductive thin film 161 (hereinafter described as slit interval) and the depth of the photodiode 61 have the relationship as illustrated in FIGS. 25A 25B, 25C, and 25D.

The upper views in FIGS. 25A, 25B, 25C, and 25D are views of when the plasmon filter 151 is viewed from an upper surface (light incident side), and the lower views illustrate configurations of pixels 51, as in the lower views in FIGS. 20A, 20B, 20C, and 20D. FIG. 25A illustrates a configuration of the pixel 51a in a case of using a plasmon filter 151a in which the slit interval of the plasmon filter 151a is set to 250 nm. In the pixel 51a, a photodiode 61a is formed at a position of a depth d1.

FIG. 25B illustrates a configuration of the pixel 51b in a case of using a plasmon filter 151b in which the slit interval of the plasmon filter 151b is set to 300 nm. In the pixel 51b, a photodiode 61b is formed at a position of a depth d2.

FIG. 25C illustrates a configuration of the pixel 51c in a case of using a plasmon filter 151c in which the slit interval of the plasmon filter 151c is set to 350 nm. In the pixel 51c, a photodiode 61c is formed at a position of a depth d3.

FIG. 25D illustrates a configuration of the pixel 51d in a case of using a plasmon filter 151d in which the slit interval of the plasmon filter 151d is set to 400 nm. In the pixel 51d, a photodiode 61d is formed at a position of a depth d4.

Since the GMR plasmon filter 151 has been described with reference to FIGS. 14 and 15, detailed description is omitted. The transmission wavelength becomes longer as the slit interval of the conductive thin film 161 is larger.

For example, in the case of the plasmon filter 151a having the slit interval of 250 nm illustrated in FIG. 25A, the plasmon filter 151a functions as a filter that mainly transmits light of the blue wavelength band. Furthermore, in the case of the plasmon filter 151d having the slit interval of 400 nm illustrated in FIG. 25D, the plasmon filter 151d functions as a filter that mainly transmits light of the red wavelength band.

In the case of using the GMR plasmon filter 151, there is a relationship that the depth of the photodiode 61 becomes deeper as the slit interval between the conductive thin films 161 of the plasmon filter 151 becomes larger.

As a characteristic of the plasmon filter 151, the transmission wavelength changes when the interval (slit interval) of the conductive thin film 161 is changed. Therefore, the photodiode 61 is formed at a depth at which the transmission wavelength is most absorbed by silicon. Furthermore, as a characteristic of the plasmon filter 151, the transmission wavelength shifts to the longer wavelength side as the interval (slit interval) of the conductive thin film 161 is made longer. Therefore, the photodiode 61 in the silicon substrate is formed to increase the depth in accordance with such a characteristic.

Figure 16B:
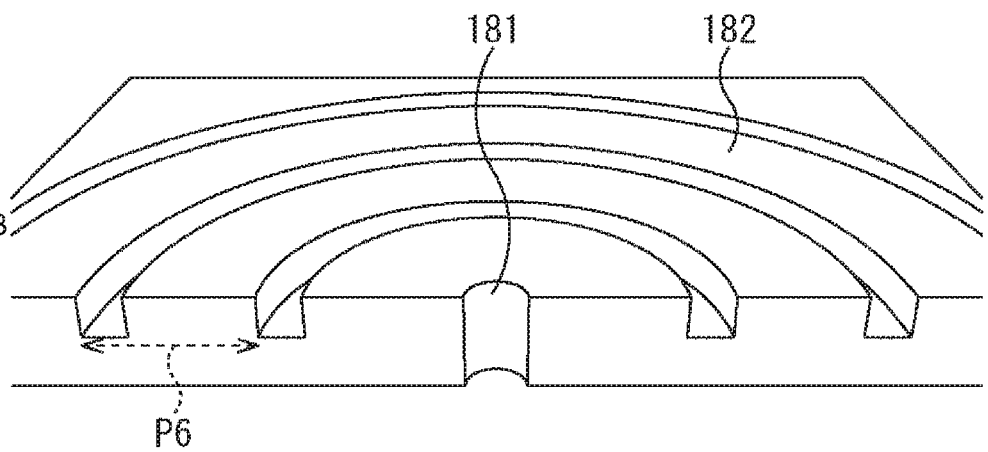

The plasmon filter 171 having the bullseye structure illustrated in FIGS. 16A and 16B can be used instead of the plasmon filter 121 or the plasmon filter 151 described above. As the narrow band filter applicable to the present technology, a filter using plasmon resonance can be used, and a filter other than the above-described filters can be applied as long as the filter uses plasmon resonance.

<Case of Applying Fabry-Perot Interferometer>

Moreover, as will be described below, the Fabry-Perot interferometer 201 that transmits light in a predetermined frequency band can be applied as the narrow band filter. That is, a wavelength selection filter can be applied to the present technology, and a filter (interferometer) called Fabry-Perot or etalon can be applied. Here, description of a Fabry-Perot filter will be used as an example (collective term) of these wavelength selection filters.

As described with reference to FIG. 17, the Fabry-Perot interferometer 201 is an optical device in which two semi-transparent mirrors 202 and 203 are arranged to face each other in parallel, and is a device that causes lights to reflect and reciprocate between the two reflective surfaces many times and interfere with each other to output interference light of light having a predetermined wavelength.

In the case of applying the Fabry-Perot interferometer 201 instead of the plasmon filter, the light split by the Fabry-Perot interferometer 201 and output and the depth of the photodiode 61 have the relationship illustrated in FIGS. 26A, 26B, 26C, and 26D.

Graphs of spectral characteristics of the Fabry-Perot interferometers 201 are illustrated in the upper part in FIGS. 26A, 26B, 26C, and 26D, and the configurations of the pixels 51 of when such graphs of spectral characteristics are obtained, that is, the configurations of the pixels 51 to which the present technology is applied, are illustrated in the lower part in FIGS. 26A, 26B, 26C, and 26D. In the Fabry-Perot interferometer 201, a selected wavelength is different depending on the interval between the two semi-transparent mirrors 202 and 203, the refractive index of the substance added between the two semi-transparent mirrors 202 and 203, and the like, and thus the same thickness (shape) is illustrated in the lower part in FIGS. 26A, 26B, 26C, and 26D.

FIG. 26A illustrates a configuration of the pixel 51a in a case of using a Fabry-Perot interferometer 201a in which 450 nm is set as the wavelength of light selected by the Fabry-Perot interferometer 201a. In the pixel 51a, a photodiode 61a is formed at a position of a depth d1.

FIG. 26B illustrates a configuration of the pixel 51b in a case of using a Fabry-Perot interferometer 201b in which 530 nm is set as the wavelength of light selected by the Fabry-Perot interferometer 201b. In the pixel 51b, a photodiode 61b is formed at a position of a depth d2.

FIG. 26C illustrates a configuration of the pixel 51c in a case of using a Fabry-Perot interferometer 201c in which 600 nm is set as the wavelength of light selected by the Fabry-Perot interferometer 201c. In the pixel 51c, a photodiode 61c is formed at a position of a depth d3.

FIG. 26D illustrates a configuration of the pixel 51d in a case of using a Fabry-Perot interferometer 201d in which 650 nm is set as the wavelength of light selected by the Fabry-Perot interferometer 201d. In the pixel 51d, a photodiode 61d is formed at a position of a depth d4.

Referring to the pixels 51a to 51d illustrated in FIGS. 26A, 26B, 26C, and 26D, the depths at which the photodiodes 61 are formed are different. The depths of the pixels 51a to 51d are the depth d1, the depth d2, the depth d3, and the depth d4, respectively. The depths d1 to d4 satisfy the relationship of the depth d1<the depth d2<the depth d3<the depth d4.

The Fabry-Perot interferometers 201a to 121d are filters designed to most efficiently transmit the light having the wavelengths of 450 nm, 530 nm, 600 nm, and 650 nm, respectively. That is, the wavelength of the transmitted light shifts to a longer wavelength side in the order of the Fabry-Perot interferometer 201a, the Fabry-Perot interferometer 201b, the Fabry-Perot interferometer 201c, and the Fabry-Perot interferometer 201d.

When the wavelength of the light transmitted through the Fabry-Perot interferometer 201 shifts to the longer wavelength side, the depth of the photodiode 61 becomes deeper. The photodiode 61 is formed at the depth appropriate for the wavelength of light transmitted through the plasmon filter 121.

As described above, the photodiode 61 is formed at the depth where silicon most absorbs the wavelength selected by the Fabry-Perot interferometer 201.

<Configuration Including Drain>

As described above, the photodiode 61 is formed at the depth at which the photodiode 61 can efficiently receive the light filtered by the narrow band filter. Referring again to FIG. 26D, since the photodiode 61d of the pixel 51d is formed at the deep position in the silicon substrate, there is a region where the photodiode 61 is not formed from the photodiode 61d to the interface of the silicon substrate.

There is a possibility that charges are stored in the region where the photodiode 61 is not formed, and the possibility becomes higher as the region is larger. Therefore, as illustrated in FIGS. 27A, 27B, 27C, 27D, 28A, 28B, 28C, 28D, 29A, 29B, 29C, and 29D, a drain region for discharging charges may be formed in the pixel 51.

The pixels 51a to 51d illustrated in FIGS. 27A, 27B, 27C, and 27D have similar configurations to the pixels 51a to 51d illustrated in the lower views in FIGS. 20A 20B, 20C, and 20D, and the photodiodes 61a to 61d are formed at the positions of the depths d1 to d4, respectively.

Figure 27D:
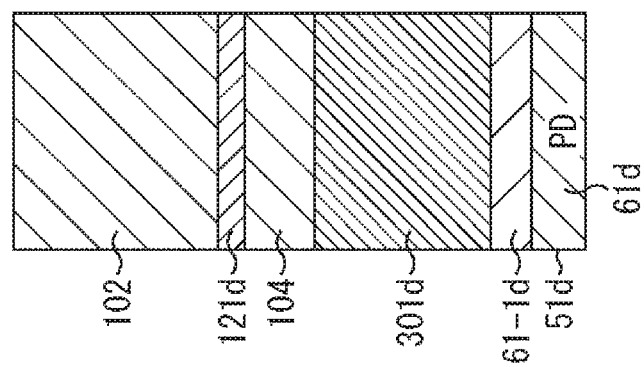
FIGS. 27A, 27B, 27C, and 27D are views for describing a pixel including a drain.
Figure 27C:
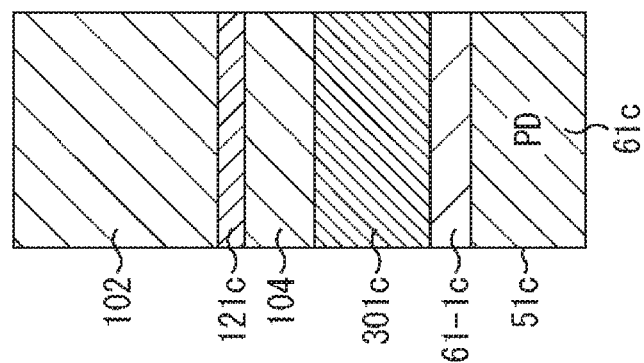
Figure 27B:
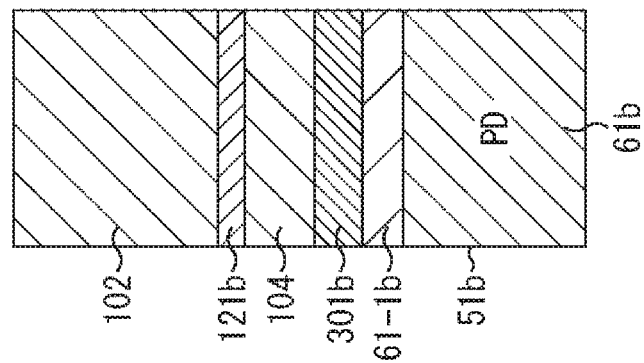

In the pixel 51b illustrated in FIG. 27B, a drain 301b is formed above the region where the photodiode 61b is formed in the silicon substrate and near the interface of the silicon substrate. In a case where the main part of photoelectric conversion is formed using an N-type semiconductor region, the drain 301b is an N-type diffusion layer. In this case, a P-type semiconductor region 61-1b is formed below the drain 301b that is the N-type diffusion layer, and the N-type semiconductor region 61-2 (photodiode 61b) is formed below the P-type semiconductor region 61-1b.

Note that, in a case where the main part of photoelectric conversion is formed using a P-type semiconductor region, the drain 301b is a P-type diffusion layer. Hereinafter, the description will be continued using the case of the drain 301 that is an N-type diffusion layer as an example. Furthermore, the configuration in which the P-type semiconductor region 61-1 is formed below the drain 301 that is the N-type diffusion layer, and the N-type semiconductor region 61-2 (photodiode 61) is formed below the P-type semiconductor region 61-1 is similar in the description below. Therefore, description will be appropriately omitted.

In the pixel 51c illustrated in FIG. 27C, a drain 301c is formed above the region where the photodiode 61c is formed in the silicon substrate and near the interface of the silicon substrate. The drain 301c is formed larger than the drain 301b. The drain 301 may be formed in the silicon substrate to have a size similar to the region where the photodiode 61 is not formed or may be formed in a part of the region where the photodiode 61 is not formed.

In the pixel 51d illustrated in FIG. 27D, a drain 301d is formed above the region where the photodiode 61d is formed in the silicon substrate and near the interface of the silicon substrate. As described above, the drain 301 is formed in the region where the photodiode 61 is not formed in the silicon substrate.

Figure 27A:
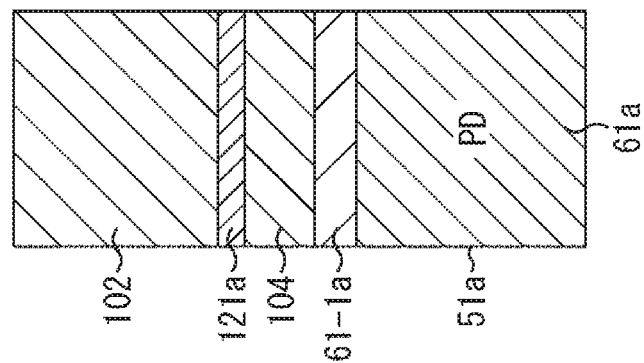

In the pixel 51a illustrated in FIG. 27A, a drain is not formed because the region where the photodiode 61c is not formed in the silicon substrate is small or the P-type semiconductor region 61-1 is formed up to near the interface.

In the above-described embodiment, the description has been made such that the upper end of the photodiode 61 is located at the depth from the interface of the silicon substrate, the depth being suitable for the wavelength of light transmitted through the narrow band filter, but no description has been made about a position of a lower end of the photodiode 61. Therefore, the size of the photodiode 61 differs for each pixel 51, as illustrated in FIGS. 27A, 27B, 27C, and 27D.

As illustrated in FIGS. 28A, 28B, 28C, and 28D, the photodiode 61 of the pixel 51 may be formed such that the size of the photodiode 61 is made uniform, and the upper end is located at a depth from the interface of the silicon substrate, the depth being suitable for the wavelength of light transmitted through the narrow band filter. Moreover, FIGS. 28A, 28B, 28C, and 28D illustrate a case where a drain 301 is formed.

The pixel 51a illustrated in FIG. 28A has a configuration in which a photodiode 61a is formed on an upper side in the silicon substrate and is not formed on a lower side. A drain 301a is formed in the region where the photodiode 61a is not formed below the photodiode 61a.

For example, referring again to the pixel 51a illustrated in FIG. 27A, in the case where the photodiode 61a is formed from near the upper interface to near the lower interface of the silicon substrate, as in the pixel 51a illustrated in FIG. 27A, the photodiode 61a is formed at the position suitable for receiving light having a short wavelength. Further, the photodiode 61a is also formed at a position suitable for receiving light having a long wavelength.

When considering receiving light having a short wavelength, the performance does not deteriorate even if the photodiode 61*a* formed at the position for receiving light having a long wavelength is not formed. Furthermore, when considering receiving light having a short wavelength, the photodiode 61*a* receives light on a long wavelength side and the light on the long wavelength side may be mixed due to the formation of the photodiode 61*a* formed at the position for receiving light having a long wavelength.

Therefore, the photodiode 61 may be formed to have a predetermined size from a position where light transmitted through the narrow band filter can be efficiently received. This example is illustrated in FIGS. 28A, 28B, 28C, and 28D.

Returning to the description with reference to FIGS. 28A, 28B, 28C, and 28D. In the pixel 51*b* illustrated in FIG. 28B, a drain 301*b*-1 is formed above the region where the photodiode 61*b* is formed in the silicon substrate and near the interface of the silicon substrate, and a drain 301*b*-2 is formed from a lower end of the photodiode 61*b* to near the interface of the lower end of the silicon substrate. As described above, the drains 301 may be formed above and below the photodiode 61.

In the pixel 51*c* illustrated in FIG. 28C, a drain 301*c*-1 is formed above the region where the photodiode 61*c* is formed in the silicon substrate and near the interface of the silicon substrate, and a drain 301*c*-2 is formed from a lower end of the photodiode 61*b* to near the interface of the lower end of the silicon substrate.

In the pixel 51*d* illustrated in FIG. 28D, a drain 301*d* is formed above the region where the photodiode 61*d* is formed in the silicon substrate and near the interface of the silicon substrate. As described above, the drain 301 is formed in the region where the photodiode 61 is not formed in the silicon substrate.

When the drain 301 is configured as illustrated in FIGS. 28A, 28B, 28C, and 28D, the configuration can be easily combined with a vertical transistor to be described below.

The positions, sizes, shapes, and the like of the drain 301 illustrated in FIGS. 27A, 27B, 27C, 27D, 28A, 28B, 28C, and 28D are examples and are not description that limits the drain 301. The drain 301 is only required to be formed at the position, size, and shape where the charges stored in a region other than the photodiode 61 can be discharged.

The drain 301 is connected to a power supply and is configured to discharge stored charges at predetermined timing. The drain 301 and the power supply may be connected in any manner. For example, the drain 301 may be connected on a front surface side (wiring layer 106 side) for each pixel 51 or may be connected on a back surface side (incident surface side). Furthermore, all of the pixels 51 arranged in the pixel array unit 31 (FIG. 2) may be individually connected to the power supply, or may be connected to the power supply in a thinning manner, or only pixels 51 arranged near an outer periphery may be connected to the power supply.

Furthermore, impurity concentration of the drain 301 may be constant or may have a gradient. FIGS. 29A, 29B, 29C, and 29D illustrate configurations of the pixel 51 in a case where the drain 301 has a gradient in the impurity concentration. Description will be given using the case where the pixel 51 in FIGS. 29A, 29B, 29C, and 29D has a similar configuration to the pixel 51 in FIGS. 28A, 28B, 28C, and 28D as an example. However, the pixel 51 in FIGS. 29A, 29B, 29C, and 29D may have a similar configuration to the pixel 51 in FIGS. 27A, 27B, 27C, and 27D.

A concentration gradient is provided in the drain 301*a* of the pixel 51*a* illustrated in FIG. 29A. The concentration gradient of the drain 301*a* is a gradient in which the concentration on a side close to the photodiode 61*a* is thin, and the concentration increases toward a distant side (wiring layer 106 side).

Concentration gradients are provided in the drain 301*b*-1 and the drain 301*b*-2 of the pixel 51*b* illustrated in FIG. 29B. The concentration gradient of the drain 301*b*-1 is a gradient in which the concentration on a side closer to the photodiode 61*b* is thin, and the concentration increases toward a distant side (wiring layer 106 side). Furthermore, the concentration gradient of the drain 301*b*-2 is a gradient in which the concentration on a side closer to the photodiode 61*b* is thin, and the concentration increases toward a distant side (wiring layer 106 side).

Concentration gradients are provided in the drain 301*c*-1 and the drain 301*c*-2 of the pixel 51*c* illustrated in FIG. 29C. The concentration gradient of the drain 301*c*-1 is a gradient in which the concentration on a side closer to the photodiode 61*c* is thin, and the concentration increases toward a distant side (wiring layer 106 side). Furthermore, the concentration gradient of the drain 301*c*-2 is a gradient in which the concentration on a side closer to the photodiode 61*c* is thin, and the concentration increases toward a distant side (wiring layer 106 side).

A concentration gradient is provided in the drain 301*d* of the pixel 51*d* illustrated in FIG. 29D. The concentration gradient of the drain 301*d* is a gradient in which the concentration on a side closer to the photodiode 61*d* is thin, and the concentration increases toward a distant side (interlayer film 104 side).

As described above, the impurity concentration of the drain 301 is provided with a gradient that gradually increases from the side close to the photodiode 61. As described above, by giving a gradient to the impurity concentration of the drain 301, generated charges can easily flow to the drain 301, and unnecessary charges can be efficiently discharged.

Note that the gradients of the impurity concentration of the drain 301 illustrated in FIGS. 29A, 29B, 29C, and 29D are examples, and other concentration gradients may be adopted.

<Pixel Arrangement in Pixel Array Unit>

As described above, the photodiode 61 is formed at the position suitable for the wavelength of light transmitted through the narrow band filter (hereinafter, the plasmon filter 121 is taken as an example). The pixel array unit 31 (FIG. 2) can be configured such that the pixels 51 having the same plasmon filter 121 arranged are arranged, or the pixels 51 having different plasmon filters 121 arranged are arranged.

FIG. 30 illustrates the case where the pixels 51 having the same plasmon filter 121 arranged are arranged. The example in FIG. 30 illustrates a part of the pixel array unit 31 in a case where the pixels 51*b* illustrated in FIG. 20B, which are pixels of one type, are arranged.

The plasmon filters 121 arranged in pixels 51-1 to 51-4 are filters having the same transmission wavelength. Furthermore, the photodiodes 61*b* formed in the pixels 51-1 to 51-4 are formed such that the upper ends are located at the same depth from the interface of the silicon substrate.

With such a configuration, the imaging device 10 (FIG. 1) including the pixel array unit 31 suitable for receiving light of one type of transmission wavelength of the plasmon filter 121 can be obtained. For example, such a configuration can be applied to the imaging device 10 that receives infrared light, the imaging device 10 that captures a monochrome image, or the like.

FIG. 31 illustrates the case where the pixels 51 having different plasmon filters 121 arranged are arranged. The example in FIG. 31 illustrates a part of the pixel array unit 31 in a case where four types of pixels of the pixels 51a to 51d illustrated in FIG. 20B are arranged.

The plasmon filters 121 arranged in the pixels 51-1 to 51-4 are filters having different transmission wavelengths. Furthermore, the photodiodes 61a to 61d formed in the pixels 51-1 to 51-4 are formed such that the upper ends are located at different depths from the interface of the silicon substrate.

With such a configuration, the imaging device 10 (FIG. 1) including the pixel array unit 31 suitable for receiving lights of four types of transmission wavelengths of the plasmon filters 121 can be obtained. For example, such a configuration can be applied to the imaging device 10 that captures a color image.

<Manufacturing Process>

A manufacturing process when manufacturing the pixel array unit 31 illustrated in FIG. 30 or 31 will be described.

A case where the pixel 51 is configured from a back surface side will be described with reference to FIGS. 32 and 33. The back surface side is a side serving as an incident surface side in the photodiode 61 of the pixel 51.

In step S11, the photodiode 61 is formed on a silicon substrate 321 and the wiring layer 106 is stacked. The photodiode 61 formed in step S11 is not yet located at a predetermined depth, and is formed to be larger than a finally formed size.

In step S12, the photodiode 61 is formed, the substrate on which the wiring layer 106 is stacked is turned upside down, and a support substrate 322 is stacked on the wiring layer 106. Note that the support substrate 322 may be a circuit substrate on which a logic circuit, a memory, and the like are formed.

In step S13, the silicon substrate 321 on which the photodiode 61 is formed is polished to a desired film thickness.

In step S14, a through oxide film 323 for ion implantation is formed on a polished side of the silicon substrate 321.

In step S15 (FIG. 33), ion implantation is performed, so that the position of the upper end of the photodiode 61 is lowered to the desired depth. In the case where the upper ends of the photodiodes 61 are formed at the same depth as in the pixel array unit 31 illustrated in FIG. 30, the same ion implantation is performed for all the pixels 51, so that the positions of the upper ends of the photodiodes 61 are adjusted.

In the case where the photodiode 61 is N type, this position adjustment is performed by ion-implanting a P-type impurity such as Boron to cancel the already formed N-type region.

In the case where the upper ends of the photodiodes 61 are formed at different depths as in the pixel array unit 31 illustrated in FIG. 31, appropriate ion implantation is performed for each pixel 51 as illustrated in step S15' (FIG. 33), so that the positions of the upper ends of the photodiodes 61 are adjusted.

In the case where the photodiode 61 is N type, this position adjustment is performed by ion-implanting a P-type impurity such as Boron to cancel the already formed N-type region. Furthermore, by adjusting energy and dose of the ion implantation, the ion implantation is performed to cancel the N-type region up to the desired depth.

Note that the ion implantation may be performed for all the pixels 51 in step S15 to lower the upper ends of the photodiodes 61 to the predetermined depth, then, step S15' may be executed to individually perform the position adjustment of the upper ends of the photodiodes 61.

After step S15 or step S15' is completed, the process proceeds to step S16. In step S16, the interlayer film 104, the narrow band filter layer 103 (such as the plasmon filter 121 for forming the narrow band filter layer 103 or the like), the interlayer film 102, the on-chip microlens 101, and the like are formed on the silicon substrate 321, as needed.

Thus, the pixel 51 is formed, and the pixel array unit 31 is formed.

Figure 32:
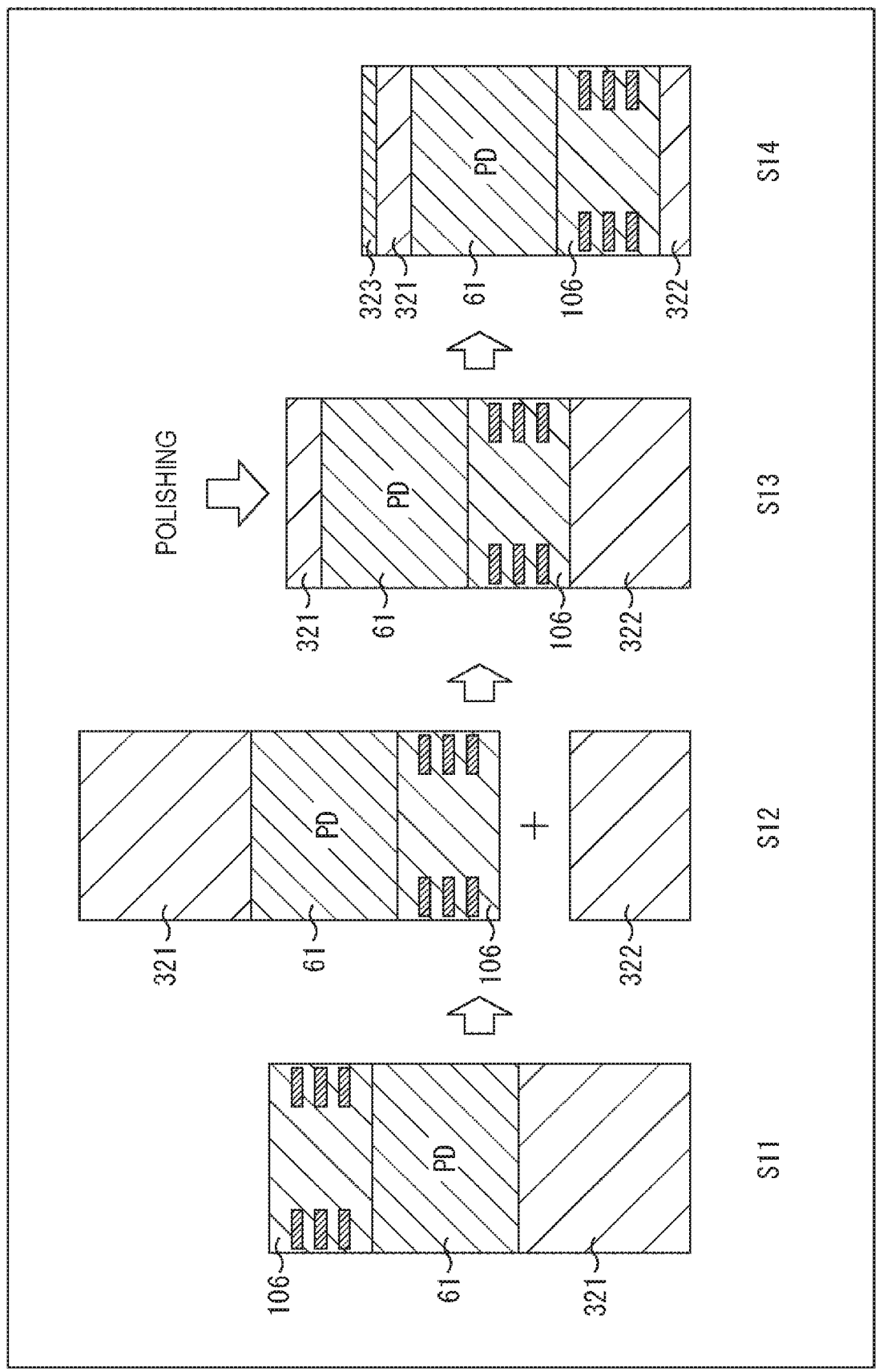
FIG. 32 is a view for describing manufacture of a pixel.
Figure 33:
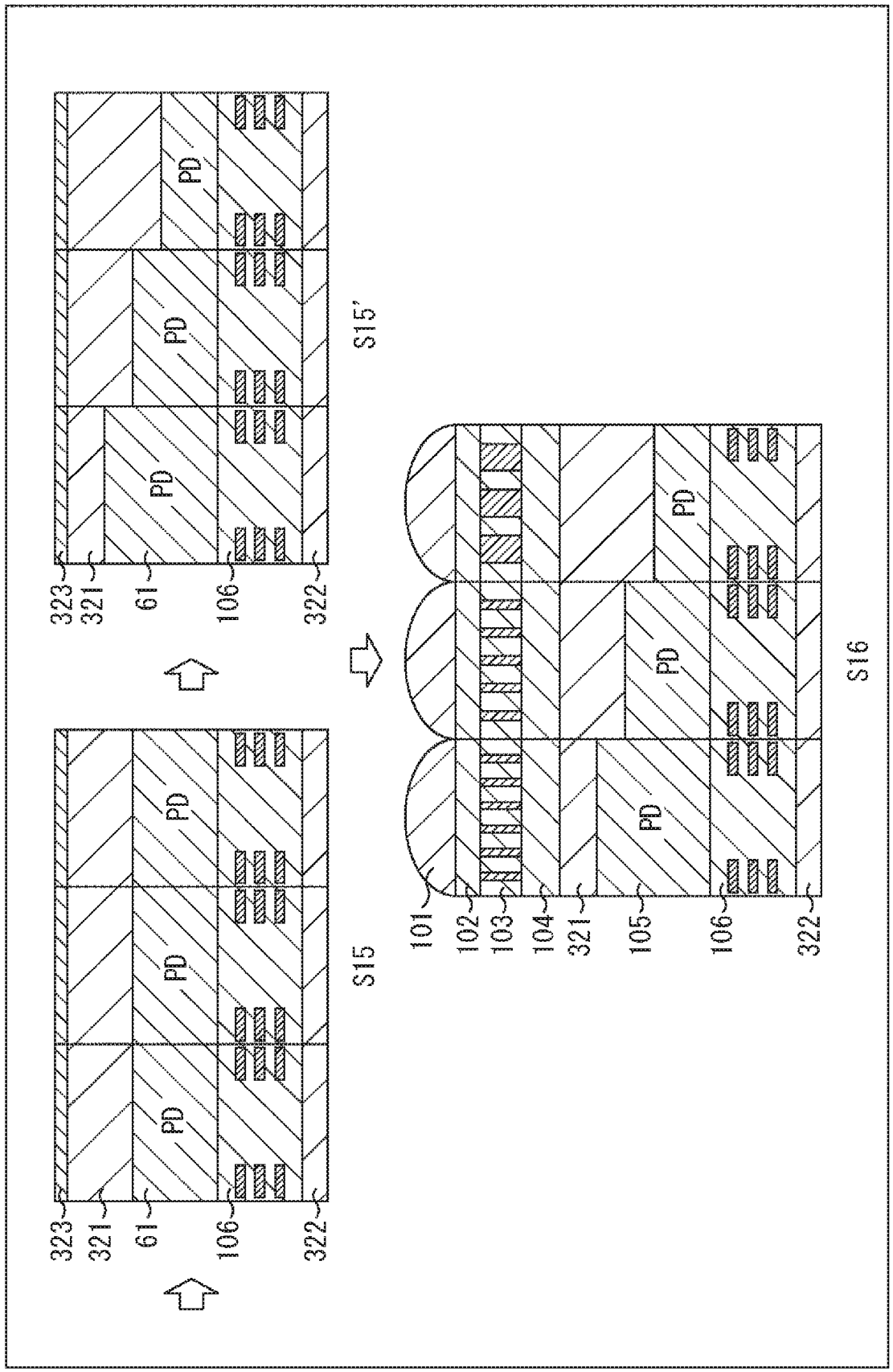
FIG. 33 is a view for describing manufacture of a pixel.

In the manufacturing process illustrated in FIGS. 32 and 33, the depth of the photodiode 61 is adjusted in the back surface process (after bonding the substrate). According to this manufacturing process, concentration profile of the photodiode 61 can be easily controlled because the step of the position adjustment of the photodiode 61 is close to a final step. Furthermore, it is necessary to activate the photodiode 61 itself. It is possible to activate the photodiode 61 by applying a technique such as rapid thermal annealing or laser annealing for heating and activating only near the substrate surface or only for a very short time.

Next, a case where the pixel 51 is configured from a front surface side will be described with reference to FIG. 34. The front surface side is a side on which the wiring layer 106 is stacked in the photodiode 61 of the pixel 51.

In step S31, the photodiode 61 is formed on the silicon substrate 321. When forming the photodiode 61, ion implantation energy is changed for each pixel 51 so that the upper end of the photodiode 61 is located at a different position. After step S31, the silicon substrate 321 is polished to adjust the upper end of the photodiode 61 to the predetermined depth in the silicon substrate 321. Therefore, in step S31, the position of the photodiode 61 is not the final position yet.

Note that, in the case of manufacturing the pixel array unit 31 in which the positions of the upper ends of the photodiodes 61 are aligned, as illustrated in FIG. 30, it is not necessary to change the ion implantation energy for each pixel 51, and the photodiodes 61 are uniformly formed using predetermined ion implantation energy.

In step S32, the wiring layer 106 is stacked on the silicon substrate 321 on the side where the photodiode 61 is formed.

In step S33, the photodiode 61 is formed, the substrate on which the wiring layer 106 is stacked is turned upside down, and the support substrate 322 is stacked on the wiring layer 106. Note that the support substrate 322 may be a circuit substrate on which a logic circuit, a memory, and the like are formed.

In step S34, the side (back surface side) of the silicon substrate 321 on which the wiring layer 106 is not stacked is polished. Polishing is performed so that the position of the upper end of the photodiode 61 of each pixel 51 has a desired depth. This polishing amount is uniform, and the ion implantation energy is adjusted in step S31 so that the position of the upper end of the photodiode 61 of each pixel 51 has the desired depth at the point where uniform polishing is completed, and the photodiode 61 of each pixel 51 is formed.

Thereafter, by performing the same processing as in step S16 (FIG. 33), the interlayer film 104, the narrow band filter layer 103 (such as the plasmon filter 121 for forming the narrow band filter layer 103 or the like), the interlayer film 102, the on-chip microlens 101, and the like are formed on the silicon substrate 321, as needed.

Thus, the pixel 51 is formed, and the pixel array unit 31 is formed.

Figure 34:
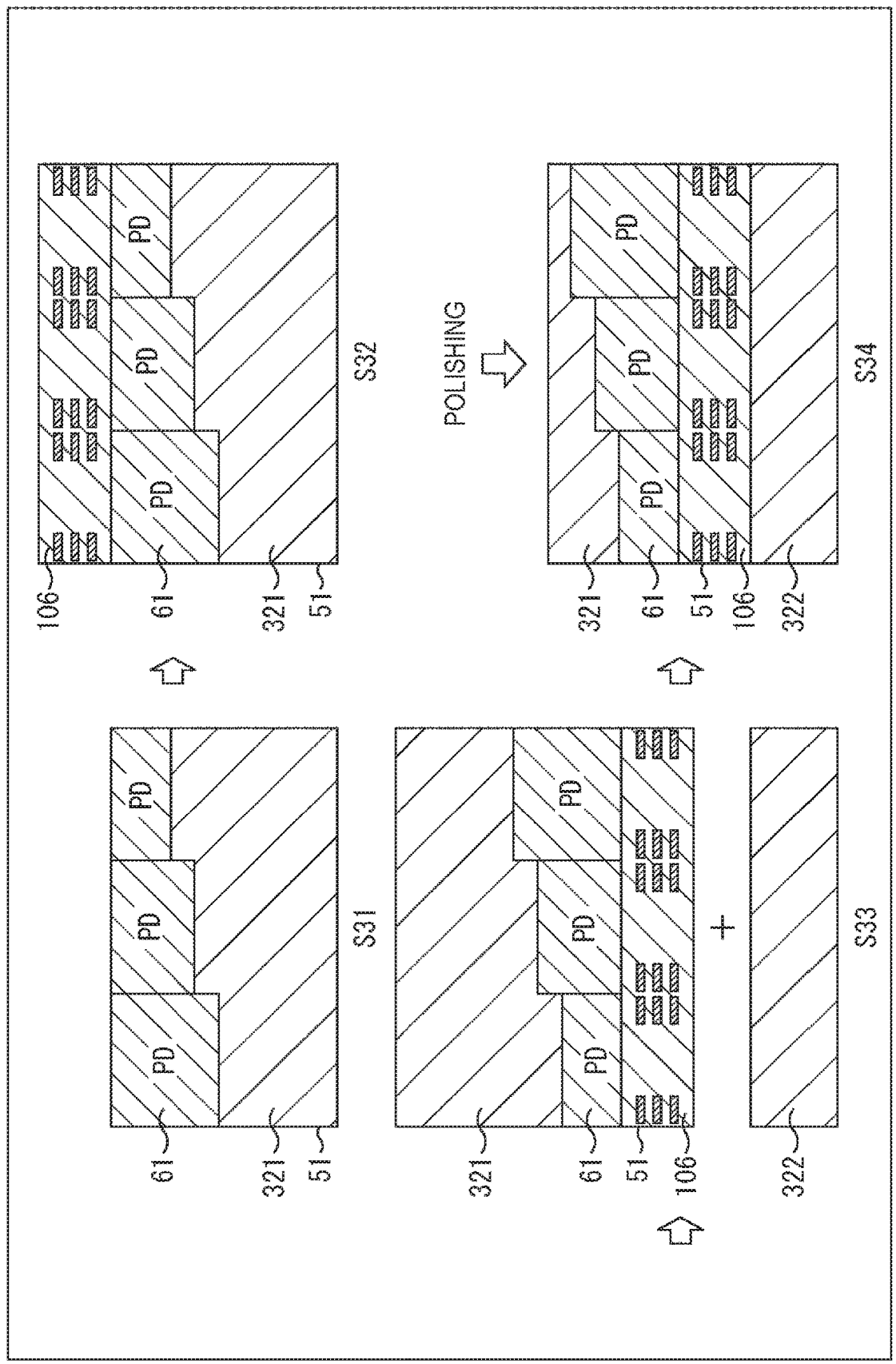
FIG. 34 is a view for describing manufacture of a pixel.

In the manufacturing process illustrated in FIG. 34, the depth of the photodiode 61 is adjusted in the front surface process (before bonding the substrate). According to this manufacturing process, activation of the photodiode 61 can be easily performed because the step of the position adjustment of the photodiode 61 is relatively early step.

<Configuration Using Plurality of Photodiodes Arranged in Horizontal Direction>

It is also possible to use two of the above-described pixels 51 in combination to obtain narrower band information. Here, a configuration of the pixel 51 for obtaining narrower band information, using two pixels 51, will be described.

Figure 35:
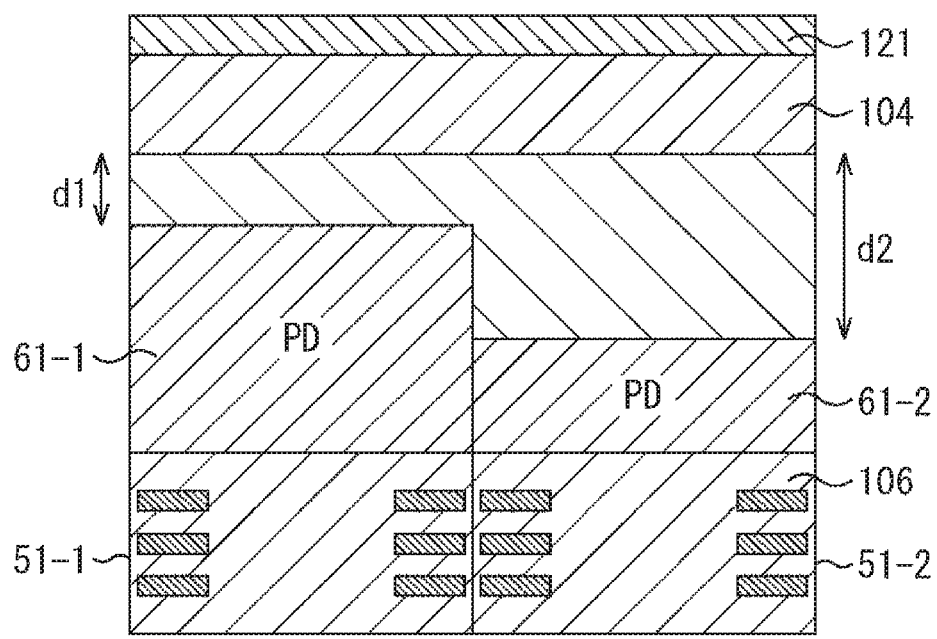
FIG. 35 is a view for describing a configuration of a case of using pixels in combination.

The pixel 51 illustrated in FIG. 35 is formed including a pixel 51-1 and a pixel 51-2 adjacent to each other. In the pixel 51-1, a photodiode 61-1 is formed at the depth d1 from the silicon interface. Furthermore, in the pixel 51-2, a photodiode 61-2 is formed at the depth d2 from the silicon interface.

The plasmon filter 121 is formed on a light incident side of the photodiodes 61-1 and 61-2. The plasmon filter 121 formed on the photodiode 61-1 and the plasmon filter 121 formed on the photodiode 61-2 are the same filter and function as a filter that transmits light having a predetermined wavelength.

For example, it is assumed that the transmission wavelength of the plasmon filter 121 is a transmission wavelength A. In a case where the depth suitable for the transmission wavelength A is the depth d1, the photodiode 61-1 efficiently receives light having the transmission wavelength A. Furthermore, since the photodiode 61-1 is formed up to the wiring layer 106 side, the photodiode 61-1 also receives light having a wavelength other than the transmission wavelength A.

More specifically, there is a possibility that the photodiode 61-1 receives light having a longer wavelength than the transmission wavelength A. A light component on the long wavelength side is a color mixture component.

Meanwhile, the photodiode 61-2 formed at the depth d2 is not formed at a position for receiving light having the transmission wavelength A. In other words, the photodiode 61-2 is formed at a position for receiving the color mixture component of the transmission wavelength A.

By performing calculation using signal amounts respectively obtained by the photodiodes 61-1 and 61-2 having such characteristics, narrower band information can be obtained.

That is, (the signal amount of the photodiode 61-1)−(the signal amount of the photodiode 61-2)

is calculated, so that the signal amount from which the color mixture component has been removed can be obtained.

By performing such calculation, a spectral characteristic on an upper portion of the photodiode 61-1 can be obtained. The upper portion of the photodiode 61-1 is a portion formed in a portion corresponding to (d2−d1) in FIG. 35.

By using the signals from the photodiodes 61 formed at different positions in this manner, desired narrow band light information can be obtained.

Figure 36:
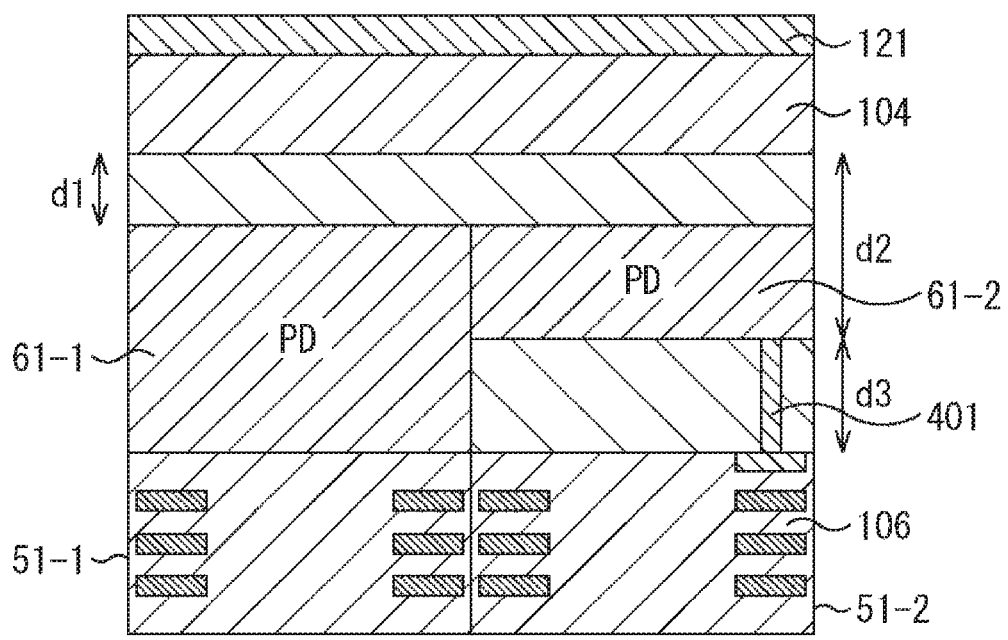
FIG. 36 is a view for describing a configuration of a case of using pixels in combination.

Another configuration of the case of using two pixels is illustrated in FIG. 36.

The pixel 51 illustrated in FIG. 36 is the same as the pixel 51 illustrated in FIG. 35, except that the position where the photodiode 61-2 is formed is different, and the other parts are the same. The description of the same parts is omitted.

The photodiode 61-2 is formed such that the upper end of the photodiode 61-2 is located at the depth d1 from the silicon interface, and the lower end of the photodiode 61-2 is located at the depth d2 from the silicon interface. Furthermore, since the photodiode 61-2 is configured not in contact with the wiring layer 106, a vertical transistor 401 for reading charges from the photodiode 61-2 is provided in contact with the photodiode 61-2 and (predetermined wiring in) the wiring layer 106.

Even in the pixel illustrated in FIG. 36, (the signal amount of the photodiode 61-1)−(the signal amount of the photodiode 61-2)

is calculated, so that the spectral characteristic of a lower portion of the photodiode 61-1 can be obtained. The lower portion of the photodiode 61-1 is a portion from a lower side of the photodiode 61-2 to the interface of the wiring layer 106, and is a portion formed in a portion corresponding to the thickness d3 in FIG. 36.

For example, it is assumed that the transmission wavelength of the plasmon filter 121 is a transmission wavelength B, and the depth suitable for the transmission wavelength B is the depth d2. In this case, the photodiode 61-1 is formed at a position for efficiently receiving light having the transmission wavelength B and also formed at a position for receiving light having a wavelength other than the transmission wavelength B.

In the photodiode 61-1, the position for receiving light having a wavelength other than the transmission wavelength B is a portion formed in a region of (the depth d2−the depth d1), and is a position suitable for receiving light on a shorter wavelength side than the transmission wavelength B.

The photodiode 61-2 formed in the region from the depth d1 to the depth d2 is formed at the position for receiving light other than light having the transmission wavelength B. In other words, the photodiode 61-2 is formed at a position for receiving the color mixture component of the transmission wavelength B.

(the signal amount of the photodiode 61-1)−(the signal amount of the photodiode 61-2)

is calculated using the signal amounts respectively obtained by the photodiode 61-1 and the photodiode 61-2 having such characteristics, so that the signal amount from which the color mixture component has been removed can be obtained.

By using the signals from the photodiodes 61 formed at different positions in this manner, desired narrow band light information can be obtained.

In FIGS. 35 and 36, the description has been given using the case of two pixels as an example. However, a configuration to obtain a signal amount of light in a desired narrow band by performing calculation using signal amounts obtained from a plurality of pixels such as four pixels or five pixels other than two pixels may be adopted.

Furthermore, the description has been given taking an example of subtraction as the calculation so far. However, another calculation may be performed. For example, in the case of performing calculation using the signal amounts from the adjacent pixel 51-1 and pixel 51-2, as illustrated in FIGS. 35 and 36, positions in space are difference between the pixel 51-1 and the pixel 51-2, and thus calculation including calculation for absorbing such a difference may be performed.

<Configuration Using Plurality of Photodiodes Arranged in Vertical Direction>

In the examples illustrated in FIGS. 35 and 36, the description has been made taking an example of the case of using the photodiodes 61 arranged in the horizontal direction and formed at different depths. Next, a case of using a plurality of photodiodes arranged in the vertical direction will be described.

Figure 37:
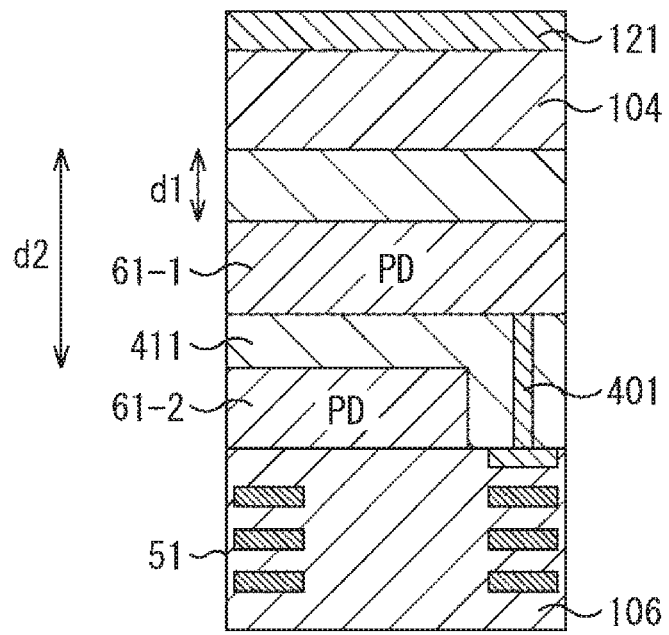
FIG. 37 is a view for describing a configuration of a case where photodiodes are stacked in a vertical direction.

FIG. 37 illustrates a configuration example of the pixel 51 in which two photodiodes 61 are arranged in the vertical direction. In the pixel 51 illustrated in FIG. 37, a photodiode 61-1 is formed at the depth d1 and a photodiode 61-2 is formed at the depth d2 from the interface of the silicon substrate.

A P-type semiconductor region 411 is formed between the photodiode 61-1 and the photodiode 61-2, and the photodiode 61-1 and the photodiode 61-2 are configured to be separated. Furthermore, a vertical transistor 401 for being connected to wiring in the wiring layer 106 is connected to the photodiode 61-1.

In the pixel 51 illustrated in FIG. 37, light on a short wavelength side is received by the photodiode 61-1 on an upper side in the silicon substrate, and light on a long wavelength side is received by the photodiode 61-2 on a lower side in the silicon substrate.

Since the pixel 51 illustrated in FIG. 37 has, for example, a configuration in which the pixel 51-1 and the pixel 51-2 illustrated in FIG. 35 are combined, (the signal amount of the photodiode 61-1)−(the signal amount of the photodiode 61-2)

is calculated, so that the signal amount from which the color mixture component has been removed can be obtained, as in the case described with reference to FIG. 35.

Therefore, desired narrow band light information can be obtained even in the pixel 51 illustrated in FIG. 37. Furthermore, since the pixel 51 illustrated in FIG. 37 has two photodiodes 61 formed in one pixel, the pixel 51 can obtain spectral characteristics with higher spatial resolution than the pixel 51 illustrated in FIG. 35, for example.

<Structure Using Dot Array-Type Plasmon Filter>

Figure 38:
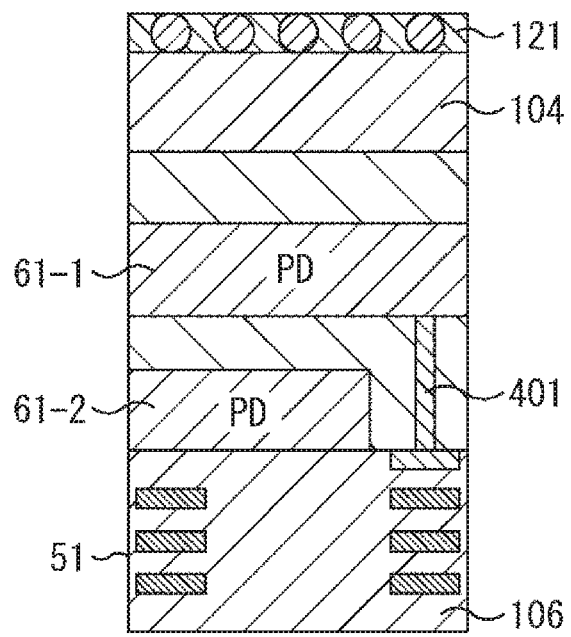
FIG. 38 is a view for describing a configuration of a case where photodiodes are stacked in a vertical direction.

As the plasmon filter 121 of the pixel 51 illustrated in FIG. 37, a case of using the dot array-type plasmon filter 121 will be described. The pixel 51 in FIG. 38 has the same structure as the pixel 51 illustrated in FIG. 37 but is different in that the plasmon filter 121 is the dot array-type plasmon filter 121.

Detailed description of the dot array-type plasmon filter 121 is omitted as described with reference to FIGS. 12A, 12B, and 13. The dot array-type plasmon filter 121 is a filter that absorbs light having a predetermined wavelength band and is used as a complementary color filter. The wavelength band of light absorbed by the dot array-type plasmon filter 121 changes depending on the pitch between adjacent dots 133 or the like.

In the dot array-type plasmon filter 121, the absorption band of the plasmon filter 121 shifts to a shorter wavelength side as the dot pitch between the dots 133 becomes narrower, and the absorption band of the plasmon filter 121 shifts to a longer wavelength side as the pitch between the dots 133 becomes wider.

In the case of using the dot array-type plasmon filter 121, the pixel 51 in which the photodiode 61 is not formed at the position for receiving light having a wavelength absorbed by the plasmon filter 121 can be obtained. The pixel 51 having such a configuration will be described with reference to FIGS. 39A, 39B, and 39C.

Figures 39A, 39B, 39C:
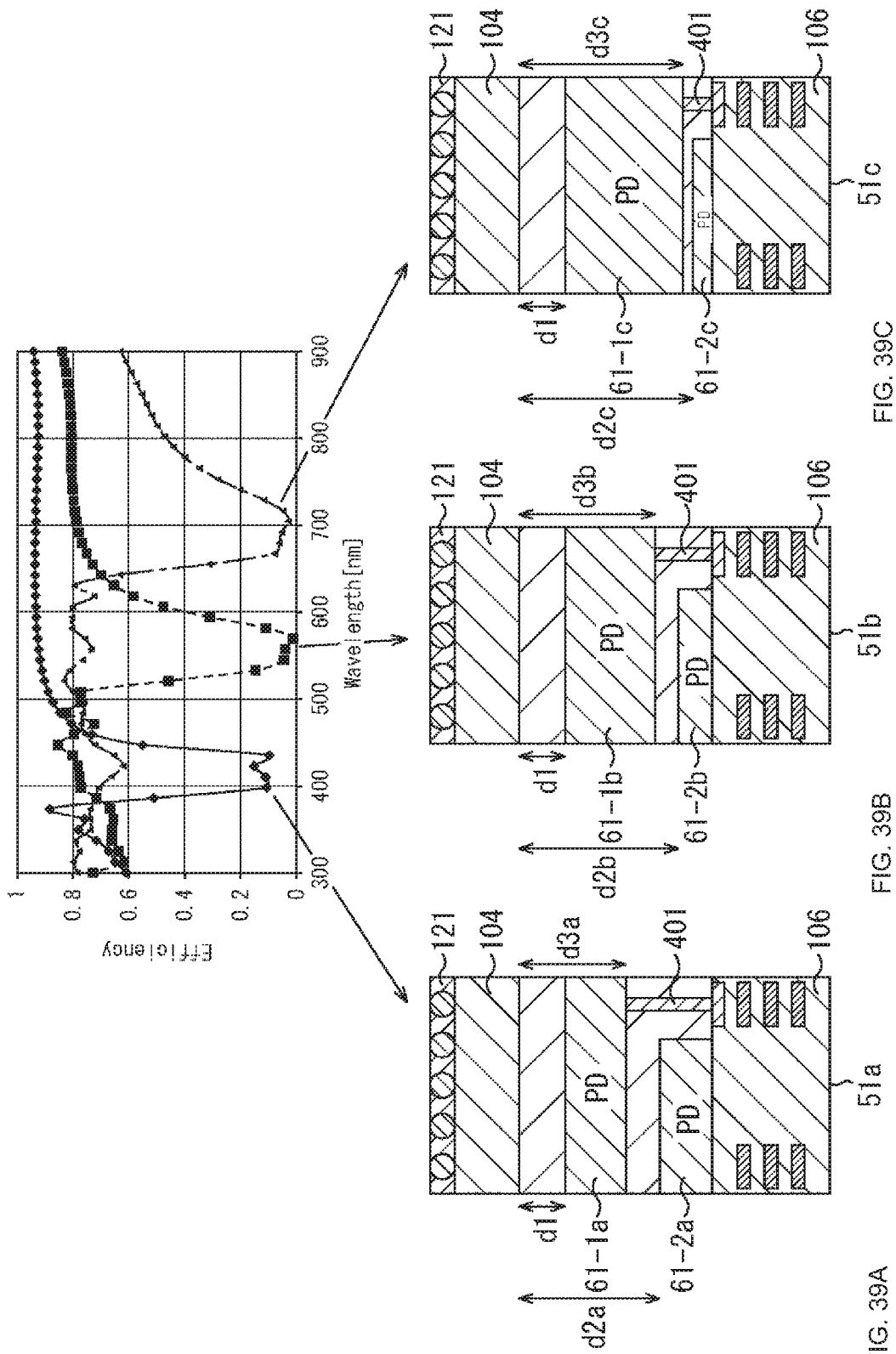
FIGS. 39A, 39B, and 39C are graphs and views for describing configurations of pixels in a case of using a dot array-type plasmon filter.

The upper graph in FIGS. 39A, 39B, and 39C are the same as the graph illustrated in FIG. 14, and is a graph illustrating spectral characteristics of when using the dot array-type plasmon filter 121 illustrated in FIG. 13. The lower views in FIGS. 39A, 39B, and 39C illustrate examples in which the photodiode 61 is formed at a position in accordance with the absorption wavelength of the plasmon filter 121.

FIG. 39A is a view illustrating a configuration of an example of a pixel 51a in which the photodiode 61-1 and the photodiode 61-2 are formed in accordance with the spectral characteristic obtained in a case of setting the dot pitch of the plasmon filter 121 to 300 nm.

The spectral characteristic obtained in the case of setting the dot pitch of the plasmon filter 121 to 300 nm is a spectral characteristic that mainly absorbs blue light (the wavelength λ=450 nm). The pixel 51a has a configuration in which the photodiode 61 is not formed at the depth at which blue light is received. The photodiode 51 being not formed means that the photodiode is formed in a state where generated electrons (or holes) cannot be read as an electric signal (reading is not performed) even when photoelectric conversion occurs in that portion.

A photodiode 61-1a is formed in a region from the depth d1 to a depth d3a from the interface of the silicon substrate, and a photodiode 61-2a is formed in a region from a depth d2a from the interface of the silicon substrate to near the interface of the wiring layer 106. As illustrated in FIG. 39A, there is a relationship of the depth d1<the depth d3a<the depth d2a.

The photodiode 61 is not formed in a region from the depth d3a to the depth d2a from the interface of the silicon substrate. By setting the region from the depth d3a to the depth d2a as a region where blue light can be easily received, light in the blue frequency band not absorbed by the plasmon filter 121a is absorbed in this region, and is prevented from being received by the photodiode 61-1a and a photodiode 61a-2.

As described above, in the pixel 51a, the color mixture due to the light in the wavelength band absorbed by the plasmon filter 121a can be reduced, the absorption wavelength of the complementary color filter can be observed as a stronger absorption wavelength, and the spectral characteristics can be improved.

FIG. 39B is a view illustrating a configuration of an example of a pixel 51b in which the photodiode 61-1 and the photodiode 61-2 are formed in accordance with the spectral characteristic obtained in a case of setting the dot pitch of the plasmon filter 121 to 400 nm.

The spectral characteristic obtained in the case of setting the dot pitch of the plasmon filter 121 to 400 nm is a spectral characteristic that mainly absorbs green light (the wavelength λ=530 nm). The pixel 51b has a configuration in which the photodiode 61 is not formed at the depth at which green light is received.

A photodiode 61-1b is formed in a region from the depth d1 to a depth d3b from the interface of the silicon substrate, and a photodiode 61-2b is formed in a region from a depth d2b from the interface of the silicon substrate to near the interface of the wiring layer 106. As illustrated in FIG. 39B, there is a relationship of the depth d1<the depth d3b<the depth d2b.

The photodiode 61 is not formed in a region from the depth d3b to the depth d2b from the interface of the silicon substrate. By setting the region from the depth d3b to the depth d2b as a region where green light can be easily received, light in the green frequency band not absorbed by the plasmon filter 121b is absorbed in this region, and is prevented from being received by the photodiode 61-1b and a photodiode 61b-2.

As described above, in the pixel 51b, the color mixture due to the light in the wavelength band absorbed by the plasmon filter 121b can be reduced, the absorption wavelength of the complementary color filter can be observed as a stronger absorption wavelength, and the spectral characteristics can be improved.

FIG. 39C is a view illustrating a configuration of an example of a pixel 51c in which the photodiode 61-1 and the photodiode 61-2 are formed in accordance with the spectral characteristic obtained in a case of setting the dot pitch of the plasmon filter 121 to 500 nm.

The spectral characteristic obtained in the case of setting the dot pitch of the plasmon filter 121 to 400 nm is a spectral characteristic that mainly absorbs red light (the wavelength λ=700 nm). The pixel 51*c* is configured such that the photodiode 61 is not formed at the depth at which red light is received.

A photodiode 61-1*c* is formed in a region from the depth d1 to a depth d3*c* from the interface of the silicon substrate, and a photodiode 61-2*c* is formed in a region from a depth d2*c* from the interface of the silicon substrate to near the interface of the wiring layer 106. As illustrated in FIG. 39C, there is a relationship of the depth d1<the depth d3*c*<the depth d2*c*.

The photodiode 61 is not formed in a region from the depth d3*c* to the depth d2*c* from the interface of the silicon substrate. By setting the region from the depth d3*c* to the depth d2*c* as a region where red light can be easily received, light in the red frequency band not absorbed by the plasmon filter 121*c* is absorbed in this region, and is prevented from being received by the photodiode 61-1*c* and a photodiode 61*c*-2.

As described above, in the pixel 51*c*, the color mixture due to the light in the wavelength band absorbed by the plasmon filter 121*c* can be reduced, the absorption wavelength of the complementary color filter can be observed as a stronger absorption wavelength, and the spectral characteristics can be improved.

As described above, even in the case of using the dot array-type plasmon filter 121, the depth at which the photodiode 61 is not formed is set to be deeper as the wavelength absorbed by the plasmon filter 121 becomes longer. By performing such a setting, the pixel 51 by which the above-described effects can be obtained can be obtained.

<Square Array-Type Plasmon Filter>

As a plasmon filter other than the above-described plasmon filters 121, a square array-type plasmon filter 451 as illustrated in FIG. 40A can be applied to the present technology.

The basic configuration of the square array-type plasmon filter 451 can be similar to the configuration of the plasmon filter 151 using GMR described with reference to FIG. 14. In the plasmon filter 151 using GMR, the rectangular conductive thin films 161A are arranged adjacent to each other at the predetermined pitch P5 in the conductive layer 161 (FIG. 14). By replacing the rectangular conductive thin films 161A with square-type conductive thin films 151A, the square array-type plasmon filter 451 can be obtained.

The square array-type plasmon filter 451 can be applied to the present technology. FIG. 40B illustrates a configuration of the case of applying the square array-type plasmon filter 451 instead of the plasmon filter 121 in the pixel 51 illustrated in FIG. 37. As illustrated in FIGS. 40A and 40B, in the case of using the square array-type plasmon filter 451, a photodiode 61-1 or a photodiode 61-2 is formed at a position suitable for the wavelength of light transmitted through the plasmon filter 451, and the photodiode 61-1 or the photodiode 61-2 is formed at a position having a possibility of receiving a color mixture component.

Even in the case of using the square array-type plasmon filter 451, the spectral characteristics can be improved, as in the cases of using the above-described plasmon filters 121 and the like.

<Configuration in Plurality of Layers>

Next, a case where the pixel 51 is formed in a plurality of layers, in other words, a case of a configuration in which a plurality of semiconductor substrates is stacked will be described.

Figure 41C:
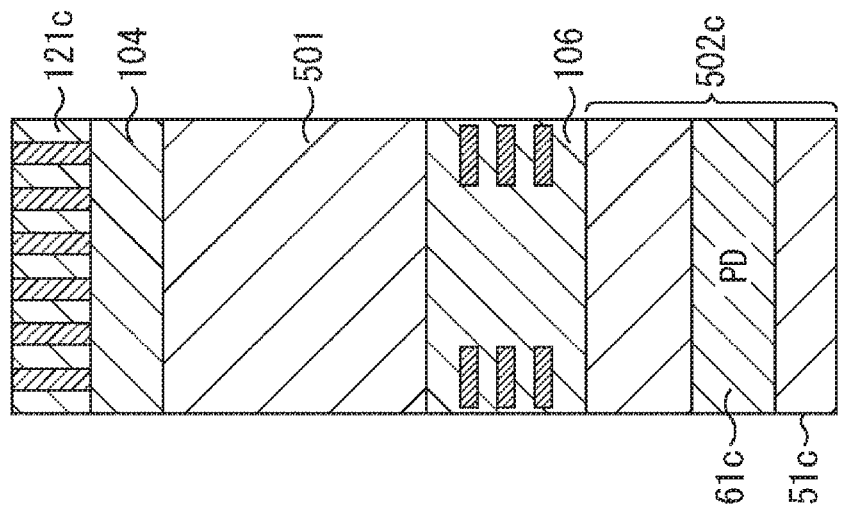
FIGS. 41A, 41B, and 41C are views for describing pixels having a stacked structure.
Figure 41B:
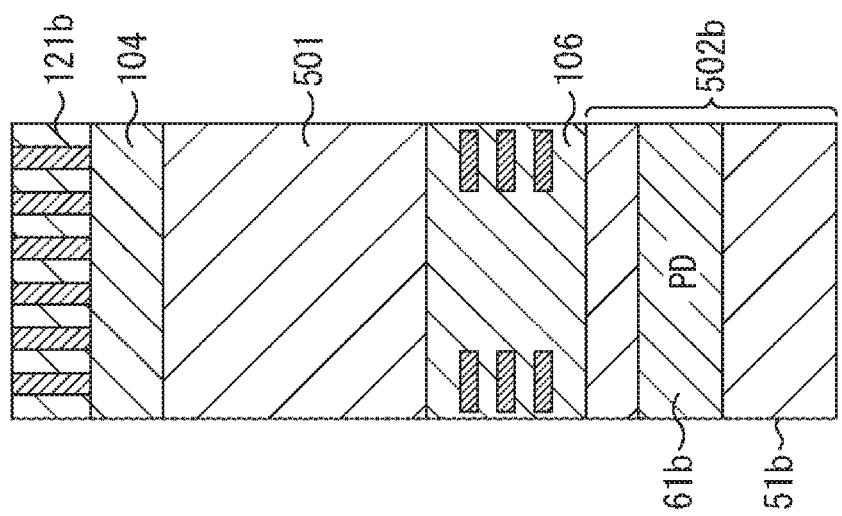
Figure 41A:
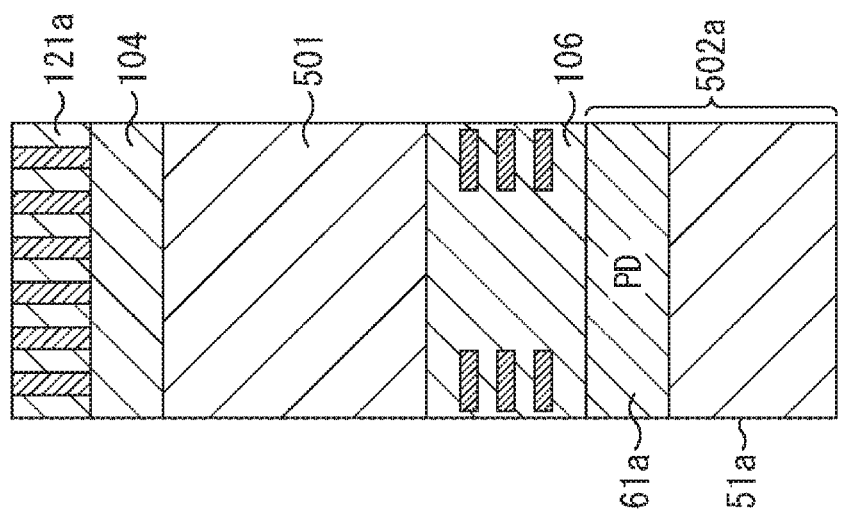

FIGS. 41A, 41B, and 41C are views illustrating configurations of examples of the pixels 51 formed using a plurality of semiconductor substrates. FIGS. 41A, 41B, and 41C illustrate configuration examples of the pixels 51 having a configuration including an upper semiconductor substrate 501 and a lower semiconductor substrate 502. Basic configurations of pixels 51*a* to 51*c* illustrated in FIGS. 41A, 41B, and 41C are the same but depths at which photodiodes 61*a* to 61*c* are formed are different.

The basic configurations of the pixels 51*a* to 51*c* illustrated in FIGS. 41A, 41B, and 41C are a configuration in which the plasmon filter 121, the interlayer film 104, the upper semiconductor substrate 501, the wiring layer 106, and the lower semiconductor substrate 502 are stacked in order from the top. Furthermore, the photodiode 61 is formed in the lower semiconductor substrate 502. Note that, in FIGS. 41A, 41B, and 41C, the on-chip microlens 101 in an upper layer and the like are omitted.

In the pixel 51*a* illustrated in FIG. 41A, a photodiode 61*a* is formed at a position suitable for the transmission wavelength of a plasmon filter 121*a* in a lower semiconductor substrate 502*a*.

In the pixel 51*b* illustrated in FIG. 41B, a photodiode 61*b* is formed at a position suitable for the transmission wavelength of a plasmon filter 121*b* in a lower semiconductor substrate 502*b*.

In the pixel 51*c* illustrated in FIG. 41C, a photodiode 61*c* is formed at a position suitable for the transmission wavelength of a plasmon filter 121*c* in a lower semiconductor substrate 502*c*.

Since the plasmon filter 121*a*, the plasmon filter 121*b*, and the plasmon filter 121*c* are filters in which the transmission wavelength shifts to the longer wavelength side in this order, the depth of the photodiode 61*a*, the depth of the photodiode 61*b*, and the depth of the photodiode 61*c* are formed to be deeper in this order.

The upper semiconductor substrate 501 is a silicon substrate, on which the photodiode 61 and the like are not formed. By using the silicon substrate as the upper semiconductor substrate 501, light on a short wavelength side, of light transmitted through the plasmon filter 121, is absorbed by the silicon substrate (upper semiconductor substrate 501), and light on a long wavelength side, of the light transmitted the plasmon filter 121, reaches and is received by the photodiode 61 formed in the lower semiconductor substrate 502.

Therefore, in the case of the pixel 51 that receives the light on a long wavelength side, the light on a short wavelength side having a possibility of becoming a color mixture component can be absorbed by the upper semiconductor substrate 501. Therefore, the pixel 51 capable of suppressing the color mixture component can be obtained.

Moreover, since the photodiode 61 formed in the lower semiconductor substrate 502 is formed at the position suitable for the transmission wavelength of the plasmon filter 121, as in the above-described embodiment, light having a desired wavelength can be efficiently received.

In FIGS. 41A, 41B, and 41C, the case where the photodiode 61 is formed only in the lower semiconductor substrate 502 has been described as an example. However, as illustrated in FIGS. 42A, 42B, and 42C, a configuration in which the photodiodes 61 are respectively formed in both the upper semiconductor substrate 501 and the lower semiconductor substrate 502 can be adopted.

Basic configurations of pixels 51*a* to 51*c* illustrated in FIGS. 42A 42B, and 42C are similar to the pixels 51*a* to 51*c* illustrated in FIGS. 41A 41B and 41C, but are different in that photodiodes 61*a*-1 to 61*c*-1 are each formed in the upper semiconductor substrate 501.

In the pixel 51*a* illustrated in FIG. 42A, the photodiode 61*a*-1 is formed at the position suitable for the transmission wavelength of the plasmon filter 121*a* in an upper semiconductor substrate 501*a* and the photodiode 61*a*-2 is formed in the lower semiconductor substrate 502*a*. In the pixel 51*a*, the light having the transmission wavelength of the plasmon filter 121*a* is received by the photodiode 61*a*-1 formed in the upper semiconductor substrate 501*a*, and light having a long wavelength transmitted through the photodiode 61*a*-1 is received by the photodiode 61*a*-2 formed in the lower semiconductor substrate 502.

In the pixel 51*b* illustrated in FIG. 42B, the photodiode 61*b*-1 is formed at the position suitable for the transmission wavelength of the plasmon filter 121*b* in an upper semiconductor substrate 501*b* and the photodiode 61*b*-2 is formed in the lower semiconductor substrate 502*b*. In the pixel 51*b*, the light having the transmission wavelength of the plasmon filter 121*b* is received by the photodiode 61*b*-1 formed in the upper semiconductor substrate 501*b*, and light having a long wavelength transmitted through the photodiode 61*b*-1 is received by the photodiode 61*b*-2 formed in the lower semiconductor substrate 502.

In the pixel 51*c* illustrated in FIG. 42C, the photodiode 61*c*-1 is formed at the position suitable for the transmission wavelength of the plasmon filter 121*c* in an upper semiconductor substrate 501*c* and the photodiode 61*c*-2 is formed in the lower semiconductor substrate 502*c*. In the pixel 51*c*, the light having the transmission wavelength of the plasmon filter 121*c* is received by the photodiode 61*c*-1 formed in the upper semiconductor substrate 501*c*, and light having a long wavelength transmitted through the photodiode 61*c*-1 is received by the photodiode 61*c*-2 formed in the lower semiconductor substrate 502.

Since the plasmon filter 121*a*, the plasmon filter 121*b*, and the plasmon filter 121*c* are filters in which the transmission wavelength shifts to the longer wavelength side in this order, the depth of the photodiode 61*a*-1, the depth of the photodiode 61*b*-1, and the depth of the photodiode 61*c*-1 are formed to be deeper in this order.

The example illustrated in FIGS. 42A, 42B, and 42C has been described using the case where a change is made by the depth of the photodiode 61-1 formed in the upper semiconductor substrate 501 as an example. However, the depth of the photodiode 61-2 formed in the lower semiconductor substrate 502 may be changed in accordance with the characteristics of the plasmon filter 121.

In the case of the configurations in which the upper semiconductor substrate 501 and the lower semiconductor substrate 502 are stacked, as illustrated in FIGS. 41A, 41B, 41C, 42A, 42B, and 42C, the upper semiconductor substrate 501 and the lower semiconductor substrate 502 can be stacked as illustrated in FIGS. 43 to 47.

Figure 43:
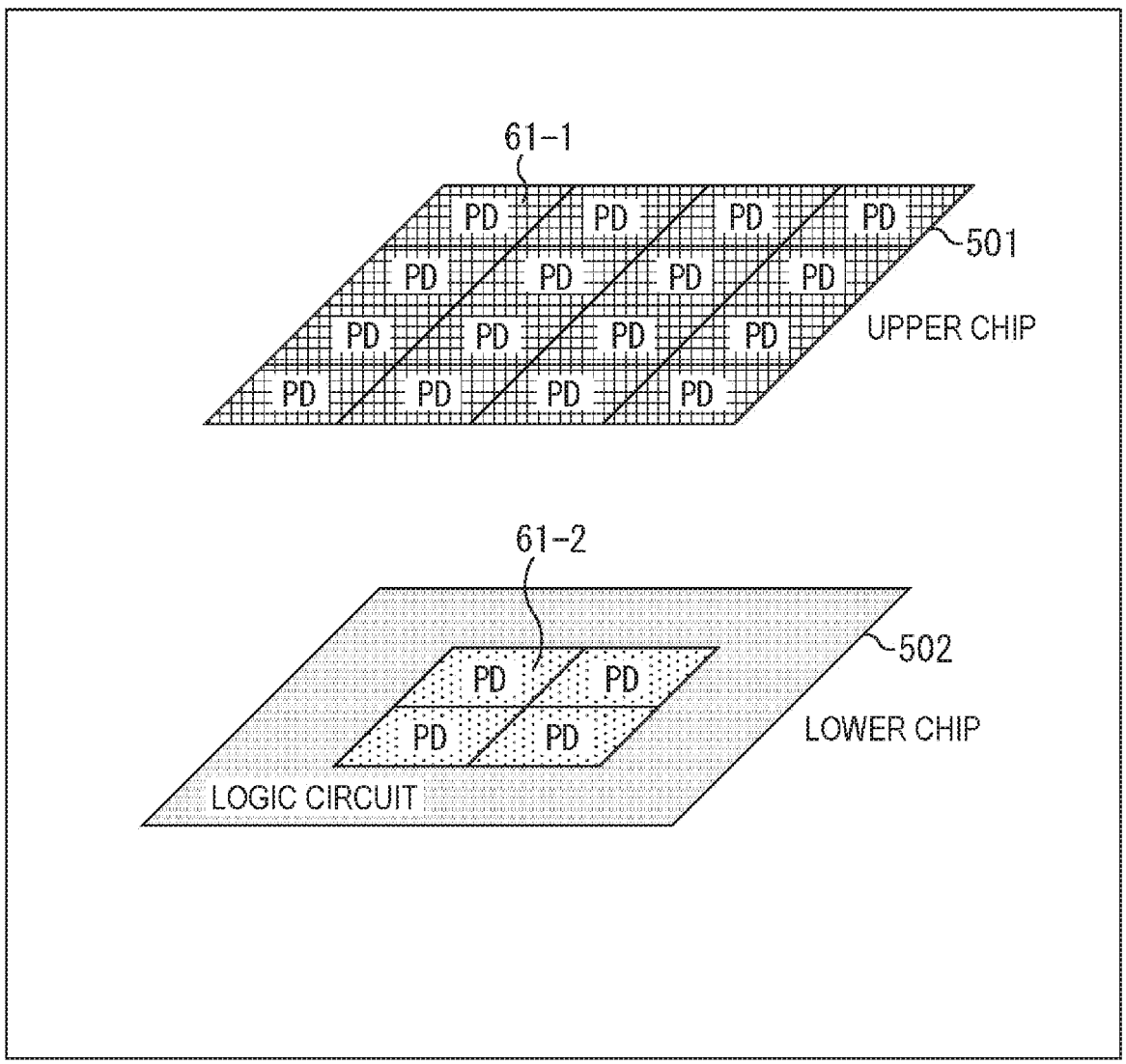
FIG. 43 is views for describing a stacked structure.

Referring to FIG. 43, the upper semiconductor substrate 501 is a semiconductor substrate in which the photodiodes 61-1 are formed in an array, and the lower semiconductor substrate 502 is a semiconductor substrate in which a logic circuit is formed and the photodiodes 61-2 are formed in part of the logic circuit. That is, the photodiodes 61-2 and the logic circuit are mixedly mounted in the lower semiconductor substrate 502.

Figure 44:
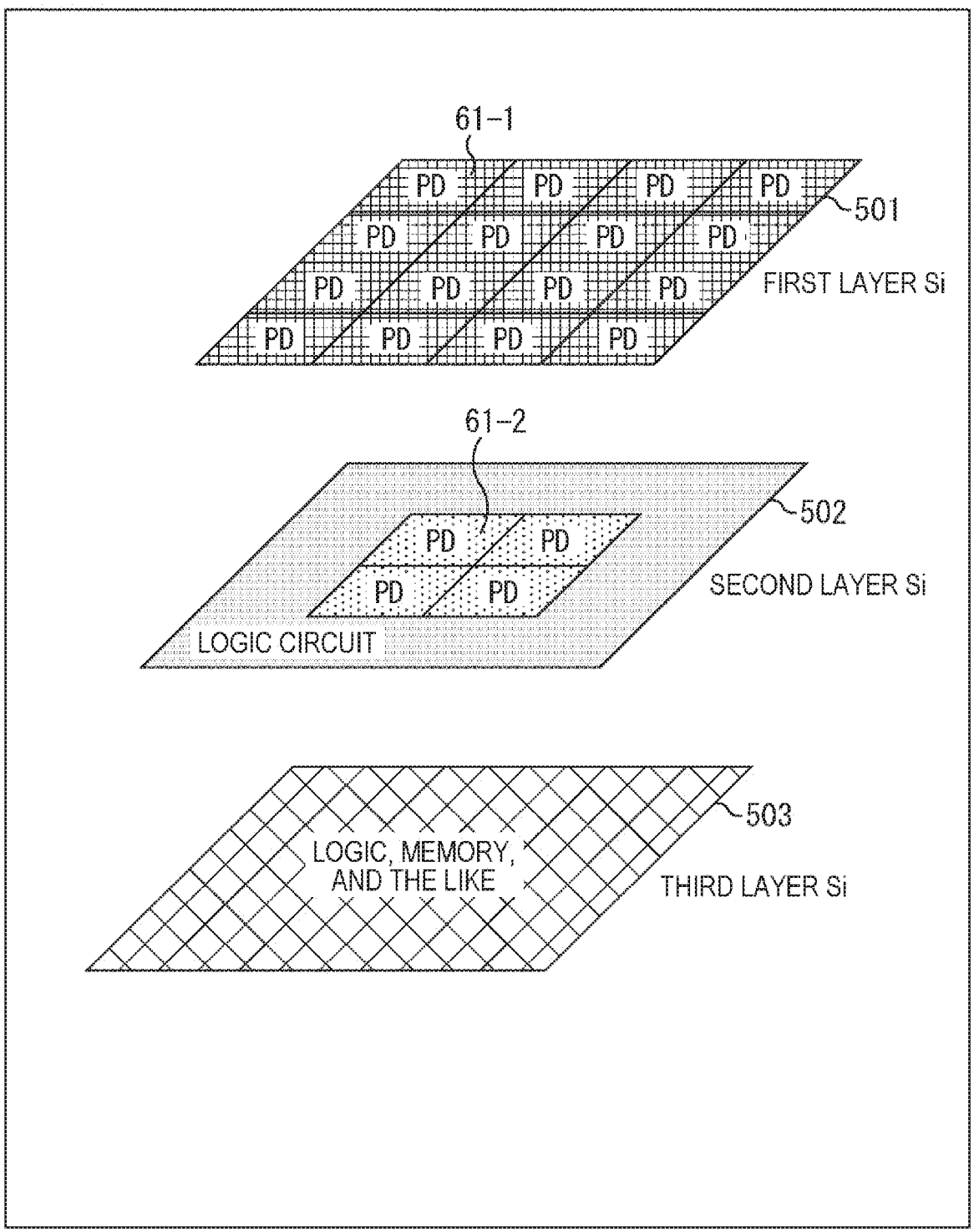
FIG. 44 is views for describing a stacked structure.

In the stacked structure illustrated in FIG. 44, the upper semiconductor substrate 501 and the lower semiconductor substrate 502 are stacked, and a third semiconductor substrate 503 is further stacked. The third semiconductor substrate 503 can be a semiconductor substrate in which a logic circuit, a memory, and the like are formed. That is, the photodiodes 61-2 and the logic circuit are mixedly mounted in the lower semiconductor substrate 502, and the logic circuit and the memory are mixedly mounted in the third semiconductor substrate 503.

As illustrated in FIGS. 43 and 44, the area of the semiconductor substrate can be effectively used by mixedly mounting the photodiodes 61, the logic circuit, the memory, and the like.

Furthermore, according to the stacked structure illustrated in FIG. 44, the logic circuit and the memory can be arranged on the second lower semiconductor substrate 502 and the third semiconductor substrate 503, and the degree of freedom in arrangement of the logic circuit and the memory can be increased.

In the stacked structure illustrated in FIGS. 43 and 44, the photodiode 61-1 formed in the upper semiconductor substrate 501 and the photodiode 61-2 in the lower semiconductor substrate 502 are not in a one-to-one relationship. In other words, a fewer number of the photodiodes 61-2 than the number of the photodiodes 61-1 formed in the upper semiconductor substrate 501 are formed in the lower semiconductor substrate 502.

As described above, in the case where a fewer number of photodiodes 61-2 than the number of photodiodes 61-1 formed in the upper semiconductor substrate 501 are formed in the lower semiconductor substrate 502, the photodiodes 61-2 are formed near the center of the lower semiconductor substrate 502, as illustrated in FIGS. 43 and 44. This is considered to be advantageous in terms of characteristics because the amount of incident light is generally larger near the center than near the outer periphery and the incidence angle is also almost perpendicular.

Although not illustrated, the photodiode 61-2 may be formed near the outer periphery of the lower semiconductor substrate 502. For example, in a case where an object to be observed is likely to come to a specific place such as a periphery of a screen, and such a place is captured, the photodiode 61-2 may be formed near the outer periphery of the lower semiconductor substrate 502.

The present technology can be applied regardless of where in the lower semiconductor substrate 502 the photodiode 61-2 is formed. Furthermore, as illustrated in FIG. 45, it is also good if the photodiode 61-1 formed in the upper semiconductor substrate 501 and the photodiode 61-2 formed in the lower semiconductor substrate 502 are formed in a one-to-one relationship.

Figure 45:
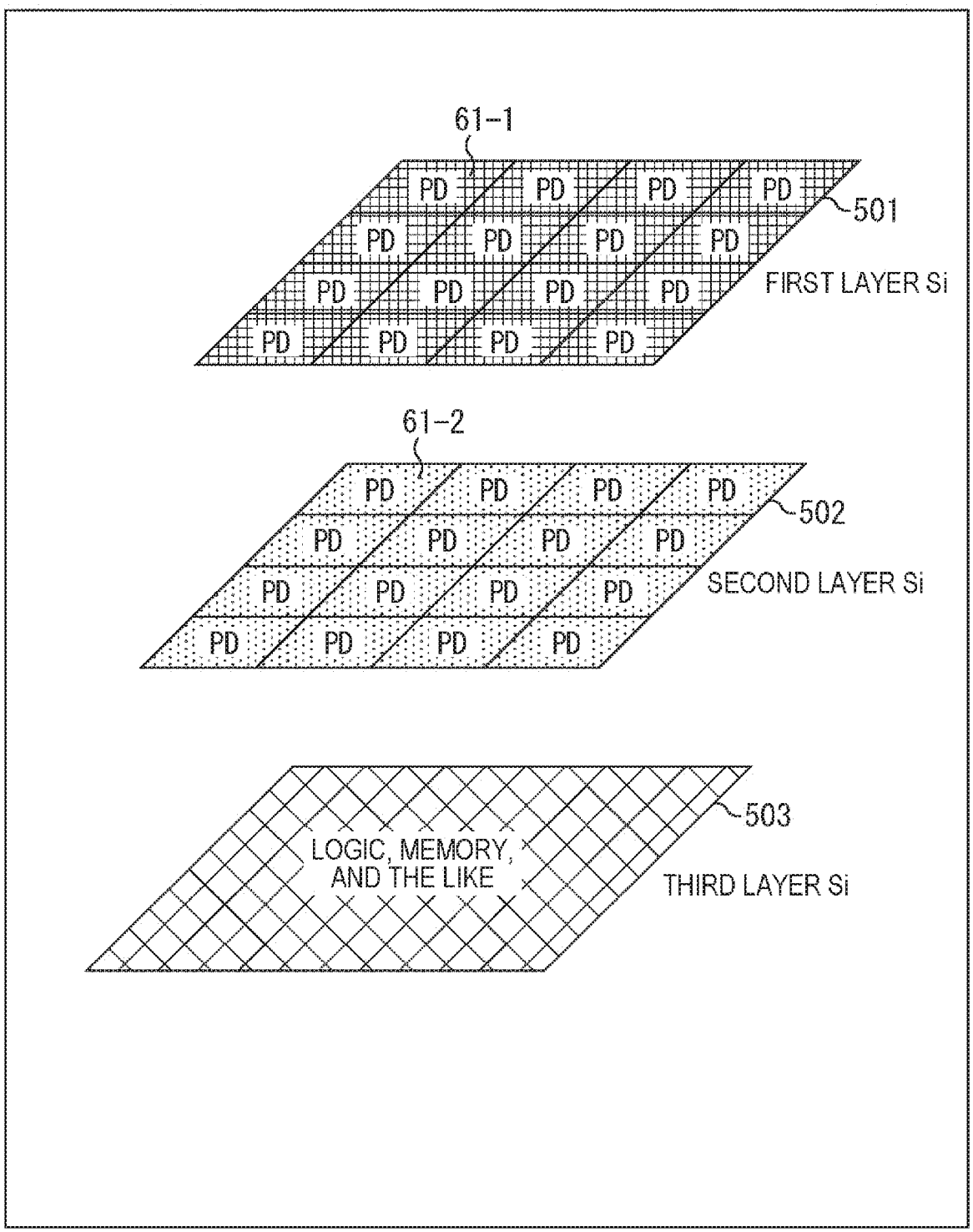
FIG. 45 is views for describing a stacked structure.

In the stacked structure illustrated in FIG. 45, the upper semiconductor substrate 501 is a semiconductor substrate in which the photodiodes 61-1 are formed in an array, the lower semiconductor substrate 502 is also a semiconductor substrate in which the photodiodes 61-2 are formed in an array, as in the upper semiconductor substrate 501, and the third semiconductor substrate 503 is a semiconductor substrate in which the logic circuit, the memory, and the like are formed.

According to the stacked structure illustrated in FIG. 45, the logic circuit is arranged in the third semiconductor substrate 503, so that only the photodiodes 61-2 can be arranged in the second semiconductor substrate 502. Therefore, the area of the photodiodes 61-2 in the second layer can be made large. With the increase in the area of the photodiodes 61-2, the sensitivity and resolution can be improved.

Furthermore, the logic circuit and the memory are arranged in the third semiconductor substrate, the area where the logic circuit and the memory are arranged can be made large, and the logic circuit and the memory can be easily mounted.

Note that, here, the description has been given using the three layers as an example. However, the present technology can be applied to four, five, or more multilayer.

Still another stacked structure will be described. The stacked structure illustrated in FIG. 46 is similar to the stacked structure illustrated in FIG. 43 in forming the upper semiconductor substrate 501 and the lower semiconductor substrate 502 in two layers, but are different in arrangement positions of the photodiodes 61-2 of the second lower semiconductor substrate 502.

Figure 46:
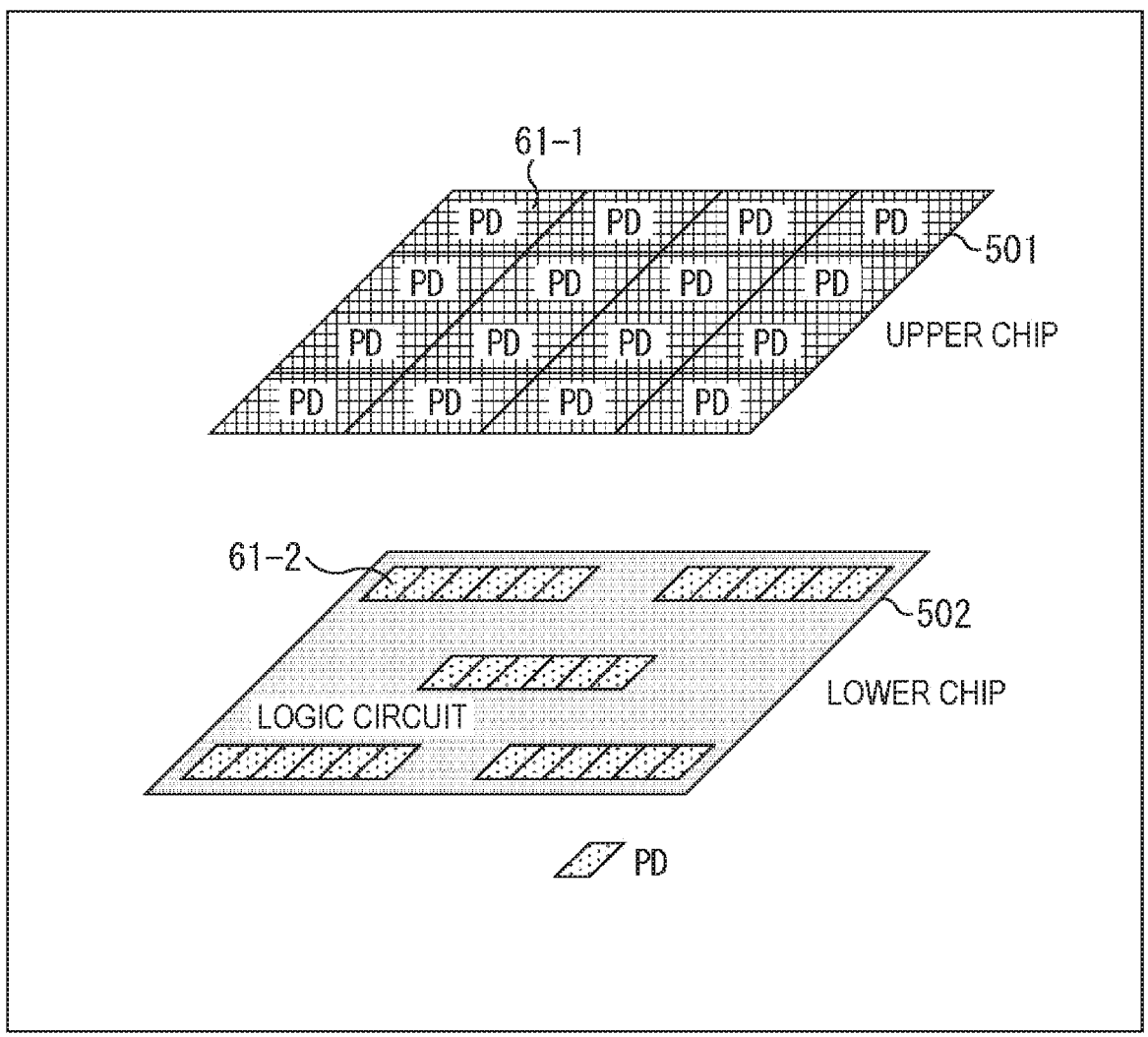
FIG. 46 is views for describing a stacked structure.

The logic circuit and the photodiodes 61-2 are mixedly mounted in the lower semiconductor substrate 502 illustrated in FIG. 46. The photodiodes 61-2 are discretely arranged for every several pixels in the lower semiconductor substrate 502. In the example illustrated in FIG. 46, six pixels (the photodiodes 61-2 for six pixels) are arranged in the horizontal direction in a center portion, and six pixels (the photodiodes 61-2 for six pixels) are arranged in the horizontal direction in an upper left direction, an upper right direction, a lower left direction, and a lower right direction.

In this manner, pixel arrangement such as the center portion or the peripheral portion at which information of a necessary portion can be acquired can be adopted. In the example illustrated in FIG. 46, a one-dimensional sensor in which the photodiodes 61-2 are arranged in a horizontal line is taken as an example, but a one-dimensional sensor in which the photodiodes 61-2 are arranged in the vertical direction can be adopted.

Furthermore, the photodiodes 61-2 may be arranged in the vertical direction and the horizontal direction to function as a two-dimensional sensor. The arrangement of the photodiodes 61-2 in the lower semiconductor substrate 502 is an example and may be modified as necessary. The arrangement is not limited to that illustrated in FIG. 46.

By changing the arrangement of the photodiodes 61-2, information of a desired region (image height) can be obtained. Furthermore, the photodiodes 61-2 can be appropriately arranged according to an application.

Even in the example illustrated in FIG. 46, a stacked structure of two or more layers, such as three layers or four layers may be adopted, and a semiconductor substrate in which a logic circuit, a memory, and the like are mounted may be further stacked on a lower layer of the lower semiconductor substrate 502.

Figure 47:
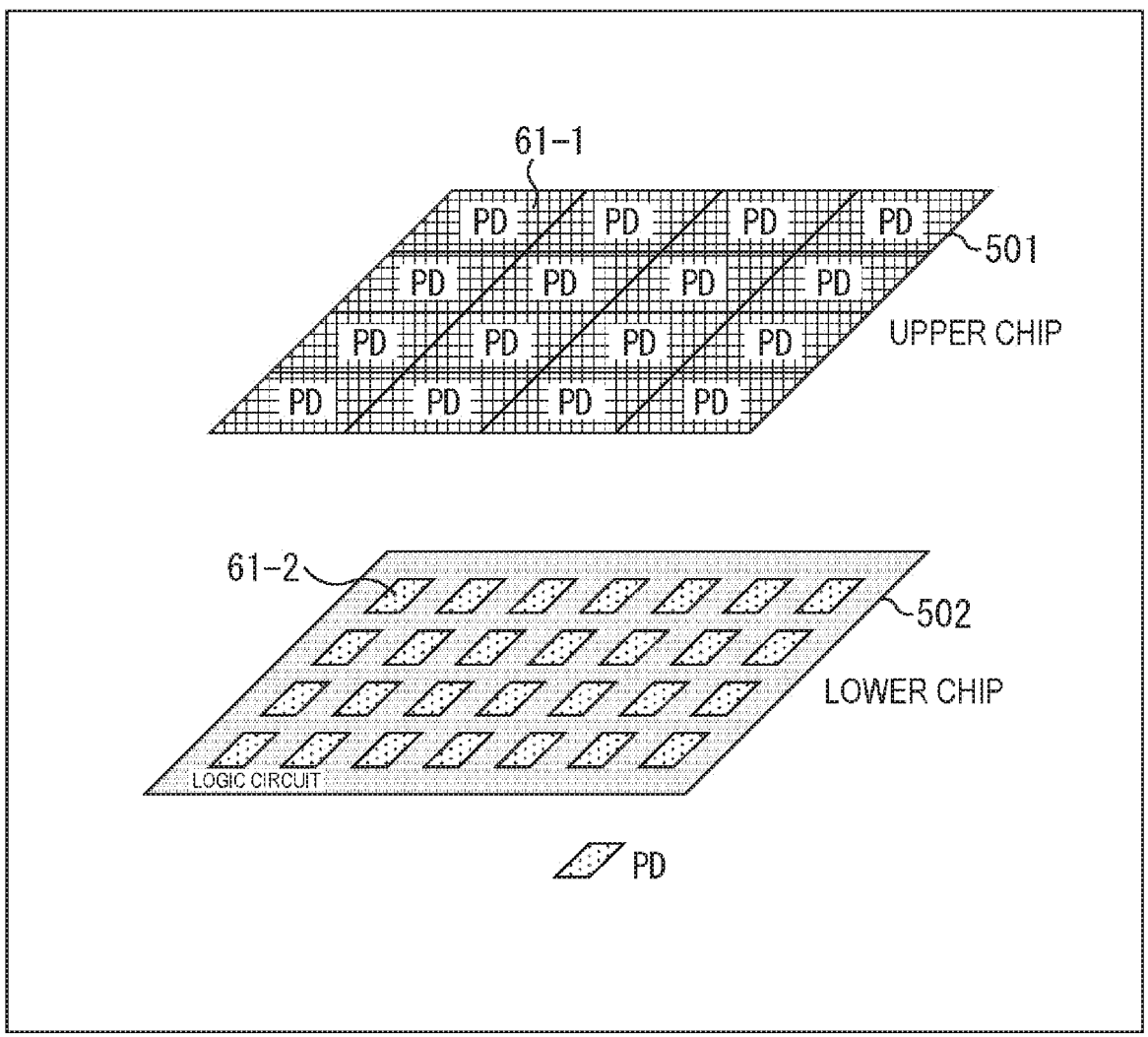
FIG. 47 is views for describing a stacked structure.

Another example of the case of discretely arranging the photodiodes 61-2 in the lower semiconductor substrate 502 is illustrated in FIG. 47. In the example of discretely arranging the photodiodes 61-2 in the lower semiconductor substrate 502 illustrated in FIG. 46 above, local arrangement has been described as an example. However, the photodiodes 61-2 arranged in the lower semiconductor substrate 502 illustrated in FIG. 47 are discretely and uniformly arranged.

In the example illustrated in FIG. 47, pixels (photodiodes 61-2) are discretely arranged one by one in the lower semiconductor substrate 502. In the case of arranging the photodiode 61-2 in this manner, thinned image information can be obtained on the entire screen.

The application range of the present technology is not limited to the case where the pixels are discretely arranged one by one, as illustrated in FIG. 47. For example, the pixels may be discretely and uniformly arranged for every plurality of pixels, such as 1×2 pixels, 2×2 pixels, 3×3 pixels, or the like.

Furthermore, by changing the arrangement of the photodiodes 61-2, as in the case of the stacked structure illustrated in FIG. 46, information of a desired region (image height) can be obtained. Furthermore, the photodiodes 61-2 can be appropriately arranged according to an application.

In the case of configuring the pixel 51 in the stacked structure as described above, there is a possibility that light enters the logic circuit or the memory arranged in the lower semiconductor substrate 502, and operation of the logic circuit or the memory is affected. Furthermore, there is also a possibility that light is reflected on a metal portion configuring the logic circuit or the memory, and such reflected light may become a cause of stray light.

Figure 48:
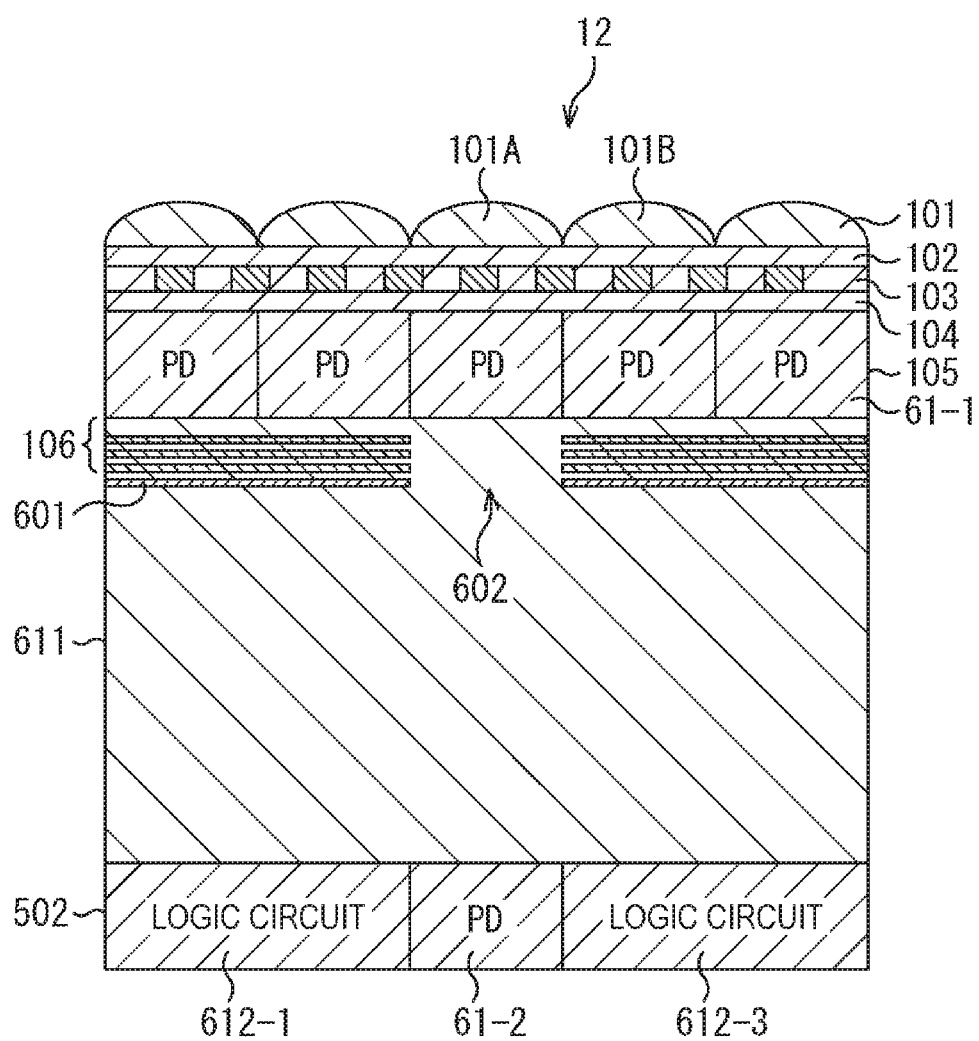
FIG. 48 is a view for describing a light-shielding structure in a stacked structure.
Figure 49:
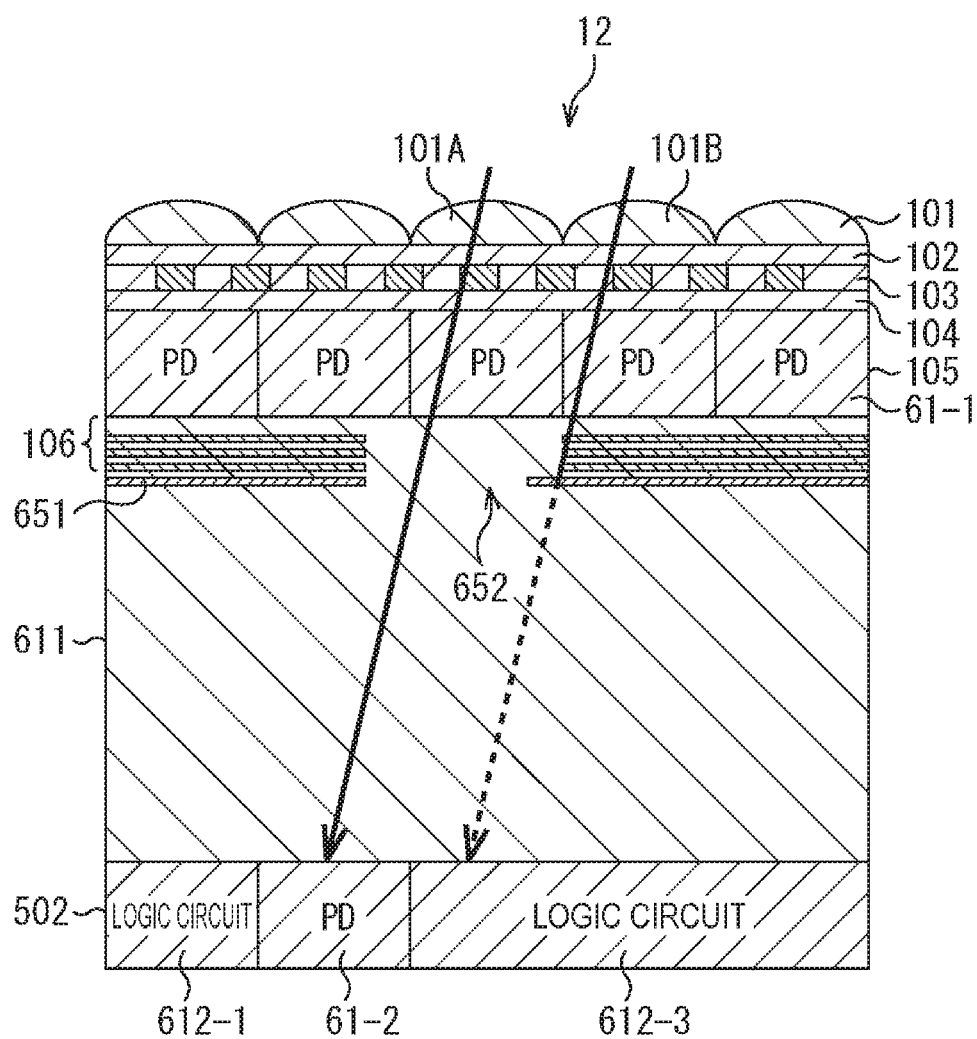
FIG. 49 is a view for describing a light-shielding structure in a stacked structure.

Therefore, configurations of the imaging element 12 including a light-shielding unit for shielding light to the logic circuit or the memory is illustrated in FIGS. 48 and 49. FIG. 48 illustrates a configuration of the imaging element 12 formed at an image height center (0%) or at a portion where the incident light is substantially perpendicularly incident. FIG. 49 illustrates a configuration of the imaging element 12 formed at a portion other than the image height center (0%) or at a portion where the incident light is obliquely incident.

The basic configuration of the imaging element 12 illustrated in FIG. 48 is similar to that of the imaging element 12 illustrated in FIG. 3, and an on-chip microlens 101, an interlayer film 102, a narrow band filter layer 103, an interlayer film 104, a photoelectric conversion element layer 105, and a wiring layer 106 are stacked in an upper portion. It is assumed that the above configuration is arranged in the upper semiconductor substrate 501.

An aperture 601 is arranged below the upper semiconductor substrate 501. The aperture 601 is arranged in a right and left symmetric manner. Furthermore, a photodiode 61-2 formed in the lower semiconductor substrate 502 is arranged immediately below an opening 602 of the aperture 601. In the embodiment illustrated in FIG. 48, the upper semiconductor substrate 501 and the lower semiconductor substrate 502 are joined (bonded) via an interlayer film 611.

The photodiode 61-2 is arranged near the center of the lower semiconductor substrate 502, and a logic circuit 612-1 and a logic circuit 612-2 are arranged on both sides of the photodiode 61-2.

In such an imaging element 12, each photodiode 61-1 included in the photoelectric conversion element layer 105 receives light transmitted through the on-chip microlens 101.

The wiring layer of the wiring layer 106 includes wiring configured using copper or the like. The wiring layer 106 can also be configured to function as a light-shielding film together with the aperture 601. As illustrated in FIG. 48, in a case where the on-chip microlens 101 illustrated in the center portion in FIG. 48 is an on-chip microlens 101A, light transmitted through the on-chip microlens 101A passes through the opening 602 of the aperture 601 and is received by the photodiode 61-2.

Meanwhile, light from an on-chip microlens 101 different from the on-chip microlens 101A, for example, an on-chip microlens 101B on the right of the on-chip microlens 101A is not transmitted through the aperture 601 and is not incident on the logic circuits 612-1 and 612-2.

Light-shielding is performed by the aperture 601 so that the light transmitted through one on-chip microlens 101 is received by the photodiode 61-2 of the lower semiconductor substrate 502 and is not incident on the logic circuit 612.

Next, the configuration of the imaging element 12 formed at a portion other than the image height center (0%) or at a portion where the incident light is obliquely incident will be described with reference to FIG. 49. The imaging element 12 illustrated in FIG. 49 and the imaging element 12 illustrated in FIG. 48 have basically a similar configuration but are different in the position, size, shape, and the like of the opening 602 of the aperture 601. Here, the aperture 601 in FIG. 49 is described as an aperture 651 to be distinguished from the aperture 601 of the imaging element 12 in FIG. 48, and the opening 602 is also described as an opening 652.

The aperture 651 illustrated in FIG. 49 is arranged in a right and left asymmetric manner. The opening 652 of the aperture 651 illustrated in FIG. 49 is formed at a position extending over two pixels. In the imaging element 12 illustrated in FIG. 49, light incident through the on-chip microlens 101A in the oblique direction as illustrated by the arrow in FIG. 49 is received by the photodiode 61-1 included in the photoelectric conversion element layer 105 of the upper semiconductor substrate 501, and the light transmitted through the photodiode 61-1 is further received by the photodiode 61-2 formed in the lower semiconductor substrate 502.

As described above, the photodiode 61-2 is formed at a position where the photodiode 61-2 can receive the light from the oblique direction and at a position not immediately below the opening 652 of the aperture 651.

Meanwhile, the light incident through the on-chip microlens 101B from the oblique direction, as illustrated by the arrow in FIG. 49, is received by the photodiode 61-1 included in the photoelectric conversion element layer 105 of the upper semiconductor substrate 501. If the apertures 651 are not asymmetrically arranged, the light transmitted through the photodiode 61-1 is incident on the logic circuit unit 612-2, as indicated by the dotted arrow in FIG. 49.

However, since the aperture 652 is asymmetrically arranged, as illustrated in FIG. 49, the light transmitted through the photodiode 61-1 is shielded by the aperture 651 and can be prevented from entering the logic circuit unit 612-2.

The apertures 601 and 651 can be formed together when forming the wiring in the wiring layer 106 of the upper semiconductor substrate 501. Furthermore, the apertures 601 and 651 may be formed as layers different from the wiring layer 106. Furthermore, the apertures 601 and 651 can be formed as a part of the wiring of the wiring layer 106.

As described above, by changing the aperture 601 or the aperture 651 according to the image height, or by changing the position of the photodiode 61-2 in the lower semiconductor substrate 502, the configuration to prevent entry of light into the logic circuit 612 can be obtained. Furthermore, reflection on the metal portion configuring the logic circuit 612 can also be prevented. Therefore, adverse effects due to stray light can be reduced.

<Structure with Stacked Thermal Sensor>

In the above-described embodiment, the case where the photodiodes 61 are stacked has been described as an example. However, a structure in which a sensor other than the photodiodes 61 is stacked can be adopted. Here, a case where a thermal sensor is stacked will be described as an example.

Figure 50:
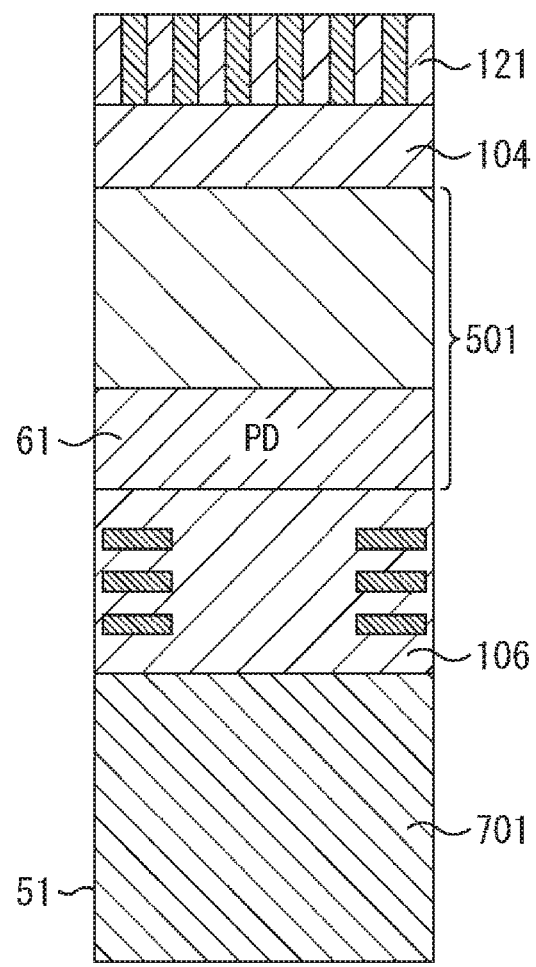
FIG. 50 is a view illustrating a configuration example of a pixel in which a thermal sensor is stacked.

FIG. 50 is a view illustrating a configuration example of the pixel 51 in a case of stacking a thermal sensor 701. The configuration of the pixel 51 illustrated in FIG. 50 is a configuration in which a plasmon filter 121, an interlayer film 104, an upper semiconductor substrate 501, a wiring layer 106, and a thermal sensor 701 are stacked in order from the top. Furthermore, the photodiode 61 is formed in the upper semiconductor substrate 501. Note that, in FIG. 50, the on-chip microlens 101 in an upper layer and the like are omitted.

The pixel 51 illustrated in FIG. 50 has a configuration in which the thermal sensor 701 is stacked in a portion where the lower semiconductor substrate 502 of the pixel 51 illustrated in FIGS. 42A, 42B, and 42C has been stacked, for example.

Figure 51C:
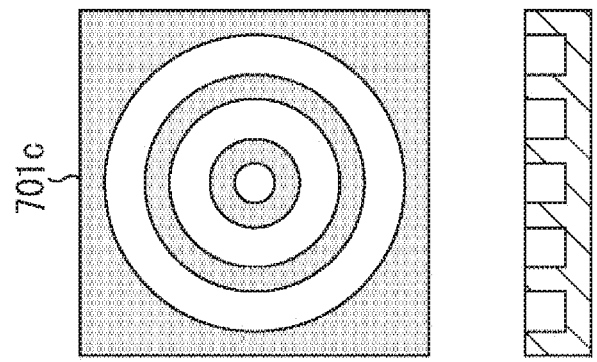
FIGS. 51A, 51B, and 51C are views for describing a shape of the thermal sensor.
Figure 51B:
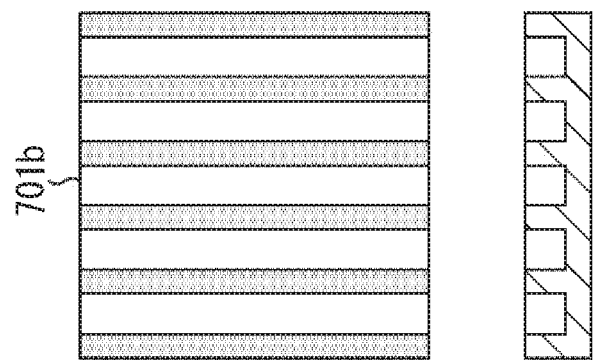
Figure 51A:
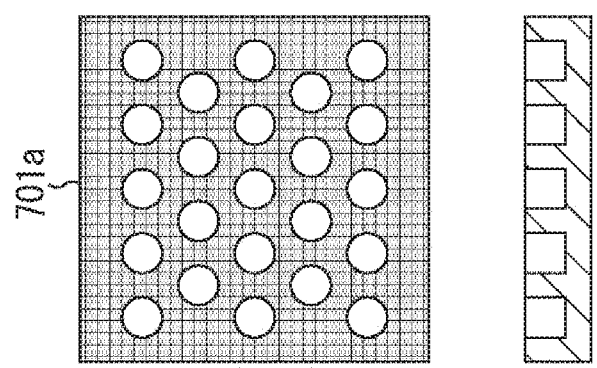

The MEMS-type thermal sensor 701 detects the temperature by measuring electromotive force according to a temperature difference between two types of metal contacts, such as a sensor in which thermocouples are connected in series to form a thermopile. Here, structures of the thermal sensor 701 including a plasmon absorber and utilizing plasmon resonance are illustrated in FIGS. 51A, 51B, and 51C. Each of thermal sensors 701a to 701c illustrated in FIGS. 51A, 51B, and 51C illustrate a case where a shape similar to a shape of the plasmon filter 121 is applied.

The thermal sensor 701a illustrated in FIG. 51A is a thermal sensor 701a in a case where a shape similar to the shape of the hole array-type plasmon filter 121 is applied. The thermal sensor 701b illustrated in FIG. 51B is a thermal sensor 701b in a case where a shape similar to the shape of the plasmon filter 151 using GMR is applied. The thermal sensor 701c illustrated in FIG. 51C is a thermal sensor 701c in a case where a shape similar to the shape of the plasmon filter 171 having the bullseye structure is applied.

In the case where the thermal sensor 701 is the thermal sensor 701 using plasmon resonance, for example, the hole array-type plasmon filter 121 has holes penetrating therethrough, whereas the thermal sensor 701a has no penetration holes, as illustrated in FIG. 51A, which is different.

The thermal sensor 701a illustrated in FIG. 51A has periodically arranged circular holes but the shape of the holes may an ellipse other than circles, a polygon such as a triangle or a square, a cross, or a star, for example. Furthermore, the circular holes are arranged to be located at vertices of triangles but may be arranged in a square array as long as the structure is a periodic structure. In this case, a wavelength to be absorbed can be changed by changing the pitch between the holes, as in the case of the plasmon filter 121 (FIG. 4).

Furthermore, in the thermal sensor 701b illustrated in FIG. 51B, a linear groove is periodically formed, and in the thermal sensor 701c illustrated in FIG. 51C, a concentric groove is formed. In the cases, a wavelength to be absorbed can be changed by changing the cycle of the groove, as in the case of the plasmon filter 151 (FIG. 14).

Furthermore, an asymmetrical shape can be used. In the case of using an asymmetrical shape, polarization characteristics can also be obtained at the same time. Furthermore, copper or gold can be used as a material configuring the thermal sensor 701, and copper coated with gold can be used. As the material configuring the thermal sensor 701, a material other than copper or gold may be used.

Although not illustrated in FIGS. 51A, 51B, and 51C, a hot junction is formed at one end of the thermal sensor 701, and a cold junction is formed at a side opposite to a terminal drawn from the hot junction. The hot junction and the cold junction are formed on the thermal sensor 701, thereby operating as a thermal sensor.

Referring back to FIG. 50 again. The pixel 51 includes the plasmon filter 121 and the thermal sensor 701 using plasmon resonance. The light transmitted through the plasmon filter 121 is received by the photodiode 61 formed in the upper semiconductor substrate 501. As will be described below with reference to FIGS. 52A 52B, and 52C, the photodiode 61 is formed at a position suitable for the transmission wavelength of the plasmon filter 121, as in the above-described cases.

Part of the light received by the photodiode 61 passes through the photodiode 61, further passes through the wiring layer 106, and reaches the thermal sensor 701. Light on a long wavelength side is incident on the thermal sensor 701. Therefore, in the case where the thermal sensor 701 has, for example, the shape of the hole array-type plasmon filter 121, a pitch between holes suitable for receiving the light on the long wavelength side is set.

Thus, the wavelength transmitted through the plasmon filter 121 and the wavelength absorbed by the thermal sensor 701 are different wavelengths. Therefore, if both the plasmon filter 121 and the thermal sensor 701 are formed in a hole array type, the plasmon filter 121 and the thermal sensor 701 have different intervals between holes.

In the pixel 51 including the plasmon filter 121 and the thermal sensor 701 as illustrated in FIG. 50, the position of the photodiode 61 can be set to a position suitable for the transmission wavelength of the plasmon filter 121, as in the above-described embodiment. An example of the pixel 51 having such a configuration is illustrated in FIGS. 52A, 52B, and 52C.

Figure 52A:
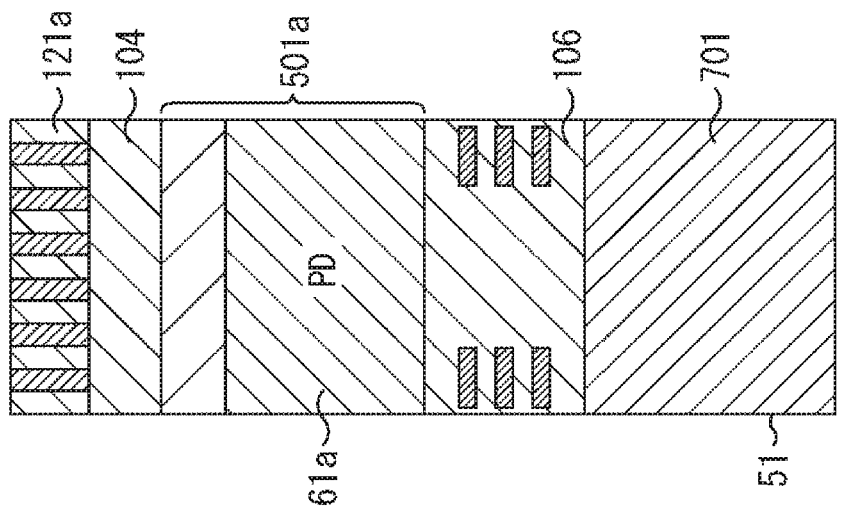
FIGS. 52A, 52B, and 52C are views illustrating a configuration example of a pixel in which a thermal sensor is stacked.
Figure 52B:
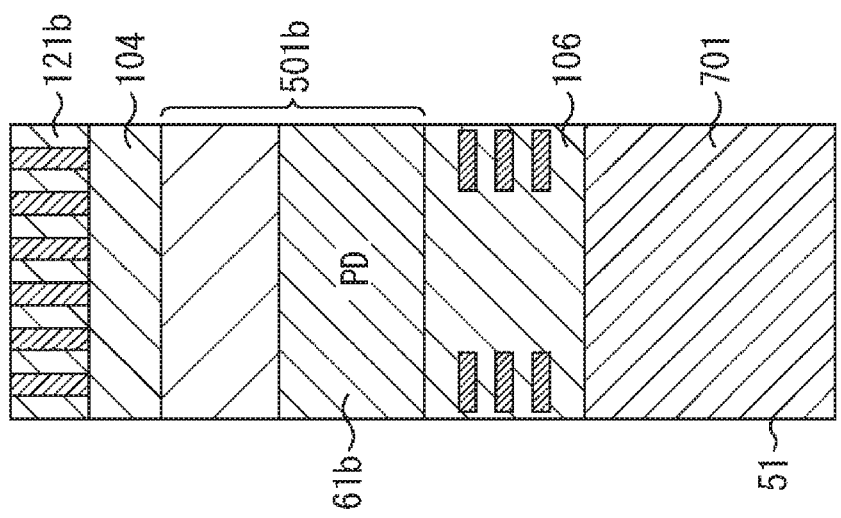
Figure 52C:
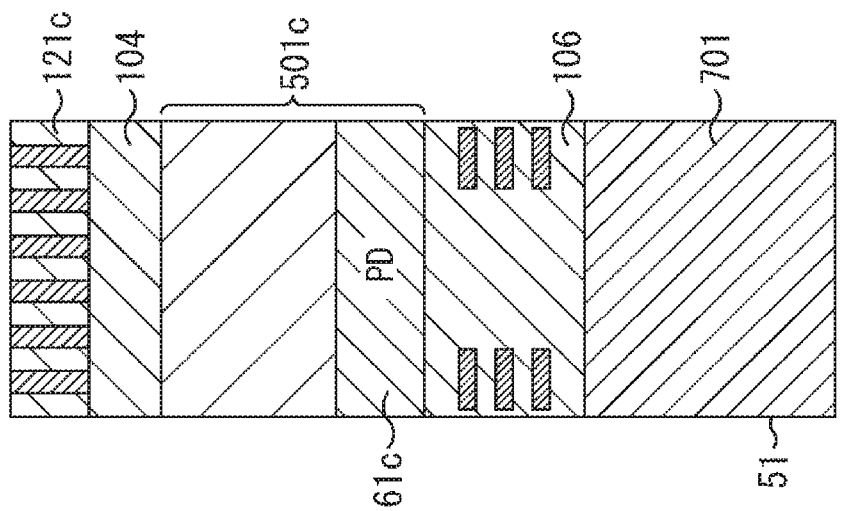

FIGS. 52A, 52B, and 52C are views illustrating configurations of examples of the pixels 51 formed using a plurality of semiconductor substrates and including the thermal sensor 701 in a lower layer. FIGS. 52A, 52B, and 52C illustrate configuration examples of the pixels 51 having the configuration including the upper semiconductor substrate 501 and the thermal sensor 701. Basic configurations of pixels 51a to 51c illustrated in FIGS. 52A, 52B, and 52C are the same but depths at which photodiodes 61a to 61c are formed are different.

The basic configuration of the pixels 51a to 51c illustrated in FIGS. 52A, 52B, and 52C is a configuration in which a plasmon filter 121, an interlayer film 104, an upper semiconductor substrate 501, a wiring layer 106, and a thermal sensor 701 are stacked in order from the top. Furthermore, the photodiode 61 is formed in the upper semiconductor substrate 501. Note that, in FIGS. 52A, 52B, and 52C, the on-chip microlens 101 in an upper layer and the like are omitted.

In the pixel 51a illustrated in FIG. 52A, the photodiode 61a is formed at the position suitable for the transmission wavelength of the plasmon filter 121a in the upper semiconductor substrate 501a.

In the pixel 51b illustrated in FIG. 52B, the photodiode 61b is formed at the position suitable for the transmission wavelength of the plasmon filter 121b in the upper semiconductor substrate 501b.

In the pixel 51c illustrated in FIG. 52C, the photodiode 61c is formed at the position suitable for the transmission wavelength of the plasmon filter 121c in the upper semiconductor substrate 501c.

Since the plasmon filter 121a, the plasmon filter 121b, and the plasmon filter 121c are filters in which the transmission wavelength shifts to the longer wavelength side in this order, the depth of the photodiode 61a, the depth of the photodiode 61b, and the depth of the photodiode 61c are formed to be deeper in this order.

As described above, since the photodiode 61 formed in the upper semiconductor substrate 501 is formed at the position suitable for the transmission wavelength of the plasmon filter 121, as in the above-described embodiment, light having a desired wavelength can be efficiently received.

Furthermore, by forming the thermal sensor 701 into a shape that causes plasmon resonance on the long wavelength side, the thermal sensor 701 receives light on the long wavelength side, which has been transmitted through the plasmon filter 121, the photodiode 61, the wiring layer 106, and the like, and can function as a thermal sensor.

Note that, here, the description has been made using the MEMS-type thermal sensor 701 using plasmon resonance as an example. However, a sensor having a thermopile or a sensor using the Seebeck effect may be used other than the thermal sensor using plasmon resonance, for example.

Furthermore, the thermal sensor 701 may be a vacuum-sealed chip. By being vacuum-sealed, the thermal sensor 701 can prevent leakage of heat and can be a thermal sensor with high sensitivity.

As described above, by forming the photodiode at the position in the silicon suitable for the transmission wavelength of the plasmon filter, using the facts that silicon mainly absorbs a visible light region, and the light on a shorter wavelength side is absorbed on the silicon surface layer and the light on a longer wavelength side reaches a deeper layer of the silicon, the color mixture can be suppressed and the sensitivity can be improved.

Furthermore, by using the characteristics of the plasmon filter and forming the photodiode at the position suitable for the characteristics, the wavelength resolution can be improved.

<Application Example to Endoscopic Surgical System>

Furthermore, for example, the technology (present technology) according to the present disclosure may be applied to an endoscopic surgical system.

Figure 53:
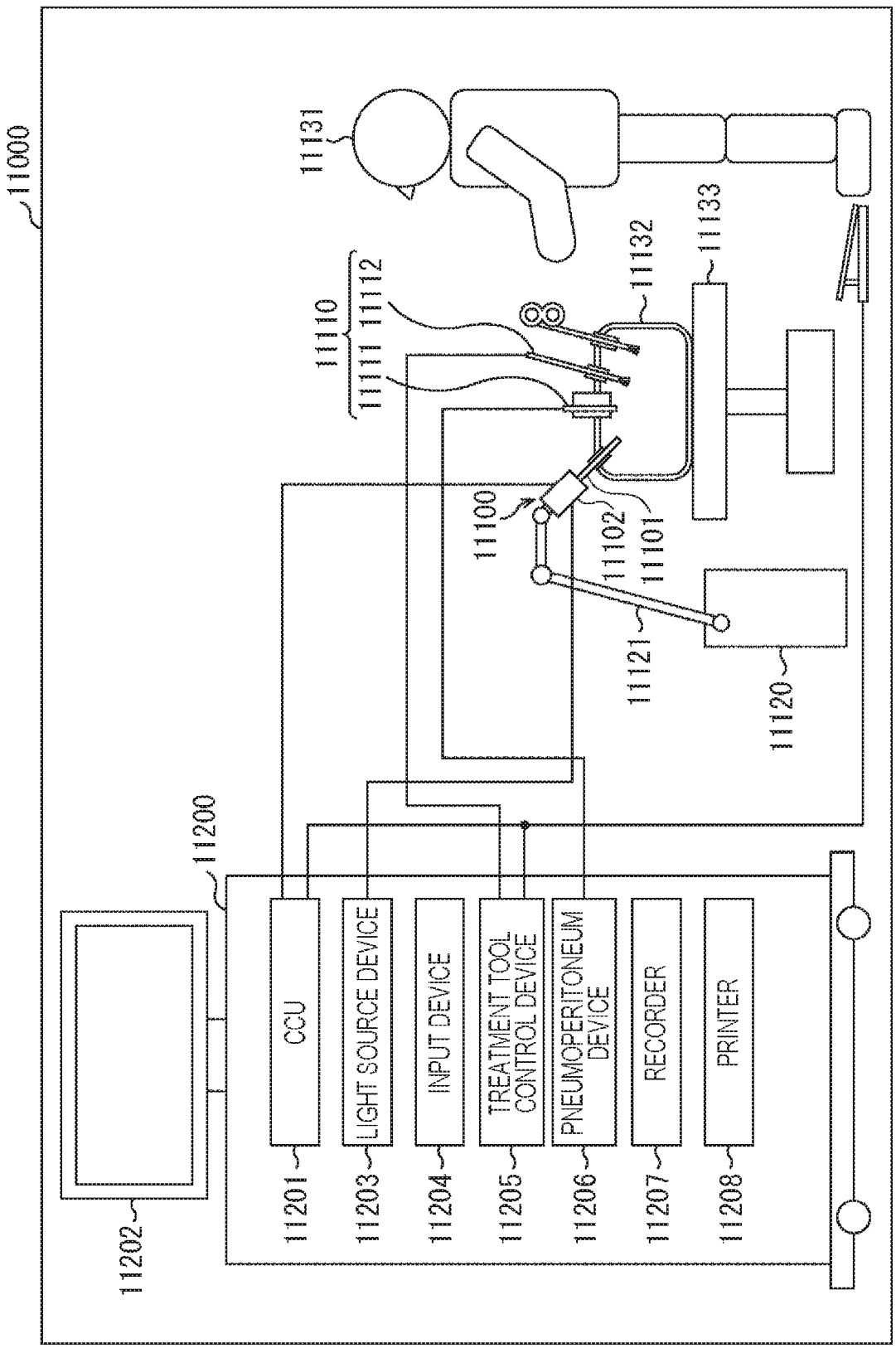

FIG. 53 is a diagram illustrating an example of a schematic configuration of an endoscopic surgical system to which the technology according to the present disclosure (present technology) is applicable.

FIG. 53 illustrates a state in which an operator (surgeon) 11131 is performing surgery for a patient 11132 on a patient bed 11133, using the endoscopic surgical system 11000. As illustrated in FIG. 53, the endoscopic surgical system 11000 includes an endoscope 11100, other surgical instruments 11110 such as a pneumoperitoneum tube 11111 and an energy treatment tool 11112, a support arm device 11120 that supports the endoscope 11100, and a cart 11200 on which various devices for endoscope surgery are mounted.

The endoscope 11100 includes a lens-barrel 11101 and a camera head 11102. A region having a predetermined length from a distal end of the lens-barrel 11101 is inserted into a body cavity of the patient 11132. The camera head 11102 is connected to a proximal end of the lens-barrel 11101. FIG. 37 illustrates the endoscope 11100 configured as so-called a hard endoscope including the hard lens-barrel 11101. However, the endoscope 11100 may be configured as so-called a soft endoscope including a soft lens-barrel.

An opening portion in which an object lens is fit is provided in the distal end of the lens-barrel 11101. A light source device 11203 is connected to the endoscope 11100, and light generated by the light source device 11203 is guided to the distal end of the lens-barrel 11101 by a light guide extending inside the lens-barrel 11101 and an observation target in the body cavity of the patient 11132 is irradiated with the light through the object lens. Note that the endoscope 11100 may be a forward-viewing endoscope, may be an oblique-viewing endoscope, or may be a side-viewing endoscope.

An optical system and an imaging element are provided inside the camera head 11102, and reflected light (observation light) from the observation target is condensed to the imaging element by the optical system. The observation light is photoelectrically converted by the imaging element, and an electrical signal corresponding to the observation light, in other words, an image signal corresponding to an observed image is generated. The image signal is transmitted to a camera control unit (CCU) 11201 as raw data.

The CCU 11201 includes a central processing unit (CPU), a graphics processing unit (GPU), and the like, and generally controls an operation of the endoscope 11100 and a display device 11202. Moreover, the CCU 11201 receives the image signal from the camera head 11102, and applies various types of image processing for displaying an image based on the image signal, such as developing processing (demosaicing processing) or the like, to the image signal.

The display device 11202 displays the image based on the image signal to which the image processing has been applied by the CCU 11201, by control of the CCU 11201.

The light source device 11203 includes a light source such as a light emitting diode (LED) for example, and supplies irradiation light to the endoscope 11100 in capturing an operation portion or the like.

An input device 11204 is an input interface for the endoscopic surgical system 11000. A user can input various types of information and instructions to the endoscopic surgical system 11000 through the input device 11204. For example, the user inputs an instruction to change imaging conditions (a type of irradiation light, a magnification, a focal length, and the like) by the endoscope 11100, and the like.

A treatment tool control device 11205 controls drive of the energy treatment tool 11112, for cauterizing or incising a tissue, sealing a blood vessel, and the like. A pneumoperitoneum device 11206 sends a gas into the body cavity of the patient 11132 through the pneumoperitoneum tube 11111 to expand the body cavity for the purpose of securing a field of vision by the endoscope 11100 and a work space for the operator. A recorder 11207 is a device that can record various types of information regarding the surgery. A printer 11208 is a device that can print the various types of information regarding the surgery in various formats such as a text, an image, and a graph.

Note that the light source device 11203 that supplies the irradiation light in capturing the operation portion to the endoscope 11100 can be configured from a white light source configured from an LED, a laser light source, or a combination of the LED and the laser light source, for example. In a case where the white light source is configured from a combination of RGB laser light sources, output intensity and output timing of the respective colors (wavelengths) can be controlled with high accuracy. Therefore, adjustment of white balance of the captured image can be performed in the light source device 11203. Furthermore, in this case, the observation target is irradiated with the laser light from each of the RGB laser light sources in a time division manner, and the drive of the imaging element of the camera head 11102 is controlled in synchronization with the irradiation timing, so that images respectively corresponding to RGB can be captured in a time division manner. According to the method, a color image can be obtained without providing a color filter to the imaging element.

Furthermore, drive of the light source device 11203 may be controlled to change intensity of light to be output every predetermined time. The drive of the imaging element of the camera head 11102 is controlled in synchronization with change timing of the intensity of light and images are acquired in a time division manner, and the images are synthesized, so that a high-dynamic range image without so-called clipped blacks and flared highlights can be generated.

Furthermore, the light source device 11203 may be configured to be able to supply light in a predetermined wavelength band corresponding to special light observation. In the special light observation, for example, so-called narrow band imaging is performed by radiating light in a narrower band than the irradiation light (in other words, white light) at the time of normal observation, using wavelength dependence of absorption of light in a body tissue, to capture a predetermined tissue such as a blood vessel in a mucosal surface layer at high contrast. Alternatively, in the special light observation, fluorescence imaging may be performed to obtain an image by fluorescence generated by radiation of exciting light. In the fluorescence imaging, irradiating the body tissue with exciting light to observe fluorescence from the body tissue (self-fluorescence observation), or injecting a reagent such as indocyanine green (ICG) into the body tissue and irradiating the body tissue with exciting light corresponding to a fluorescence wavelength of the reagent to obtain a fluorescence image, for example, can be performed. The light source device 11203 can be configured to be able to supply narrow band light and/or exciting light corresponding to such special light observation.

Figure 54:
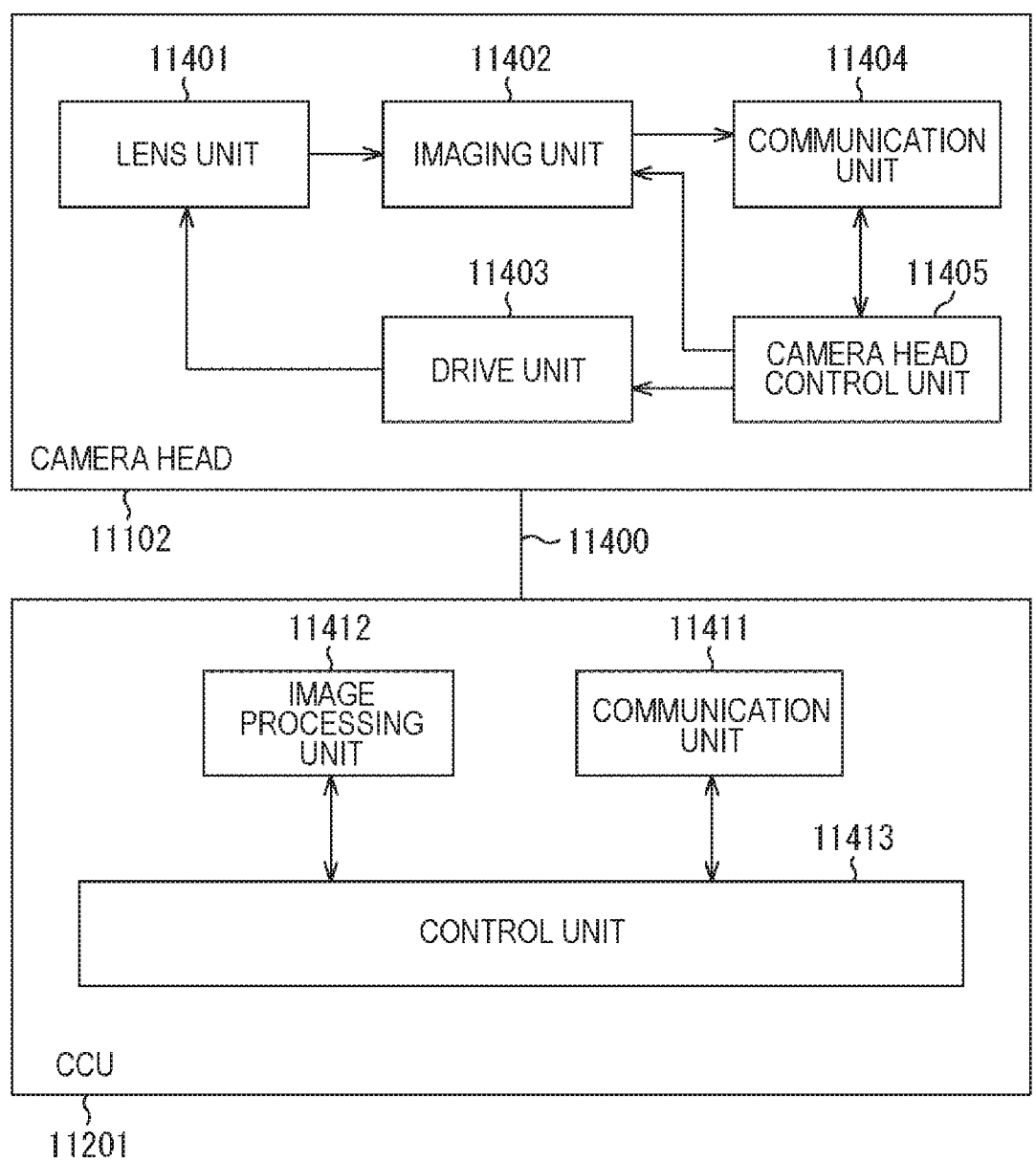

FIG. 54 is a block diagram illustrating an example of functional configurations of the camera head 11102 and the CCU 11201 illustrated in FIG. 53.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicatively connected with each other by a transmission cable 11400.

The lens unit 11401 is an optical system provided in a connection portion between the camera head 11102 and the lens-barrel 11101. Observation light taken through the distal end of the lens-barrel 11101 is guided to the camera head 11102 and enters the lens unit 11401. The lens unit 11401 is configured by a combination of a plurality of lenses including a zoom lens and a focus lens.

The imaging element that configures the imaging unit 11402 may be one imaging element (so-called single imaging element) or may be a plurality of imaging elements (so-called multiple imaging elements). In a case where the imaging unit 11402 is configured by multiple imaging elements, for example, a color image may be obtained by generating image signals respectively corresponding to RGB by the imaging elements and synthesizing the image signals. Alternatively, the imaging unit 11402 may be configured by a pair of imaging elements for respectively obtaining image signals for right eye and for left eye corresponding to three-dimensional (3D) display. With the 3D display, the operator 11131 can more accurately grasp the depth of a biological tissue in the operation portion. Note that, in a case where the imaging unit 11402 is configured by the multiple imaging elements, a plurality of systems of the lens units 11401 may be provided corresponding to the imaging elements.

Furthermore, the imaging unit 11402 may not be necessarily provided in the camera head 11102. For example, the imaging unit 11402 may be provided immediately after the object lens inside the lens-barrel 11101.

The drive unit 11403 is configured by an actuator, and moves the zoom lens and the focus lens of the lens unit 11401 by a predetermined distance along an optical axis by control of the camera head control unit 11405. With the movement, a magnification and a focal point of a captured image by the imaging unit 11402 can be appropriately adjusted.

The communication unit 11404 is configured by a communication device for transmitting or receiving various types of information to or from the CCU 11201. The communication unit 11404 transmits the image signal obtained from the imaging unit 11402 to the CCU 11201 through the transmission cable 11400 as raw data.

Furthermore, the communication unit 11404 receives a control signal for controlling drive of the camera head 11102 from the CCU 11201 and supplies the control signal to the camera head control unit 11405. The control signal includes information regarding the imaging conditions such as information for specifying a frame rate of the captured image, information for specifying an exposure value at the time of imaging, and/or information for specifying the magnification and the focal point of the captured image, for example.

Note that the imaging conditions such as the frame rate, the exposure value, the magnification, and the focal point may be appropriately specified by the user or may be automatically set by the control unit 11413 of the CCU 11201 on the basis of the acquired image signal. In the latter case, so-called an auto exposure (AE) function, an auto focus (AF) function, and an auto white balance (AWB) function are incorporated in the endoscope 11100.

The camera head control unit 11405 controls drive of the camera head 11102 on the basis of the control signal received through the communication unit 11404 from the CCU 11201.

The communication unit 11411 is configured from a communication device for transmitting or receiving various types of information to or from the camera head 11102. The communication unit 11411 receives the image signal transmitted from the camera head 11102 through the transmission cable 11400.

Furthermore, the communication unit 11411 transmits a control signal for controlling drive of the camera head 11102 to the camera head 11102. The image signal and the control signal can be transmitted through telecommunication, optical communication, or the like.

The image processing unit 11412 applies various types of image processing to the image signal as a raw data transmitted from the camera head 11102.

The control unit 11413 performs various types of control regarding imaging of the operation portion and the like by the endoscope 11100 and display of the captured image obtained through imaging of the operation portion and the like. For example, the control unit 11413 generates a control signal for controlling drive of the camera head 11102.

Furthermore, the control unit 11413 displays the captured image of the operation portion or the like in the display device 11202 on the basis of the image signal to which the image processing has been applied by the image processing unit 11412. At this time, the control unit 11413 may recognize various objects in the captured image, using various image recognition technologies. For example, the control unit 11413 can recognize a surgical instrument such as forceps, a specific living body portion, blood, mist at the time of use of the energy treatment tool 11112, or the like, by detecting a shape of an edge, a color, or the like of an object included in the captured image. The control unit 11413 may superimpose and display various types of surgery support information on the image of the operation portion, in displaying the captured image in the display device 11202. The superimposition and display, and presentation of the surgery support information to the operator 11131 can reduce a burden on the operator 11131 and enables the operator 11131 to reliably proceed with the operation.

The transmission cable 11400 that connects the camera head 11102 and the CCU 11201 is an electrical signal cable corresponding to communication of electrical signals, an optical fiber corresponding to optical communication, or a composite cable thereof.

Here, in the illustrated example, the communication has been performed in a wired manner using the transmission cable 11400. However, the communication between the camera head 11102 and the CCU 11201 may be wirelessly performed.

An example of an endoscopic surgical system to which the technology according to the present disclosure is applicable has been described. The technology according to the present disclosure is applicable to the camera head 11102 or the imaging unit 11402 of the camera head 11102, for example, of the above-described configurations. Specifically, for example, the imaging element 12 in FIG. 1 can be applied to the imaging unit 11402. By applying the technology according to the present disclosure to the imaging unit 11402, a more detailed and more precise operation portion image can be obtained. Therefore, the operator can reliably confirm the operation portion.

Note that, here, the endoscopic surgical system has been described as an example. However, the technology according to the present disclosure may be applied to microsurgery or the like, for example.

<Application Example to Moving Bodies>

Furthermore, for example, the technology according to the present disclosure may be realized as a device mounted on any type of moving bodies including an automobile, an electric automobile, a hybrid electric automobile, a motorcycle, a bicycle, a personal mobility, an airplane, a drone, a ship, a robot, and the like.

Figure 55:
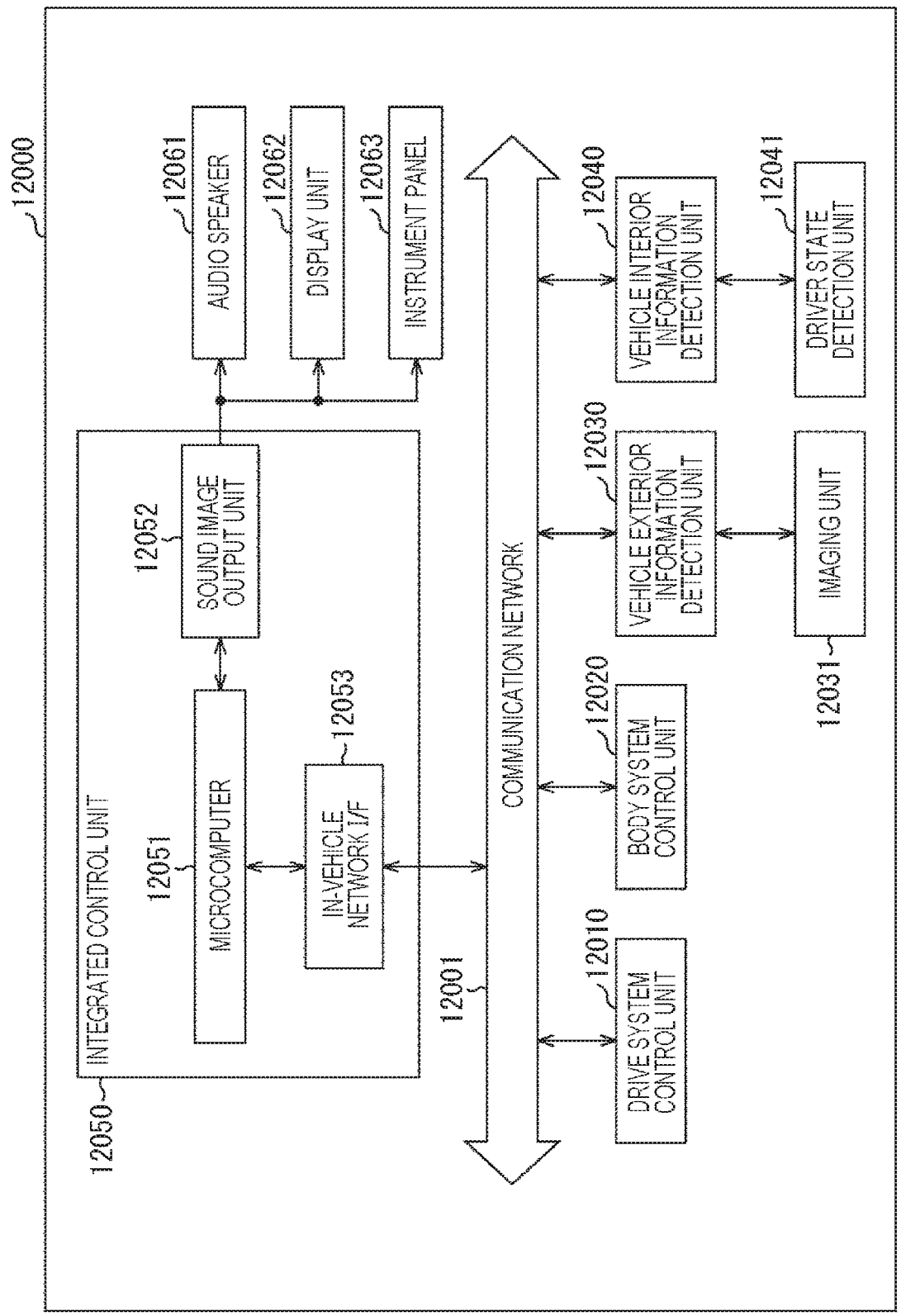

FIG. 55 is a block diagram illustrating a schematic configuration example of a vehicle control system as an example of a moving body control system to which the technology according to the present disclosure is applicable.

A vehicle control system 12000 includes a plurality of electronic control units connected through a communication network 12001. In the example illustrated in FIG. 55, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a sound image output unit 12052, and an in-vehicle network interface (I/F) 12053 are illustrated.

The drive system control unit 12010 controls operations of devices regarding a drive system of a vehicle according to various programs. For example, the drive system control unit 12010 functions as a control device of a drive force generation device for generating drive force of a vehicle, such as an internal combustion engine or a drive motor, a drive force transmission mechanism for transmitting drive force to wheels, a steering mechanism that adjusts a steering angle of a vehicle, a braking device that generates braking force of a vehicle, and the like.

The body system control unit 12020 controls operations of various devices equipped in a vehicle body according to various programs. For example, the body system control unit 12020 functions as a control device of a keyless entry system, a smart key system, an automatic window device, and various lamps such as head lamps, back lamps, brake lamps, turn signals, and fog lamps. In this case, radio waves transmitted from a mobile device substituted for a key or signals of various switches can be input to the body system control unit 12020. The body system control unit 12020 receives an input of the radio waves or the signals, and controls a door lock device, the automatic window device, the lamps, and the like of the vehicle.

The vehicle exterior information detection unit 12030 detects information outside the vehicle that mounts the vehicle control system 12000. For example, an imaging unit 12031 is connected to the vehicle exterior information detection unit 12030. The vehicle exterior information detection unit 12030 causes the imaging unit 12031 to capture an image outside the vehicle, and receives the captured image. The vehicle exterior information detection unit 12030 may perform object detection processing or distance detection processing of persons, vehicles, obstacles, signs, letters on a road surface, or the like on the basis of the received image.

The imaging unit 12031 is an optical sensor that receives light and outputs an electrical signal according to the amount of received light. The imaging unit 12031 can output the electrical signal as an image and can output the electrical signal as information of distance measurement. Furthermore, the light received by the imaging unit 12031 may be visible light or may be non-visible light such as infrared light.

The vehicle interior information detection unit 12040 detects information inside the vehicle. A driver state detection unit 12041 that detects a state of a driver is connected to the vehicle interior information detection unit 12040, for example. The driver state detection unit 12041 includes a camera that captures the driver, for example, and the vehicle interior information detection unit 12040 may calculate the degree of fatigue or the degree of concentration of the driver, or may determine whether or not the driver falls asleep on the basis of the detection information input from the driver state detection unit 12041.

The microcomputer 12051 calculates a control target value of the drive power generation device, the steering mechanism, or the braking device on the basis of the information outside and inside the vehicle acquired in the vehicle exterior information detection unit 12030 or the vehicle interior information detection unit 12040, and can output a control command to the drive system control unit 12010. For example, the microcomputer 12051 can perform cooperative control for the purpose of realizing the function of an advanced driver assistance system (ADAS) function including collision avoidance or shock mitigation of the vehicle, following travel based on an inter-vehicle distance, vehicle speed maintaining travel, collision warning of the vehicle, lane out warning of the vehicle, and the like.

Furthermore, the microcomputer 12051 controls the drive force generation device, the steering mechanism, the braking device, or the like on the basis of the information of a vicinity of the vehicle acquired in the vehicle exterior information detection unit 12030 or the vehicle interior information detection unit 12040 to perform cooperative control for the purpose of automatic drive of autonomous travel without depending on an operation of the driver or the like.

Furthermore, the microcomputer 12051 can output a control command to the body system control unit 12020 on the basis of the information outside the vehicle acquired in the vehicle exterior information detection unit 12030. For example, the microcomputer 12051 can perform cooperative control for the purpose of achievement of non-glare such as by controlling the head lamps according to the position of a leading vehicle or an oncoming vehicle detected in the vehicle exterior information detection unit 12030, and switching high beam light to low beam light.

The sound image output unit 12052 transmits an output signal of at least one of a sound or an image to an output device that can visually and aurally notify a passenger of the vehicle or an outside of the vehicle of information. In the example in FIG. 55, as the output device, an audio speaker 12061, a display unit 12062, and an instrument panel 12063 are exemplarily illustrated. The display unit 12062 may include, for example, at least one of an on-board display or a head-up display.

Figure 56:
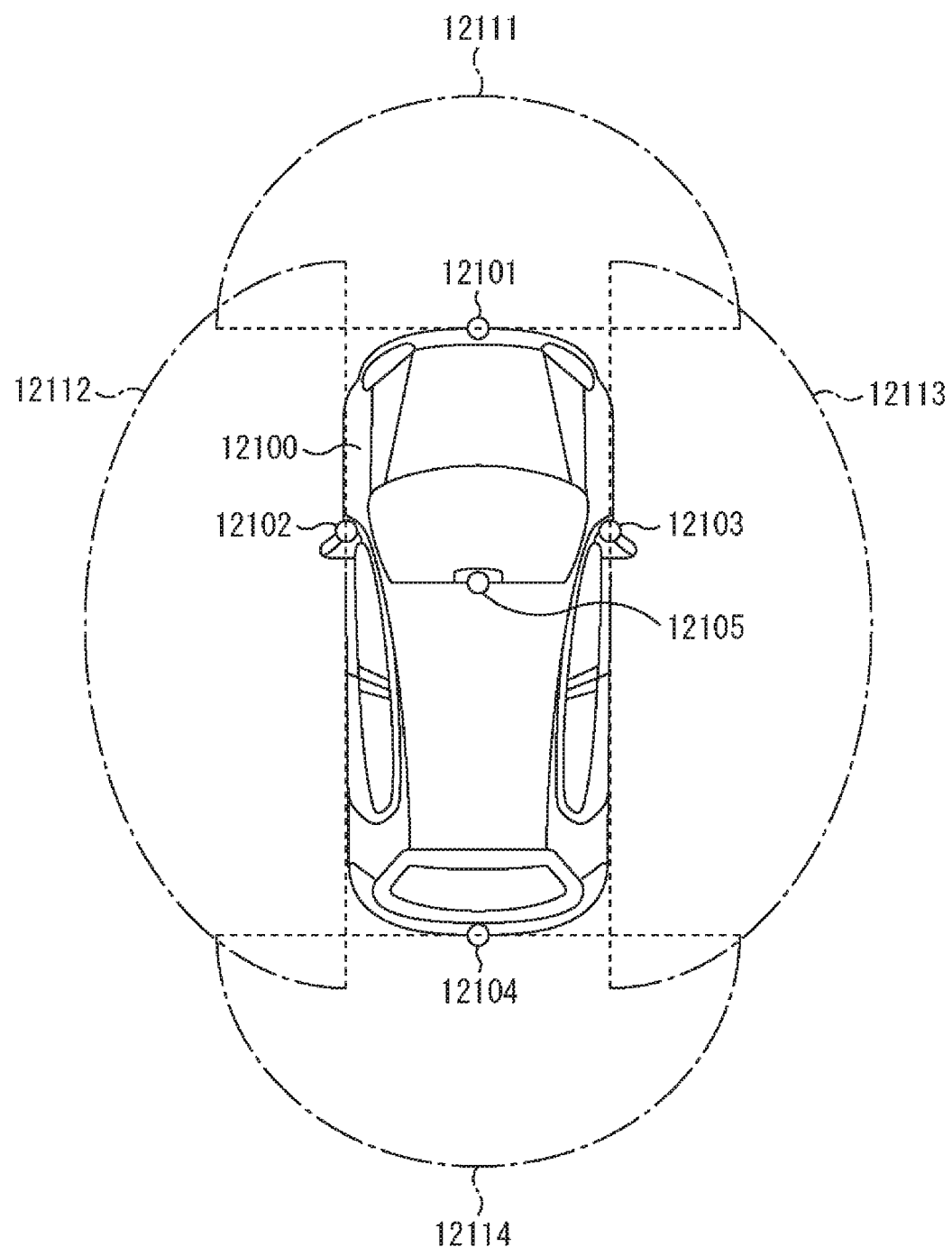

FIG. 56 is a diagram illustrating an example of an installation position of the imaging unit 12031.

In FIG. 56, imaging units 12101, 12102, 12103, 12104, and 12105 are included as the imaging unit 12031.

The imaging units 12101, 12102, 12103, 12104, and 12105 are provided at positions such as a front nose, side mirrors, a rear bumper, a back door, and an upper portion of a windshield in an interior of the vehicle 12100, for example. The imaging unit 12101 provided at the front nose and the imaging unit 12105 provided at an upper portion of the windshield in an interior of the vehicle mainly acquire front images of the vehicle 12100. The imaging units 12102 and 12103 provided at the side mirrors mainly acquire side images of the vehicle 12100. The imaging unit 12104 provided at the rear bumper or the back door mainly acquires a rear image of the vehicle 12100. The imaging unit 12105 provided at the upper portion of the windshield in the interior of the vehicle is mainly used for detecting a preceding vehicle, a pedestrian, an obstacle, a traffic signal, a traffic sign, a lane, or the like.

Note that FIG. 56 illustrates an example of capture ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposing image data captured by the imaging units 12101 to 12104.

At least one of the imaging units 12101 to 12104 may have a function to acquire distance information. For example, at least one of the imaging units 12101 to 12104 may be a stereo camera including a plurality of imaging elements or may be an imaging element having pixels for phase difference detection.

For example, the microcomputer 12051 obtains distances to three-dimensional objects in the imaging ranges 12111 to 12114 and temporal change of the distances (relative speeds to the vehicle 12100) on the basis of the distance information obtained from the imaging units 12101 to 12104, thereby to extract particularly a three-dimensional object closest to the vehicle 12100 on a traveling road and traveling at a predetermined speed (for example, 0 km/h or more) in substantially the same direction as the vehicle 12100 as a leading vehicle. Moreover, the microcomputer 12051 can set an inter-vehicle distance to be secured from the leading vehicle in advance and perform automatic braking control (including following stop control) and automatic acceleration control (including following start control), and the like. In this way, the cooperative control for the purpose of automatic drive of autonomous travel without depending on an operation of the driver or the like can be performed.

For example, the microcomputer 12051 classifies three-dimensional object data regarding three-dimensional objects into two-wheeled vehicles, ordinary cars, large vehicles, pedestrians, and other three-dimensional objects such as electric poles to be extracted, on the basis of the distance information obtained from the imaging units 12101 to 12104, and can use the data for automatic avoidance of obstacles. For example, the microcomputer 12051 discriminates obstacles around the vehicle 12100 into obstacles visually recognizable by the driver of the vehicle 12100 and obstacles visually unrecognizable by the driver. Then, the microcomputer 12051 determines a collision risk indicating a risk of collision with each of the obstacles, and can perform drive assist for collision avoidance by outputting warning to the driver through the audio speaker 12061 or the display unit 12062, and performing forced deceleration or avoidance steering through the drive system control unit 12010, in a case where the collision risk is a set value or more and there is a collision possibility.

At least one of the imaging units 12101 to 12104 may be an infrared camera that detects infrared light. For example, the microcomputer 12051 determines whether or not a pedestrian exists in the captured images of the imaging units 12101 to 12104, thereby to recognize the pedestrian. Such recognition of a pedestrian is performed by a process of extracting characteristic points in the captured images of the imaging units 12101 to 12104, as the infrared camera, for example, and by a process of performing pattern matching processing for the series of characteristic points indicating a contour of an object and determining whether or not the object is a pedestrian. When the microcomputer 12051 determines that a pedestrian exists in the captured images of the imaging units 12101 to 12104 and recognizes the pedestrian, the sound image output unit 12052 causes the display unit 12062 to superimpose and display a square contour line for emphasis on the recognized pedestrian. Furthermore, the sound image output unit 12052 may cause the display unit 12062 to display an icon or the like representing the pedestrian at a desired position.

An example of a vehicle control system to which the technology according to the present disclosure is applicable has been described. The technology according to the present disclosure is applicable to the imaging unit 12031, of the above-described configurations, for example. Specifically, for example, the imaging device 10 in FIG. 1 can be applied to the imaging unit 12031. By applying the technology according to the present disclosure to the imaging unit 12031, the information outside the vehicle can be obtained in more detail and precise manner, and improvement of safety of automatic drive and the like can be implemented, for example.

Note that the effects described in the present specification are merely examples and are not limited, and other effects may be exhibited.

Note that embodiments of the present technology are not limited to the above-described embodiments, and various modifications can be made without departing from the gist of the present technology.

Note that the present technology can also have the following configurations.

(1)

An electromagnetic wave processing device including:

a photoelectric conversion element formed in a silicon substrate;

a narrow band filter stacked on a light incident surface side of the photoelectric conversion element and configured to transmit an electromagnetic wave having a desired wavelength; and interlayer films respectively formed above and below the narrow band filter, in which the photoelectric conversion element is formed at a depth from an interface of the silicon substrate, the depth where a transmission wavelength of the narrow band filter is most absorbed.

(2)

The electromagnetic wave processing device according to (1), in which the depth of the photoelectric conversion element from the silicon substrate becomes deeper as the transmission wavelength of the narrow band filter is longer.

(3)

The electromagnetic wave processing device according to (1), in which the narrow band filter is a hole array-type plasmon filter.

(4)

The electromagnetic wave processing device according to (1), in which the narrow band filter is a dot array-type plasmon filter.

(5)

The electromagnetic wave processing device according to (1), in which the narrow band filter is a plasmon filter using guided mode resonant (GMR).

(6)

The electromagnetic wave processing device according to (1), in which the narrow band filter is a plasmon filter having a bullseye structure.

(7)

The electromagnetic wave processing device according to (1), in which the narrow band filter is a Fabry-Perot interferometer.

(8)

The electromagnetic wave processing device according to any one of (1) to (7), in which the photoelectric conversion element is not formed in a region of the silicon substrate, the region where an absorption wavelength of the narrow band filter is most absorbed.

(9)

The electromagnetic wave processing device according to (8), in which the depth of the region where the photoelectric conversion element is not formed becomes deeper as the absorption wavelength of the narrow band filter is longer.

(10)

The electromagnetic wave processing device according to (8), in which the photoelectric conversion elements are respectively formed at positions shallower and deeper than the region where the photoelectric conversion element is not formed.

(11)

The electromagnetic wave processing device according to any one of (1) to (10), in which a second signal amount obtained from a second photoelectric conversion element formed at a second depth is subtracted from a first signal amount obtained from a first photoelectric conversion element formed at a first depth.

(12)

The electromagnetic wave processing device according to (11), in which upper end depths of the first photoelectric conversion element and the second photoelectric conversion element are different but lower end positions of the first photoelectric conversion element and the second photoelectric conversion element are substantially same.

(13)

The electromagnetic wave processing device according to (11), in which the first photoelectric conversion element is formed from a predetermined depth of the silicon substrate to near the interface of the silicon substrate, and the second photoelectric conversion element is formed in a region smaller than the first photoelectric conversion element at a shallow position of the silicon substrate.

(14)

The electromagnetic wave processing device according to (11), in which the first photoelectric conversion element and the second photoelectric conversion element are arranged in a horizontal direction.

(15)

The electromagnetic wave processing device according to (11), in which the first photoelectric conversion element and the second photoelectric conversion element are arranged in a vertical direction.

(16)

The electromagnetic wave processing device according to any one of (1) to (15), further including:

a drain configured to discharge unnecessary charges or holes.

(17)

The electromagnetic wave processing device according to (16), in which the drain has a gradient in impurity concentration.

(18)

The electromagnetic wave processing device according to any one of (1) to (17), in which at least two or more semiconductor substrates are stacked, and the photoelectric conversion element is formed in at least one of an upper semiconductor substrate or a lower semiconductor substrate.

(19)

The electromagnetic wave processing device according to (18), in which the photoelectric conversion element is formed in the upper semiconductor substrate, and a thermal sensor is stacked as the lower semiconductor substrate.

(20)

The electromagnetic wave processing device according to (19), in which the thermal sensor is a sensor using plasmon resonance.

REFERENCE SIGNS LIST

10 Imaging device
11 Optical system
12 Imaging element
13 Memory
14 Signal processing unit
15 Output unit
16 Control unit
31 Pixel array unit
32 Row scanning circuit
33 PLL
35 Column ADC circuit
36 Column scanning circuit
37 Sense amplifier
51 Pixel
61 Photodiode
101 On-chip microlens
102 Interlayer film
103 Narrow band filter layer
104 Interlayer film
105 Photoelectric conversion element layer
106 Wiring layer
121 Plasmon filter
131 Conductive thin film
132 Hole
133 Dot
134 Dielectric layer
151 Plasmon filter
161 Conductive layer
162 SiO2 film
163 SiN film
164 SiO2 substrate
171 Plasmon filter
181 Through hole
182 Protrusion
201 Fabry-Perot interferometer
202 Semi-transparent mirror
203 Semi-transparent mirror
301 Drain
321 Silicon substrate
322 Support substrate
323 Through oxide film
401 Vertical transistor
411 Semiconductor region
451 Plasmon filter
501 Upper semiconductor substrate
502 Lower semiconductor substrate
503 Semiconductor substrate
601 Aperture
602 Opening
611 Interlayer film
612 Logic circuit
651 Aperture
652 Opening
701 Thermal sensor

The invention claimed is:

1. An electromagnetic wave processing device, comprising:
a first photoelectric conversion element at a first depth from an interface of a silicon substrate;
a second photoelectric conversion element at a second depth from the interface of the silicon substrate, wherein
upper end depths of the first photoelectric conversion element and the second photoelectric conversion element are different,
lower end positions of the first photoelectric conversion element and the second photoelectric conversion element are substantially same, and
a second signal amount obtained from the second photoelectric conversion element is subtracted from a first signal amount obtained from the first photoelectric conversion element;
a narrow band filter on a light incident surface side of the first photoelectric conversion element and configured to transmit an electromagnetic wave having a desired wavelength;
a first interlayer film above the narrow band filter; and
a second interlayer film below the narrow band filter, wherein the first photoelectric conversion element is at the first depth where a transmission wavelength of the narrow band filter is most absorbed.

2. The electromagnetic wave processing device according to claim 1, wherein the first depth of the first photoelectric conversion element from the silicon substrate becomes deeper as the transmission wavelength of the narrow band filter is longer.

3. The electromagnetic wave processing device according to claim 1, wherein the narrow band filter is a hole array-type plasmon filter.

4. The electromagnetic wave processing device according to claim 1, wherein the narrow band filter is a dot array-type plasmon filter.

5. The electromagnetic wave processing device according to claim 1, wherein the narrow band filter is a plasmon filter using guided mode resonant (GMR).

6. The electromagnetic wave processing device according to claim 1, wherein the narrow band filter is a plasmon filter having a bullseye structure.

7. The electromagnetic wave processing device according to claim 1, wherein the narrow band filter is a Fabry-Perot interferometer.

8. The electromagnetic wave processing device according to claim 1, wherein the first photoelectric conversion element is not formed in a region of the silicon substrate where an absorption wavelength of the narrow band filter is most absorbed.

9. The electromagnetic wave processing device according to claim 8, wherein a depth of the region where the first photoelectric conversion element is not formed becomes deeper as the absorption wavelength of the narrow band filter is longer.

10. The electromagnetic wave processing device according to claim 8, wherein the first photoelectric conversion element and the second photoelectric conversion element are respectively at positions shallower and deeper than the region where the first photoelectric conversion element is not formed.

11. The electromagnetic wave processing device according to claim 1, wherein
the first photoelectric conversion element is formed from a specific depth of the silicon substrate to near the interface of the silicon substrate, and
the second photoelectric conversion element is in a region smaller than the first photoelectric conversion element at a shallow position of the silicon substrate.

12. The electromagnetic wave processing device according to claim 1, wherein the first photoelectric conversion element and the second photoelectric conversion element are arranged in a horizontal direction.

13. The electromagnetic wave processing device according to claim 1, wherein the first photoelectric conversion element and the second photoelectric conversion element are arranged in a vertical direction.

14. The electromagnetic wave processing device according to claim 1, further comprising a drain configured to discharge unnecessary charges or holes.

15. The electromagnetic wave processing device according to claim 14, wherein the drain has a gradient in impurity concentration.

16. The electromagnetic wave processing device according to claim 1, wherein
at least two semiconductor substrates are stacked, and
the first photoelectric conversion element is in at least one of an upper semiconductor substrate of the at least two semiconductor substrates or a lower semiconductor substrate of the at least two semiconductor substrates.

17. The electromagnetic wave processing device according to claim 16, wherein
the first photoelectric conversion element is in the upper semiconductor substrate, and
a thermal sensor is stacked as the lower semiconductor substrate.

18. The electromagnetic wave processing device according to claim 17, wherein the thermal sensor is a sensor using plasmon resonance.

* * * * *